US008604896B2

(12) United States Patent
Tamura

(10) Patent No.: US 8,604,896 B2
(45) Date of Patent: Dec. 10, 2013

(54) LEFT-HANDED RESONATOR AND LEFT-HANDED FILTER USING THE SAME

(75) Inventor: Masaya Tamura, Osaka (JP)

(73) Assignee: Panasonic Corporation, Osaka (JP)

( * ) Notice: Subject to any disclaimer, the term of this patent is extended or adjusted under 35 U.S.C. 154(b) by 363 days.

(21) Appl. No.: 12/989,690

(22) PCT Filed: May 11, 2009

(86) PCT No.: PCT/JP2009/002037
§ 371 (c)(1),
(2), (4) Date: Oct. 26, 2010

(87) PCT Pub. No.: WO2009/139139
PCT Pub. Date: Nov. 19, 2009

(65) Prior Publication Data
US 2011/0043304 A1    Feb. 24, 2011

(30) Foreign Application Priority Data

| May 12, 2008 | (JP) | 2008-124301 |
| May 12, 2008 | (JP) | 2008-124302 |
| Jul. 22, 2008 | (JP) | 2008-188110 |
| Aug. 18, 2008 | (JP) | 2008-209636 |
| Oct. 8, 2008 | (JP) | 2008-261457 |

(51) Int. Cl.
*H03H 7/075* (2006.01)

(52) U.S. Cl.
USPC .......................... 333/168; 333/185

(58) Field of Classification Search
USPC ......... 333/126, 129, 132, 185, 168, 173, 204, 333/219
See application file for complete search history.

(56) References Cited

U.S. PATENT DOCUMENTS

| 5,608,364 A * | 3/1997 | Hirai et al. ................... 333/204 |
| 5,719,539 A * | 2/1998 | Ishizaki et al. ............... 333/204 |
| 7,593,696 B2 * | 9/2009 | Fischer ........................ 455/87 |
| 7,795,995 B2 * | 9/2010 | White et al. .................. 333/134 |
| 7,911,386 B1 * | 3/2011 | Itoh et al. ............... 343/700 MS |

(Continued)

FOREIGN PATENT DOCUMENTS

| CN | 2805106 Y | 8/2006 |
| EP | 1962422 A1 | 8/2008 |

(Continued)

OTHER PUBLICATIONS

Mutual Inductance; http://www.electronics-tutorials.ws, Oct. 11, 2009.*

(Continued)

*Primary Examiner* — Benny Lee
*Assistant Examiner* — Rakesh Patel
(74) *Attorney, Agent, or Firm* — RatnerPrestia

(57) ABSTRACT

A left-handed resonator according to the present invention includes: a series body in which an inductor component and a capacitor component are connected in series; and a parallel body in which an inductor component and a capacitor component are connected in parallel, wherein one end of the series body and one end of the parallel body are connected, the other end of the parallel body is grounded, and the other end of the series body is grounded. With this configuration, a –1-order mode is excited using only one unit cell including the series body and the parallel body, so that dimensions of the left-handed resonator can be miniaturized.

9 Claims, 50 Drawing Sheets

(56) References Cited

U.S. PATENT DOCUMENTS

| | | | |
|---|---|---|---|
| 8,334,733 B2* | 12/2012 | Tamura et al. | 333/168 |
| 2002/0030561 A1* | 3/2002 | Masuda et al. | 333/177 |
| 2006/0066422 A1 | 3/2006 | Itoh et al. | |
| 2006/0077020 A1* | 4/2006 | Wang et al. | 333/204 |
| 2008/0204164 A1* | 8/2008 | Eleftheriades | 333/134 |
| 2008/0204327 A1* | 8/2008 | Lee et al. | 343/700 MS |

FOREIGN PATENT DOCUMENTS

| | | |
|---|---|---|
| JP | 2007-174519 A | 7/2007 |
| JP | 2007-235431 A | 9/2007 |
| WO | WO 2007/066426 A1 | 6/2007 |
| WO | WO 2009/044518 A1 | 4/2009 |

OTHER PUBLICATIONS

International Search Report for Applicaton No. PCT/JP2009/002037, Jul. 28, 2009, Panasonic Corporation.

S. G. Mao et al., "Design of Composite Right/Left-Handed Coplanar-Waveguide Bandpass and Dual-Passband Filters," IEEE Transactions on Microwave Theory and Techniques, vol. 54, No. 9, Sep. 2006, pp. 3543-3549.

I. H. Lin et al., "Arbitrary Dual-Band Components Using Composite Right/Left-Handed Transmission Lines," IEEE Transactions on Microwave Theory and Techniques, vol. 52, No. 4, Apr. 2004, pp. 1142-1149.

* cited by examiner

Coupling

Coupling

Attenuation Characteristic

Frequency

LEFT-HANDED RESONATOR AND LEFT-HANDED FILTER USING THE SAME

THIS APPLICATION IS A U.S. NATIONAL PHASE APPLICATION OF PCT INTERNATIONAL APPLICATION PCT/JP2009/002037.

TECHNICAL FIELD

The present invention relates to a left-handed resonator used in a high-frequency device and a left-handed filter, a left-handed antenna, and an electronic instrument using the left-handed resonator.

BACKGROUND ART

FIG. 60 is a configuration diagram of a conventional left-handed resonator. With reference to FIG. 60, conventional left-handed resonator 101 includes a plurality of unit cells 103, and the unit cell 103 includes a capacitor shunt-connected to a ground, an inductor connected in series, a capacitor connected to the inductor in series, and an inductor shunt-connected to the ground. Dielectric substrate 102 on which left-handed resonator 101 is mounted includes gaps 104 and 105 that are provided beside unit cell 103 disposed in an end portion. Gaps 104 and 105 loosely couple left-handed resonator 101 and a transmission path (not illustrated) connected to left-handed resonator 101. This is because a resonant phenomenon is clearly measured in left-handed resonator 101. In dielectric substrate 102, a grounded conductor is formed on a rear surface of a surface on which left-handed resonator 101 is provided. For example, Patent Document 1 is well known as a prior art document of the subject application.

In conventional left-handed resonator 101, a length corresponding to a half wavelength of a resonant frequency is required because both ends are open ends or short-circuited ends. Therefore, dimensions of left-handed resonator 101 are enlarged and a conductor loss corresponding to the dimensions of left-handed resonator 101 is generated, which results in a problem in which a no-load Q value is not increased.

PRIOR ART DOCUMENT

Patent Document 1: U.S. Patent Publication No. 2006/0066422

DISCLOSURE OF THE INVENTION

In the present invention, the dimensions of the left-handed resonator are miniaturized. A left-handed resonator according to the present invention includes: a series body in which an inductor and a capacitor are connected in series; and a parallel body in which an inductor and a capacitor are connected in parallel, wherein one end of the series body and one end of the parallel body are connected, the other end of the parallel body is grounded, and the other end of the series body is grounded.

With this configuration, a −1-order mode is excited using only one unit cell including the series body and the parallel body, so that the dimensions of the left-handed resonator can be miniaturized.

PREFERRED EMBODIMENTS FOR CARRYING OUT OF THE INVENTION

First Embodiment

Figure 1:
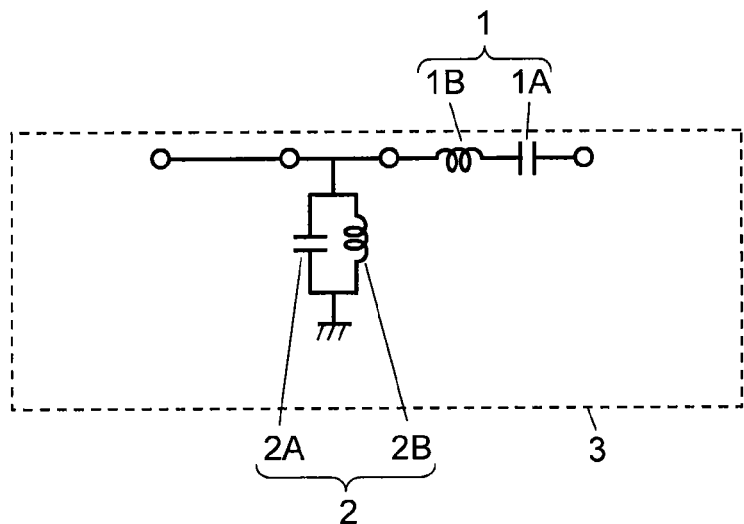
FIG. 1 is an equivalent circuit diagram of a left-handed transmission line in a left-handed resonator according to a first embodiment of the present invention.

At first a concept of "unit cell" used in the present invention will be described with reference to FIG. 1. FIG. 1 is an equivalent circuit diagram of a left-handed transmission line in a left-handed resonator according to a first embodiment of the present invention. With reference to FIG. 1, unit cell 3 includes series body 1 and parallel body 2. Series body 1 includes capacitor 1A and inductor 1B. Parallel body 2 includes capacitor 2A and inductor 2B, and capacitor 2A and inductor 2B are connected between one end of series body 1 and a grounded conductor. Unit cell 3 constitutes a minimum unit structure of a right-handed/left-handed composite line called a metamaterial. The order of capacitor 1A and inductor 1B may be reversed.

Then the metamaterial will be described. Usually a substance existing in the natural world that has a positive permittivity and a positive permeability is called a right-handed medium. As used herein, "right-handed" means that a positional relationship of a thumb, a forefinger, and a middle finger of a right hand holds among an electric field direction of an electromagnetic wave, a magnetic field direction of the electromagnetic wave, and a direction in which the electromagnetic wave travels (a phase propagation direction). On the other hand, a medium in which the permittivity and the permeability simultaneously become negative is called a left-handed substance or the metamaterial. As used herein, "left-handed" means that the positional relationship of a thumb, a forefinger, and a middle finger of a left hand holds among the electric field direction of the electromagnetic wave, the magnetic field direction of the electromagnetic wave, and the direction in which the electromagnetic wave travels (the phase propagation direction).

A substance in which only the permittivity becomes negative or a substance in which only the permeability becomes negative has been founded. Plasma can be cited as an example of the substance in which only the permittivity becomes negative, and ferrite can be cited as an example of the substance in which only the permeability becomes negative. However, the substance in which the permittivity and the permeability simultaneously become negative has not been found yet in the natural world. Therefore, a microstructure is artificially formed to make the apparent permittivity and permeability negative, thereby producing the substance in which the permittivity and the permeability simultaneously become negative. This medium is called an artificial medium.

Figure 2:
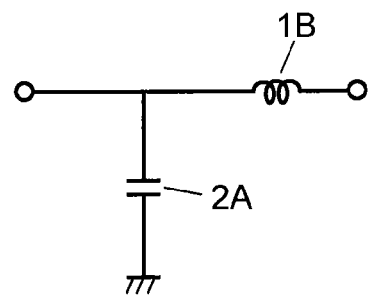
FIG. 2 is an equivalent circuit of a right-handed transmission line.

An operating principle of a transmission line type metamaterial will be described below. FIG. 2 is an equivalent circuit of a right-handed transmission line. In FIG. 2, an electric characteristic of a usual right-handed transmission line can be discussed by an equivalent circuit in which an infinite number of infinitesimal intervals including inductors 1B connected in series and capacitors 2A shunt-connected to the ground are continued. The structure is referred to as a Pure Right-Handed Transmission Line (PRH TL).

Figure 3:
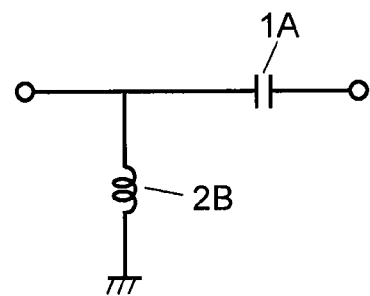
FIG. 3 is an equivalent circuit of a left-handed transmission line.

On the other hand, FIG. 3 is an equivalent circuit of a left-handed transmission line. In FIG. 3, an electric characteristic of a usual left-handed transmission line can be discussed by an equivalent circuit in which an infinite number of infinitesimal intervals including capacitor 1A connected in series and inductor 2B shunt-connected to the ground are continued. The structure is referred to as a Pure Left-Handed Transmission Line (PLH TL).

However, when series-connected capacitor 1A is formed as illustrated in FIG. 3, because capacitor 1A has a physical volume, right-handed series inductor 1B is inevitably generated as a parasitic component as illustrated in FIG. 1. When parallel-connected inductor 2B is formed as illustrated in FIG. 3, because inductor 2B has the physical volume, right-handed parallel capacitor 2A is inevitably generated as parasitic component as illustrated in FIG. 1.

Accordingly, as illustrated in FIG. 1, the metamaterial of the actually-implementable artificial medium is a Composite Right/Left-Handed Transmission Line (CRLH TL) that includes series body 1 in which inductor 1B and capacitor 1A are connected in series and parallel body 2 in which inductor 2B and capacitor 2A are connected in parallel. In the configuration of the CRLHTL, one end of series body 1 and one end of parallel body 2 are connected, and the other end of parallel body 2 is grounded.

The CRLH transmission line has both the left-handed and right-handed properties. That is, the CRLH transmission line has the right-handed property in a high-frequency region while having the left-handed property in a low-frequency region. Series body 1 of FIG. 1 including left-handed capacitor 1A (CL) and right-handed inductor 1B (LR) becomes a series resonant circuit that resonates at an angular frequency $\omega se=1/(CL*LR)$, and parallel body 2 of FIG. 1 including left-handed inductor 2B (LL) and right-handed capacitor 2A (CR) becomes a parallel resonant circuit that anti-resonates at an angular frequency $\omega sh=1/(LL*CR)$. The case of $\omega se=\omega sh$ is referred to as a balanced case, and a right-handed frequency region and a left-handed frequency region are continuously connected. On the other hand, the case of $\omega se \neq \omega sh$ is referred to as an imbalanced case, and a gap is generated between the right-handed frequency region and the left-handed frequency region, and a region of the gap becomes an attenuation band in which electromagnetic wave cannot be propagated.

When a microgap is made in an input/output port of the CRLH transmission line to form an input/output coupling capacitance, the CRLH transmission line acts as a resonator similarly to the right-handed finite-length line. A minimum order resonance that becomes the half wavelength and a harmonic resonance of an integral multiple of the minimum order resonance are perceived in the right-handed finite-length line resonator.

On the other hand, in the general left-handed resonator, the number of unique resonant frequencies depends on the number of cells. For example, in general left-handed resonator 101 including the seven cells (n=7) sandwiched between microgaps 104 and 105, unit cell 3 illustrated in FIG. 1 is implemented by unit cell 103 illustrated in FIG. 60, and seven unit cells 3 are connected.

Figure 4:
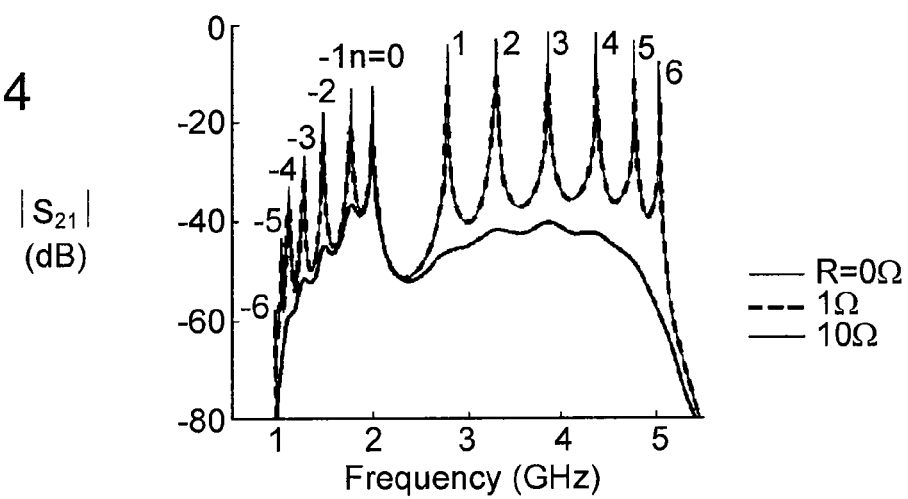
FIG. 4 is a frequency characteristic diagram of a general left-handed resonator.

FIG. 4 is a frequency characteristic diagram of the general left-handed resonator. In FIG. 4, +1-order resonance to +6-order resonance, which a standing wave having a half wavelength gets on, exist as right-handed resonance. Meanwhile, −1-order resonance to −6-order resonance, which the standing wave having the half wavelength gets on, exist as left-handed resonance of backward-traveling wave resonance. Further, there is a 0-order mode in which all the cells are vibrated while synchronized to one another at an identical potential.

Figure 5:
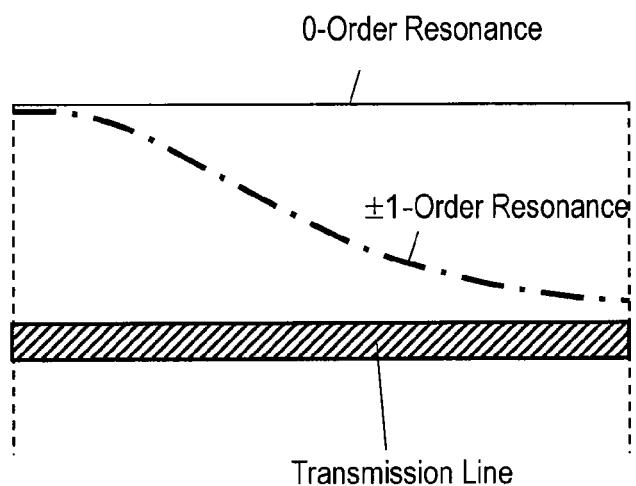
FIG. 5 is a characteristic diagram illustrating a voltage standing wave of the general left-handed resonator.

FIG. 5 is a characteristic diagram illustrating a voltage standing wave of the general left-handed resonator. In FIG. 5, although the standing wave does not rise in the 0-order mode, the 0-order mode can be considered as a special resonant mode in which the wavelength becomes infinite. In the general left-handed resonator, the +1-order and −1-order resonant modes similarly have a standing wave distribution illustrated in FIG. 5. Therefore, in an absolute value of a phase speed of the right-handed forward-traveling wave and the left-handed backward-traveling wave, the left-handed backward-traveling waves become identical at a lower frequency, and the left-handed resonant frequency always becomes lower.

The invention of the application is an extremely-compact resonator focused on this point. Generally, in order to form the resonator having the left-handed resonance, it is necessary to dispose the required number of unit cells 3 to excite the standing wave of the half wavelength of a certain specific left-handed resonant mode. However, in the configuration of the invention of the application, a multi-step left-handed filter including a plurality of resonators is formed using an interstep coupling element.

Figure 6:
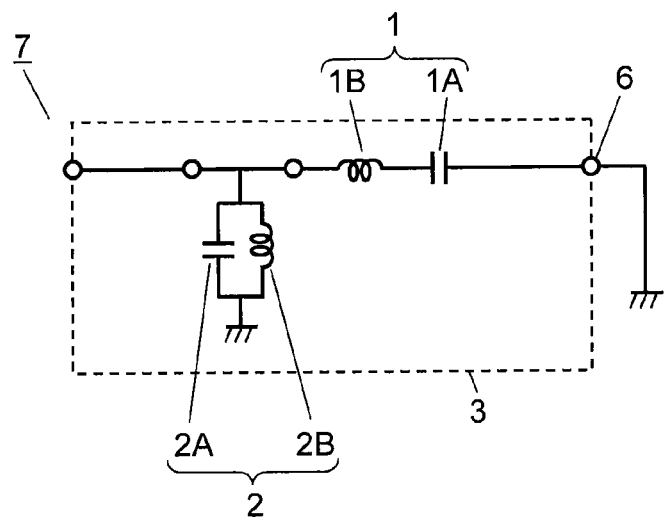
FIG. 6 is a configuration diagram of the left-handed resonator according to the first embodiment of the present invention in which −1-order mode is used.

FIG. 6 is a configuration diagram of the left-handed resonator according to the first embodiment of the present invention in which −1-order mode is used. With reference to FIG. 6, left-handed resonator 7 of the first embodiment includes series body 1 in which inductor 1B and capacitor 1A are connected in series and parallel body 2 in which inductor 2B and capacitor 2A are connected in parallel, and one end of series body 1 and one end of parallel body 2 are connected, the other end of parallel body 2 is grounded, and the other end of series body 1 is grounded.

Accordingly, the −1-order mode can be excited by the same number of unit cells as that of the excitation of the 0-order mode that is of the left-handed minimum order resonance. Thus the number of cells constituting left-handed resonator 7 of the first embodiment becomes a half of the required number of cells to excite the conventional −1-order mode, and therefore a no-load Q value can be enhanced to miniaturize the left-handed resonator.

Figure 60:
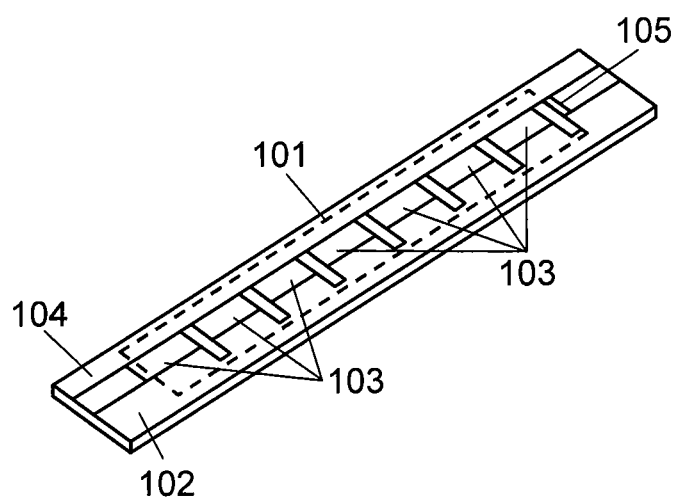
FIG. 60 is a configuration diagram of a conventional left-handed resonator.

In the general left-handed resonator, as illustrated in FIG. 5, the −1-order to −7-order pieces of half-wavelength left-handed resonance are obtained by connecting seven unit cells 103 of FIG. 60. The number of pieces of left-handed resonance is equal to the number of unit cells. For example, in order to obtain the −1-order resonance, it is necessary to provide at least two unit cells.

In the −1-order resonance, a half-wavelength electric field distribution (voltage standing wave) exists on the resonator including the two unit cells. Amplitude of the electric field distribution becomes zero at a connection point of the two unit cells. The inventor finds that the −1-order resonance is generated even if the connection point is short-circuited to form the resonator with only one cell.

Since left-handed resonator 7 whose one end is short-circuited excites a quarter wavelength mode, the 0-order mode in which all the cells are vibrated while synchronized with one another at the same potential can be suppressed in left-handed resonator 7. Therefore, the left-handed resonator having the −1-order mode in the left-handed resonance can be provided. Therefore, when a filter in which a −1-order resonant frequency is set to a passband is produced using the resonator, the passage of the signal can be prevented at the 0-order resonant frequency.

Figure 7:
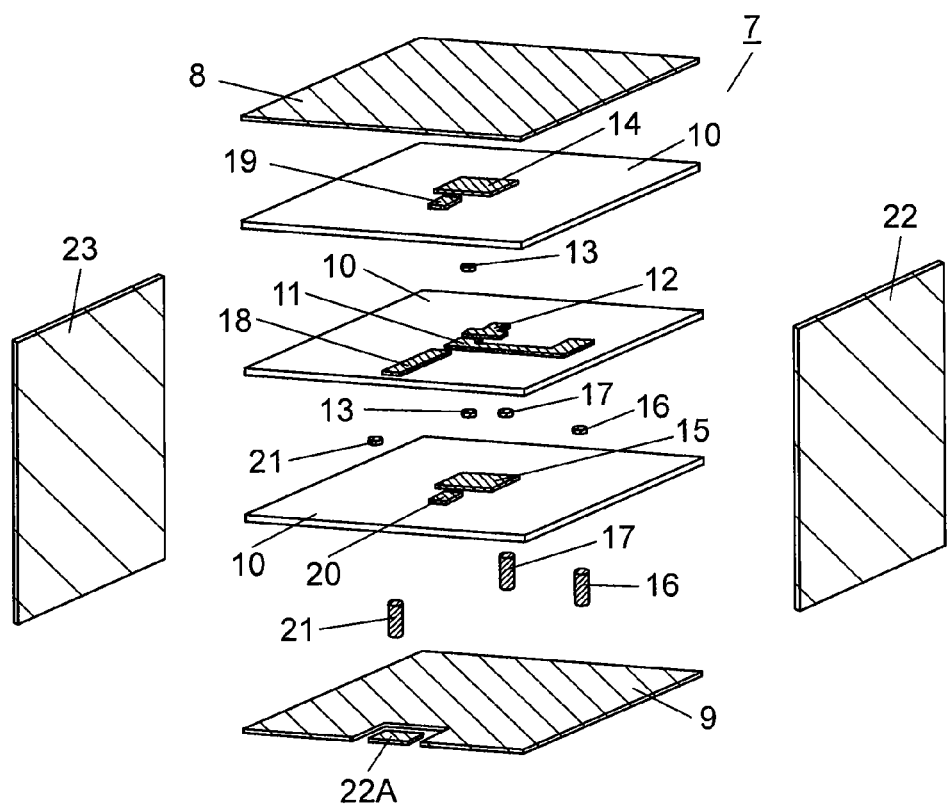
FIG. 7 is an exploded perspective view illustrating a structure of the left-handed resonator according to the first embodiment of the present invention.

FIG. 7 is an exploded perspective view illustrating a structure of the left-handed resonator according to the first embodiment of the present invention. In FIG. 7, unit cell 3 (see FIG. 6) has the structure in which a space between grounded conductors 8 and 9 disposed opposite each other is filled with dielectric materials 10. Conductive pattern 11 corresponds to inductor 1B illustrated in FIG. 1. Conductive pattern 11 is connected to conductive patterns 14 and 15 through via conductor 13, and conductive pattern 12 is disposed so as to be sandwiched between conductive patterns 14 and 15. Capacitor 1A illustrated in FIG. 1 includes a coupling between conductive pattern 12 and conductive pattern 14 and a coupling between conductive pattern 12 and conductive pattern 15.

Conductive pattern 11 is connected to grounded conductor 9 through via conductor 16. Inductor 2B illustrated in FIG. 1 includes conductive pattern 12. Further, capacitor 2A illustrated in FIG. 1 mainly includes conductive pattern 14, grounded conductor 8 located opposite conductive pattern 14, conductive pattern 15, and grounded conductor 9 located opposite conductive pattern 15. The coupling between conductive patterns 11 and 12 and grounded conductors 8 and 9 also contributes to capacitor 2A.

Conductive pattern 12 is connected to grounded conductor 9 through via conductor 17 in FIG. 7, thereby realizing the grounding at one end 6 of unit cell 3 illustrated in FIG. 6. At this point, in order to set grounded conductors 8 and 9 to the same potential, preferably grounded conductors 8 and 9 are connected to each other through lateral electrodes 22 and 23.

Preferably a dielectric tangent of dielectric material 10 is equal to or lower than 0.1%. Therefore, the no-load Q value of left-handed resonator 7 can be enhanced. Preferably a specific permittivity of dielectric material 10 ranges from 10 to 100. Therefore, left-handed resonator 7 can be miniaturized.

In the structure of the first embodiment, in order to clearly extract the resonant phenomenon, conductive pattern 18 and conductive pattern 11 are sandwiched between conductive patterns 19 and 20, and conductive pattern 18 is connected to terminal electrode 22A through via conductor 21.

Figure 8:
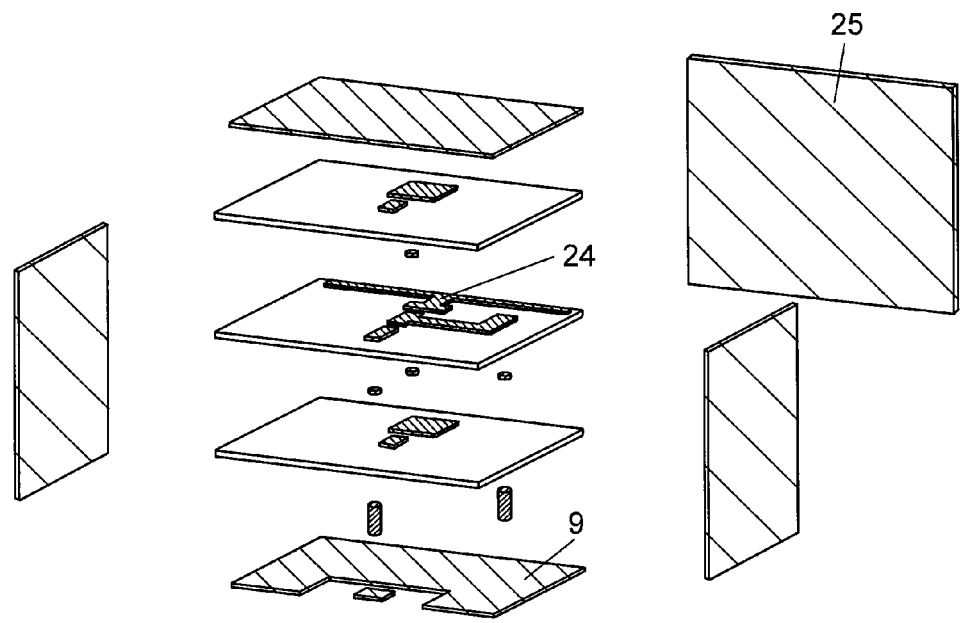
FIG. 8 is an exploded perspective view illustrating another structure of the left-handed resonator according to the first embodiment of the present invention.

FIG. 8 is an exploded perspective view illustrating another structure of the left-handed resonator of the first embodiment of the present invention. In FIG. 8, conductive pattern 24 corresponding to conductive pattern 12 of FIG. 7 may be connected to grounded conductor 9 through lateral electrode 25. When left-handed resonator 7 is implemented by structure of FIG. 8, inductance component included in via conductor 17 of FIG. 7 is eliminated to reduce the dimensions of inductor 1B of FIG. 1, so that the 1-order mode can be shifted to the high-frequency side.

For example, when left-handed resonator 7 of FIG. 6 is designed such that the resonant frequency becomes about 2.5 GHz, capacitor 1A becomes about 4.45 pF, and inductor 2B becomes about 0.33 nH. On the other hand, when the parallel resonator including the right-handed capacitor and the inductor is designed such that the resonant frequency becomes about 2.5 GHz, the capacitor becomes about 12 pF, and the inductor becomes about 0.33 nH.

The capacitor value of left-handed resonator 7 can be decreased when the element values of the right-handed resonator are compared to the element values of left-handed resonator 7 of the present application.

Second Embodiment

Figure 9:
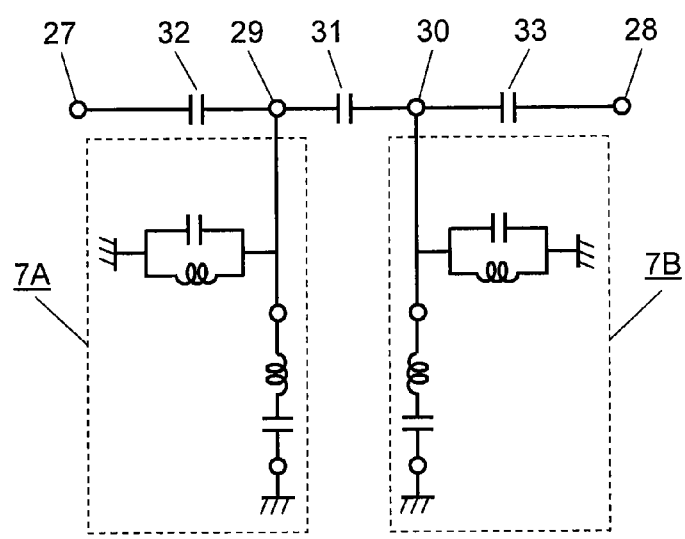
FIG. 9 is an equivalent circuit diagram of a left-handed filter according to a second embodiment of the present invention.

FIG. 9 is an equivalent circuit diagram of a left-handed filter according to a second embodiment of the present invention. In FIG. 9, the left-handed filter of the second embodiment is a filter including input port 27 and output port 28, and inter-step coupling element 31 is interposed between input port 27 and output port 28. One end 29 of left-handed resonator 7A is electrically connected between input port 27 and inter-step coupling element 31, and one end 30 of left-handed resonator 7B is electrically connected between output port 28 and inter-step coupling element 31. The configurations of left-handed resonators 7A and 7B are similar to the configuration of left-handed resonator 7 of the first embodiment. The left-handed filter also has a configuration in which input coupling element 32 is interposed between one end 29 of left-handed resonator 7A and input port 27 while output coupling element 33 is interposed between one end 30 of left-handed resonator 7B and output port 28.

The left-handed filter having the above-described configuration is operated so as to form the passband at the frequency at which left-handed resonators 7A and 7B resonate, that is, in the −1-order mode. As a result, a filter more compact than the right-handed filter can be implemented.

In FIG. 9, input coupling element 32 and output coupling element 33 are illustrated capacitors. However, when input coupling element 32 and output coupling element 33 both have a value of 8 pF while the passband is set to 2 GHz, because an impedance of the capacitor is as small as substantial 0Ω, coupling elements 32 and 33 may be removed. That is, coupling elements 32 and 33 can be removed according to the values of the passband and capacitor.

Figure 10:
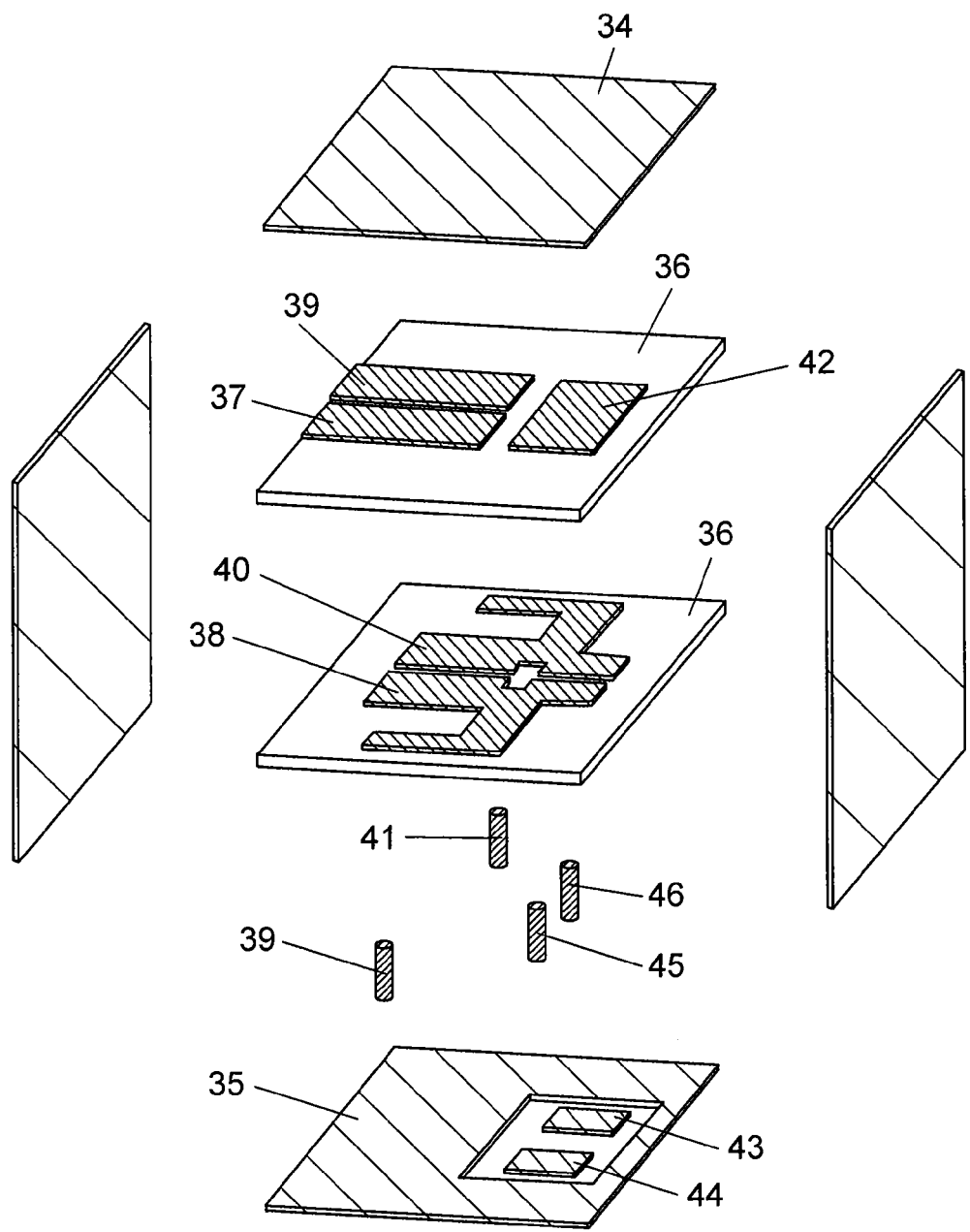
FIG. 10 is an exploded perspective view illustrating a structure of the left-handed filter according to the second embodiment of the present invention.

FIG. 10 is an exploded perspective view illustrating a structure of the left-handed filter according to the second embodiment of the present invention. In FIG. 10, the left-handed filter has a structure in which a space between grounded conductors 34 and 35 that are disposed opposite each other is filled with dielectric material 36. Left-handed resonator 7A includes conductive patterns 37 and 38 and via conductor 39 that connects conductive pattern 38 and grounded conductor 35. Left-handed resonator 7B includes conductive patterns 39 and 40 and via conductor 41 that connects conductive pattern 40 and grounded conductor 35. Inter-step coupling element 31 includes the coupling between conductive pattern 42 and conductive patterns 38 and 40. Input port 27 and output port 28 include terminal electrodes 43 and 44, respectively. As described above, it is necessary that input coupling element 32 and output coupling element 33 have a large capacitance value, and the impedance of the capacitor is as small as substantial 0Ω. Therefore, via conductors 45 and 46 are directly connected to conductive patterns 38 and 40 to implement the left-handed filter.

The left-handed filter of the present application is connected to a signal processing circuit (not illustrated) such as an electronic instrument (not illustrated) to be able to realize the miniaturization of the electronic instrument.

Third Embodiment

A left-handed antenna according to a third embodiment of the present invention will be described below with reference to the drawings.

Since the left-handed antenna of the third embodiment can be implemented by the configuration similar to that of left-handed resonator 7 of the first embodiment, the description of the equivalent circuit is omitted. A compact antenna can be provided by forming the antenna with left-handed resonator 7 of the first embodiment.

Figure 11:
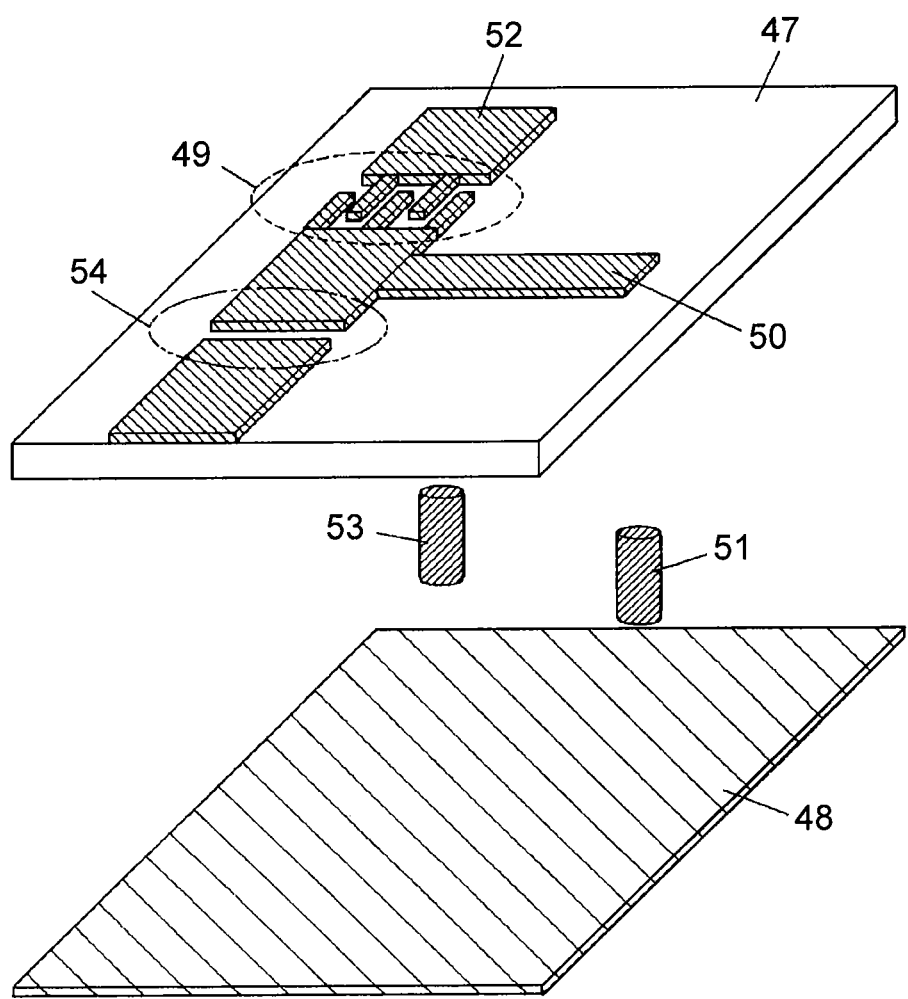
FIG. 11 is an exploded perspective view illustrating a structure of a left-handed antenna according to a third embodiment of the present invention.

FIG. 11 is an exploded perspective view illustrating a structure of a left-handed antenna according to the third embodiment of the present invention. In FIG. 11, capacitor 49 corresponds to capacitor 1A illustrated in FIG. 6. In capacitor 49, a comb-like conductive pattern is disposed on an upper surface of dielectric substrate 47, and grounded conductor 48 is disposed on a lower surface of dielectric substrate 47. A parasitic inductor included in capacitor 49 corresponds to inductor 1B illustrated in FIG. 6. Further, the parasitic capacitor between capacitor 49 and grounded conductor 48 corresponds to capacitor 2A illustrated in FIG. 6. Conductive pattern 50 electrically connected to capacitor 49 is connected to grounded conductor 48 through via conductor 51, thereby forming inductor 2B illustrated in FIG. 6. Conductive pattern 52 connected to one end of capacitor 49 is connected to grounded conductor 48 through via conductor 53, thereby implementing the left-handed antenna. In the third embodiment, in order to match the left-handed antenna implemented by the above-described configuration with a signal source, the left-handed antenna and the signal source are connected through capacitor 54.

The left-handed antenna of the invention of the application is assembled in a signal processing circuit (not illustrated) such as an electronic instrument (not illustrated) to be able to realize the miniaturization of the electronic instrument.

Fourth Embodiment

Figure 12:
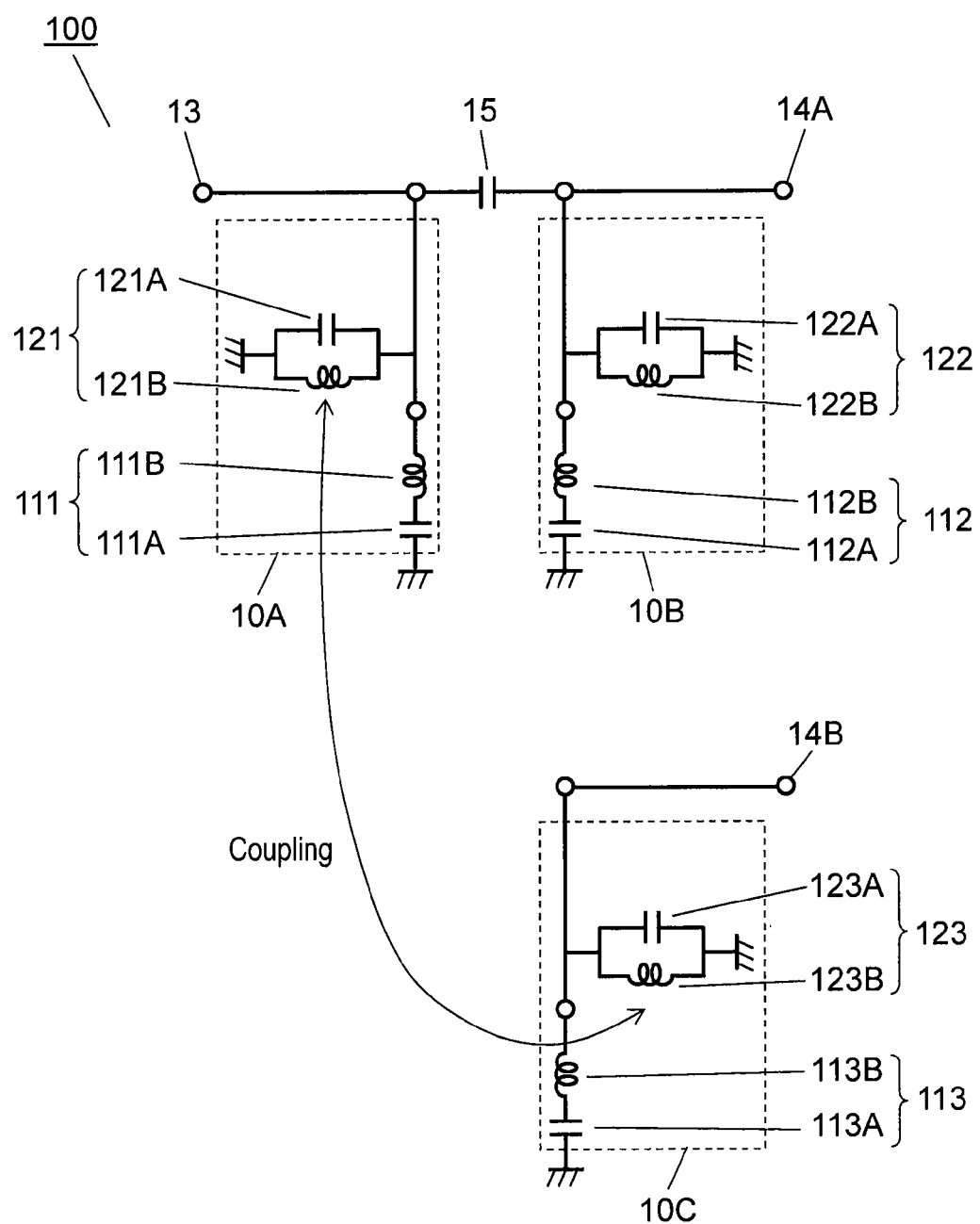
FIG. 12 is an equivalent circuit diagram of a left-handed filter according to a fourth embodiment of the present invention.

FIG. 12 is an equivalent circuit diagram of a left-handed filter according to a fourth embodiment of the present invention. With reference to FIG. 12, left-handed filter 100 of the fourth embodiment includes input port 13, first output port 14A, and inter-step coupling element 15 electrically connected to input port 13 and first output port 14A. Left-handed filter 100 also includes first left-handed resonator 10A connected between input port 13 and inter-step coupling element 15, second left-handed resonator 10B connected between first output port 14A and inter-step coupling element 15, and third left-handed resonator 10C connected to second output port 14B.

In first left-handed resonator 10A, one end is connected to input port 13 and one end of inter-step coupling element 15, and the other end is grounded. In second left-handed resonator 10B, one end is connected to first output port 14A and the other end of inter-step coupling element 15, and the other end is grounded. In third left-handed resonator 10C, one end is connected to second output port 14B, and the other end is grounded. Each of first left-handed resonator 10A, second left-handed resonator 10B, and third left-handed resonator 10C includes one left-handed resonator. Alternatively, each of first left-handed resonator 10A, second left-handed resonator 10B, and third left-handed resonator 10C may include a plurality of left-handed resonators connected in series. First left-handed resonator 10A includes first parallel body 121 and first series body 111. First parallel body 121 includes capacitor 121A and inductor 121B, and capacitor 121A and inductor 121B are connected in parallel. First series body 111 includes capacitor 111A and inductor 111B, and capacitor 111A and inductor 111B are connected in series. In first parallel body 121, one end is connected to input port 13 and one end of inter-step coupling element 15. In first series body 111, one end is connected to input port 13, inter-step coupling element 15, and the other end of first parallel body 121, and the other end is grounded.

Second left-handed resonator 10B includes second parallel body 122 and second series body 112. Second parallel body 122 includes capacitor 122A and inductor 122B, and capacitor 122A and inductor 122B are connected in parallel. Second series body 112 includes capacitor 112A and inductor 112B, and capacitor 112A and inductor 112B are connected in series. In second parallel body 122, one end is connected to first output port 14A and the other end of inter-step coupling element 15. In second series body 112, one end is connected to first output port 14A, the other end of inter-step coupling element 15, and the other end of second parallel body 122, and the other end is grounded.

Third left-handed resonator 10C includes third parallel body 123 and third series body 113. Third parallel body 123 includes capacitor 123A and inductor 123B, and capacitor 123A and inductor 123B are connected in parallel. Third series body 113 includes capacitor 113A and inductor 113B, and capacitor 113A and inductor 113B are connected in series. In third parallel body 123, one end is connected to second output port 14B. In third series body 113, one end is connected to second output port 14B and the other end of third parallel body 123, and the other end is grounded.

In the fourth embodiment, first series body 111 included in first left-handed resonator 10A has the configuration in which inductor 111B is connected to first parallel body 121 while capacitor 111A is grounded. Alternatively, capacitor 111A may be connected to first parallel body 121 while inductor 111B is grounded. Similarly, the order of the inductor and capacitor included in the series body may be reversed for second left-handed resonator 10B and third left-handed resonator 10C.

A disposition relationship is adjusted such that the magnetic field coupling is generated between inductor 121B included in first parallel body 121 and inductor 123B included in third parallel body 123. That is, when a distance between inductor 121B and inductor 123B is shortened, a degree of magnetic field coupling between inductor 121B and inductor 123B is increased. On the other hand, when the distance between inductor 121B and inductor 123B is lengthened, the degree of magnetic field coupling between inductor 121B and inductor 123B is decreased.

Therefore, a phase difference between a signal outputted to first output port 14A from the filter including first left-handed resonator 10A and second left-handed resonator 10B, which are coupled through inter-step coupling element 15, and a signal outputted to second output port 14B from the filter including first left-handed resonator 10A and third left-handed resonator 10C, in which the magnetic field coupling is generated through inductor 121B and inductor 123B becomes 180 degrees, which allows a differential output to be obtained.

A characteristic of left-handed filter 100 of the fourth embodiment will be described.

Figure 13:
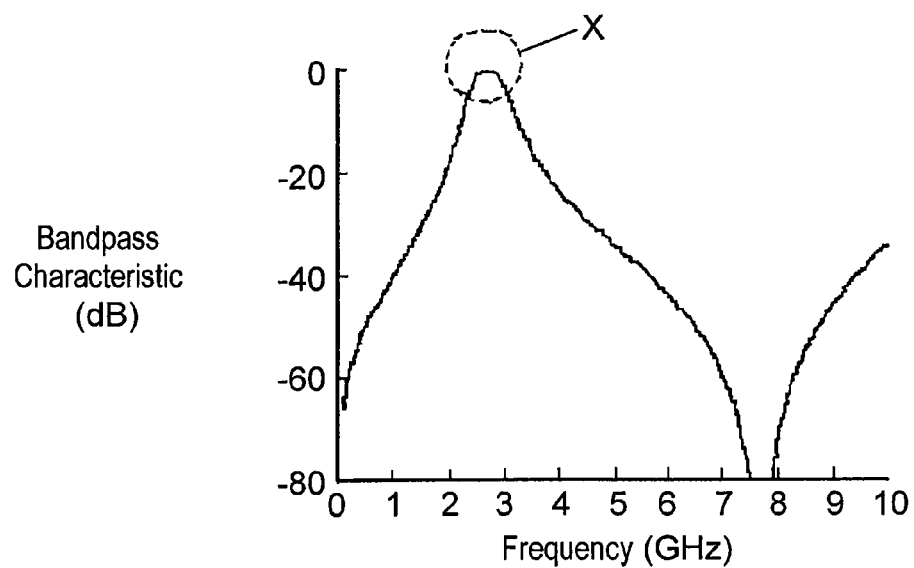
FIG. 13 is a frequency characteristic diagram of the left-handed filter according to the fourth embodiment of the present invention.
Figure 14:
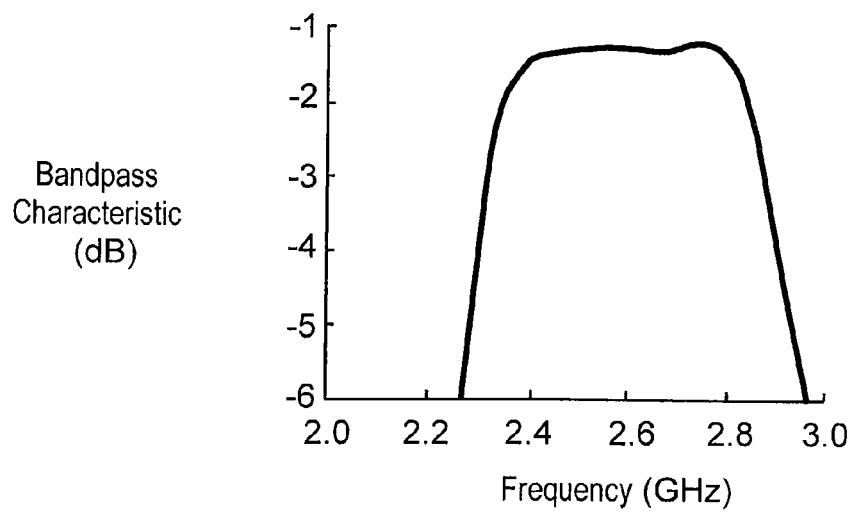
FIG. 14 is an enlarged view illustrating a bandpass characteristic of the left-handed filter of FIG. 13 in an area X representing an area near 0 dB.

FIG. 13 is a frequency characteristic diagram of left-handed filter 100 of the fourth embodiment. FIG. 14 is an enlarged view illustrating a bandpass characteristic of left-handed filter 100 of FIG. 13 in area X representing an area near 0 dB. As can be seen from FIGS. 13 and 14, the good bandpass characteristic can be obtained in a frequency band of 2.4 to 2.5 GHz used in wireless LAN.

An input coupling element may be provided between input port 13 and inter-step coupling element 15. In such cases, a first output coupling element is provided between the first output port and inter-step coupling element 15, and a second output coupling element is provided between the second output port and third left-handed resonator 10C.

FIGS. 15A to 15G are exploded views each illustrating a pattern of a dielectric substrate in order from the top while dielectric stacked substrate 30 constituting the left-handed filter according to the fourth embodiment of the present invention is exploded in each dielectric substrate. In FIGS. 15A to 15G, patterns of dielectric substrates are provided in parallel with one another. Hereinafter, for the sake of convenience, the dielectric substrates illustrated in FIGS. 15A to 15G are sequentially designated by numerals 30a to 30g from the top.

Figure 15A:
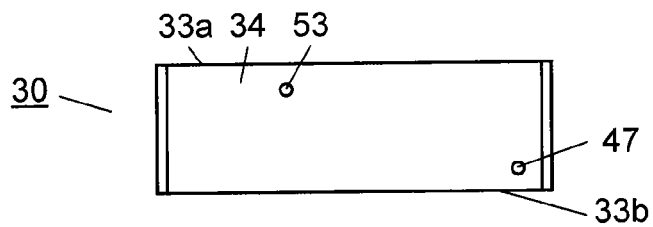
FIG. 15A is an exploded view illustrating a pattern of a dielectric substrate in order from the top while a dielectric stacked substrate constituting the left-handed filter according to the fourth embodiment of the present invention is exploded in each dielectric substrate.

Dielectric substrates 30a to 30g include input port 31, first output port 32a, second output port 32b, and lateral electrodes 33a and 33b. As illustrated in FIG. 15A, dielectric substrate 30a includes first ground electrode 34. As illustrated in FIG. 15G, dielectric substrate 30g includes second ground electrode 35. First ground electrode 34 and second ground electrode 35 are connected to lateral electrodes 33a and 33b to maintain an equal potential. Input port 31 and first output port 32a are insulated from first ground electrode 34, second ground electrode 35, and lateral electrodes 33a and 33b.

As illustrated in FIGS. 15C to 15G, input port 31 is connected to conductive pattern 37 on dielectric substrate 30e and conductive pattern 38 on dielectric substrate 30c through via conductor 36. Conductive pattern 37 is connected to second ground electrode 35 through via conductor 39. Conductive pattern 37 is disposed opposite first ground electrode 34 and second ground electrode 35. Conductive pattern 40 is connected on a dielectric substrate identical to a dielectric substrate in which conductive pattern 38 is disposed. Conductive pattern 41 is disposed on dielectric substrate 30d different from the dielectric substrate on which conductive pattern 40 is disposed, and conductive pattern 41 is disposed opposite conductive pattern 40 while the dielectric material is interposed therebetween.

First output port 32a is connected to conductive pattern 43 on dielectric substrate 30f through via conductor 42. Conductive pattern 43 is connected to conductive pattern 45 on dielectric substrate 30e, the dielectric substrate on which conductive pattern 45 is disposed, and conductive pattern 46 on dielectric substrate 30c through via conductor 44. Conductive pattern 45 is connected to first ground electrode 34 through via conductor 47. Conductive pattern 45 is disposed opposite first ground electrode 34 and second ground electrode 35. Conductive pattern 48 is connected on dielectric substrate 30c identical to a dielectric substrate on which conductive pattern 46 is disposed. Conductive pattern 49 is disposed on dielectric substrate 30d different from the dielectric substrate on which conductive pattern 48 is disposed, and conductive pattern 49 is disposed opposite conductive pattern 48 while the dielectric material is interposed therebetween.

Second output port 32b is connected to conductive pattern 51 on dielectric substrate 30d through via conductor 50 and to conductive pattern 52 on dielectric substrate 30b different from the dielectric substrate on which conductive pattern 51 is disposed. Conductive pattern 51 is connected to first ground electrode 34 through via conductor 53. Conductive pattern 51 is disposed opposite first ground electrode 34 and second ground electrode 35. Conductive pattern 54 is connected on dielectric substrate 30b identical to a dielectric substrate on which conductive pattern 52 is disposed. Conductive pattern 55 is disposed on dielectric substrate 30c different from the dielectric substrate on which conductive pattern 54 is disposed, and conductive pattern 55 is disposed opposite conductive pattern 54 while the dielectric material is interposed therebetween.

Figure 15B:
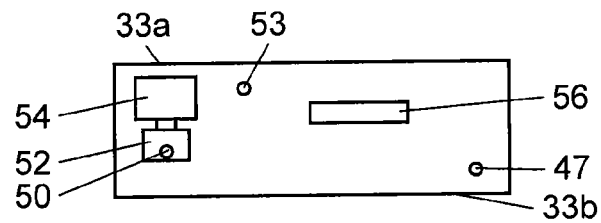
FIG. 15B is an exploded view illustrating a pattern of a dielectric substrate in order from the top while the dielectric stacked substrate constituting the left-handed filter according to the fourth embodiment of the present invention is exploded in each dielectric substrate.
Figure 15C:
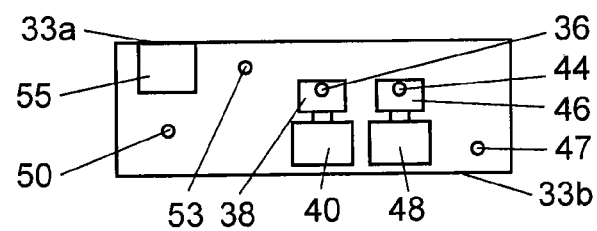
FIG. 15C is an exploded view illustrating a pattern of a dielectric substrate in order from the top while the dielectric stacked substrate constituting the left-handed filter according to the fourth embodiment of the present invention is exploded in each dielectric substrate.
Figure 15D:
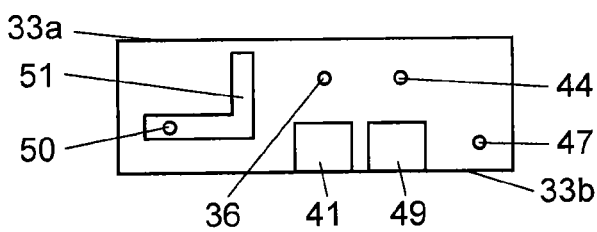
FIG. 15D is an exploded view illustrating a pattern of a dielectric substrate in order from the top while the dielectric stacked substrate constituting the left-handed filter according to the fourth embodiment of the present invention is exploded in each dielectric substrate.
Figure 15E:
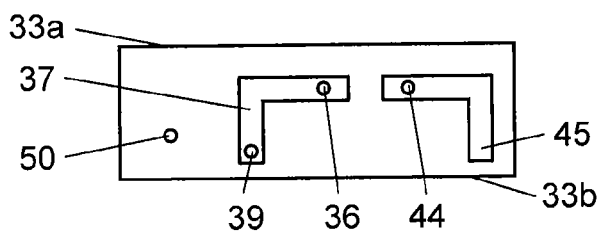
FIG. 15E is an exploded view illustrating a pattern of a dielectric substrate in order from the top while the dielectric stacked substrate constituting the left-handed filter according to the fourth embodiment of the present invention is exploded in each dielectric substrate.
Figure 15F:
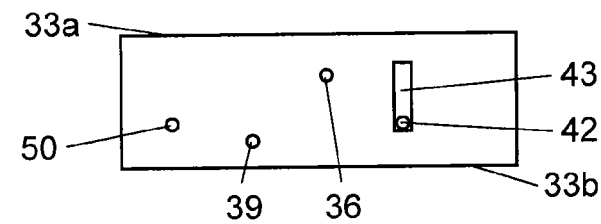
FIG. 15F is an exploded view illustrating a pattern of a dielectric substrate in order from the top while the dielectric stacked substrate constituting the left-handed filter according to the fourth embodiment of the present invention is exploded in each dielectric substrate.
Figure 15G:
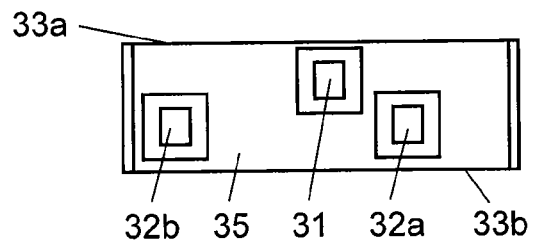
FIG. 15G is an exploded view illustrating a pattern of a dielectric substrate in order from the top while the dielectric stacked substrate constituting the left-handed filter according to the fourth embodiment of the present invention is exploded in each dielectric substrate.

As illustrated in FIGS. 15B and 15C, conductive pattern 56 is disposed on dielectric substrate 30b, and conductive pattern 56 is disposed opposite conductive pattern 38 and conductive pattern 46.

A correspondence relationship between dielectric stacked substrate 30 constituting the left-handed filter illustrated in FIGS. 15A to 15G and the configuration of left-handed resonator 10A illustrated in FIG. 12 will be described below.

Capacitor 111A that is included in first series body 111 included in first left-handed resonator 10A illustrated in FIG. 12 includes conductive pattern 40 and conductive pattern 41 disposed opposite conductive pattern 40. Inductor 111B that is included in first series body 111 included in first left-handed resonator 10A mainly includes conductive pattern 38 and length components of conductive pattern 40 and conductive pattern 41. Capacitor 121A that is included in first parallel body 121 included in first left-handed resonator 10A mainly includes conductive pattern 37, first ground electrode 34, and second ground electrode 35. First ground electrode 34 and second ground electrode 35 are disposed opposite conductive pattern 37. Inductor 121B that is included in first parallel body 121 included in first left-handed resonator 10A includes via conductor 36 and a length component of conductive pattern 37.

A correspondence relationship between dielectric stacked substrate 30 constituting the left-handed filter illustrated in FIGS. 15A to 15G and the configuration of the second left-handed resonator 10B illustrated in FIG. 12 will be described below.

Capacitor 112A that is included in second series body 112 included in second left-handed resonator 10B illustrated in FIG. 12 includes conductive pattern 48 and conductive pattern 49 disposed opposite conductive pattern 48. Inductor 112B that is included in second series body 112 included in second left-handed resonator 10B mainly includes length components of conductive pattern 48 and conductive pattern 49. Capacitor 122A that is included in second parallel body 122 included in second left-handed resonator 10B mainly includes conductive pattern 45, first ground electrode 34, and second ground electrode 35. First ground electrode 34 and second ground electrode 35 are disposed opposite conductive pattern 45. Inductor 122B that is included in second parallel body 122 included in second left-handed resonator 10B includes via conductor 47 and a length component of conductive pattern 45.

A correspondence relationship between dielectric stacked substrate 30 constituting the left-handed filter illustrated in FIGS. 15A to 15G and the configuration of the third left-handed resonator 10C illustrated in FIG. 12 will be described below.

Capacitor 113A that is included in third series body 113 included in third left-handed resonator 10C illustrated in FIG. 12 includes conductive pattern 54 and conductive pattern 55 disposed opposite conductive pattern 54. Inductor 113B that is included in third series body 113 included in third left-handed resonator 10C mainly includes length components of conductive pattern 54 and conductive pattern 55. Capacitor 123A that is included in third parallel body 123 included in third left-handed resonator 10C mainly includes conductive pattern 51, first ground electrode 34, and second ground electrode 35. First ground electrode 34 and second ground electrode 35 are disposed opposite conductive pattern 51. Inductor 123B that is included in third parallel body 123 included in third left-handed resonator 10C illustrated in FIG. 12 includes via conductor 53 and a length component of conductive pattern 51.

Accordingly, the left-handed filter is formed into the structure in which first left-handed resonator 10A, second left-handed resonator 10B, and third left-handed resonator 10C are incorporated in dielectric stacked substrate 30.

A correspondence relationship among dielectric stacked substrate 30 constituting the left-handed filter illustrated in FIGS. 15A to 15G, the configuration of inter-step coupling element 15 illustrated in FIG. 12, and the magnetic field coupling between inductor 121B and inductor 123B will be described below.

Inter-step coupling element 15 illustrated in FIG. 12 has the structure in which conductive pattern 56 is disposed opposite conductive pattern 38 and conductive pattern 46 while the dielectric material is interposed therebetween. The magnetic field coupling between inductor 121B and inductor 123B corresponds to the magnetic field coupling between the length component of stacked conductive pattern 37 and the length component of stacked conductive pattern 51. The degree of magnetic field coupling can be controlled by adjusting a thickness between dielectric substrate 30d and dielectric substrate 30e to stack dielectric substrate 30d and dielectric substrate 30e.

The good bandpass characteristic of the balanced-to-unbalanced filter can be obtained in the frequency band of 2.4 to 2.5 GHz used in the wireless LAN.

Fifth Embodiment

FIGS. 16A to 16L are exploded views each illustrating a pattern of a dielectric substrate in order from the top while dielectric stacked substrate 130 constituting another left-handed filter according to the fourth embodiment of the present invention is exploded in each dielectric substrate. In FIGS. 16A to 16L, each of the patterns of dielectric substrates is provided in parallel with one another. For the sake of convenience, the dielectric substrates illustrated in FIGS. 16A to 16L are sequentially designated by numerals 130a to 130L from the top.

As illustrated in FIGS. 16A to 16L, dielectric substrates 130a to 130L include input port 131, first output port 132a, second output port 132b, and lateral electrodes 133a, 133b, 133c, and 133d (lateral electrodes 133a, 133b, and 133d are insulated from one another).

Figure 16A:
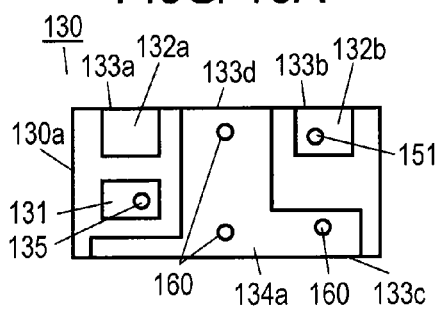
FIG. 16A is an exploded view illustrating a pattern of a dielectric substrate in order from the top while a dielectric stacked substrate constituting another left-handed filter according to the fourth embodiment of the present invention is exploded in each dielectric substrate.
Figure 16B:
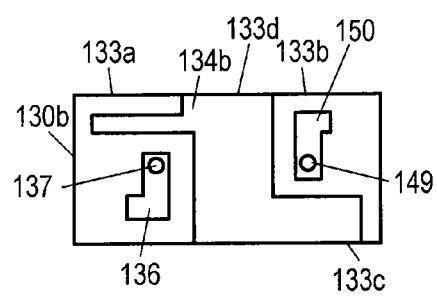
FIG. 16B is an exploded view illustrating a pattern of a dielectric substrate in order from the top while the dielectric stacked substrate constituting another left-handed filter according to the fourth embodiment of the present invention is exploded in each dielectric substrate.
Figure 16C:
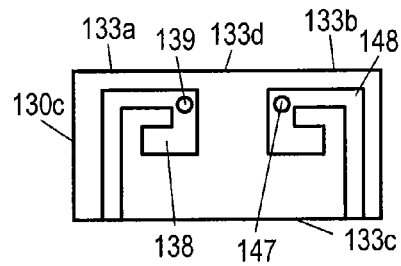
FIG. 16C is an exploded view illustrating a pattern of a dielectric substrate in order from the top while the dielectric stacked substrate constituting another left-handed filter according to the fourth embodiment of the present invention is exploded in each dielectric substrate.
Figure 16D:
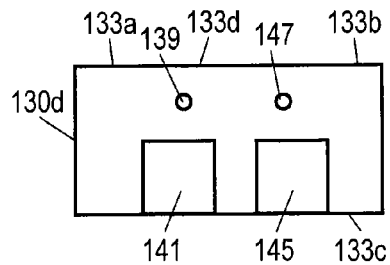
FIG. 16D is an exploded view illustrating a pattern of a dielectric substrate in order from the top while the dielectric stacked substrate constituting another left-handed filter according to the fourth embodiment of the present invention is exploded in each dielectric substrate.

In FIG. 16A, dielectric substrate 130a includes first ground electrode 134a. In FIG. 16B, dielectric substrate 130b includes second ground electrode 134b. In FIG. 16K, dielectric substrate 130k includes third ground electrode 134k. In FIG. 16L, dielectric substrate 130L includes fourth ground electrode 134L.

First ground electrode 134a, second ground electrode 134b, third ground electrode 134k, and fourth ground electrode 134L are each electrically connected to lateral electrodes 133c and 133d to maintain the equal potential. First output port 132a and lateral electrode 133a are electrically connected, and second output port 132b and lateral electrode 133b are electrically connected.

As illustrated in FIGS. 16A to 16L, input port 131 is connected to conductive pattern 136 on dielectric substrate 130b through via conductor 135, and conductive pattern 136 is connected to conductive pattern 138 on dielectric substrate 130c through via conductor 137. Conductive pattern 138 is connected to first ground electrode 134a, second ground electrode 134b, third ground electrode 134k, and fourth ground electrode 134L through lateral electrode 133c, and conductive pattern 138 is connected to conductive pattern 140 on dielectric substrate 130e through via conductor 139. Conductive pattern 140 is disposed opposite conductive pattern 141 on dielectric substrate 130d, and conductive pattern 141 is connected to lateral electrode 133c. Conductive pattern 140 is also disposed opposite conductive pattern 142 on dielectric substrate 130f, and conductive pattern 142 is connected to lateral electrode 133c.

Further, conductive pattern 140 is disposed opposite one end of conductive pattern 143 on dielectric substrate 130f, and the other end of conductive pattern 143 is disposed opposite conductive pattern 144 on dielectric substrate 130e. Conductive pattern 144 is disposed opposite conductive pattern 145 on dielectric substrate 130d, and conductive pattern 145 is connected to lateral electrode 133c. Conductive pattern 144 is also disposed opposite conductive pattern 146 on dielectric substrate 130f, and conductive pattern 146 is connected to lateral electrode 133c.

Conductive pattern 144 is connected to conductive pattern 148 on dielectric substrate 130c through via conductor 147, and conductive pattern 148 is connected to lateral electrode 133c. Further, conductive pattern 148 is connected to conductive pattern 150 on dielectric substrate 130b through via conductor 149, and conductive pattern 150 is connected to second output port 132b through via conductor 151.

Conductive pattern 152 on dielectric substrate 130g, which is disposed opposite conductive pattern 142, is disposed opposite conductive pattern 153 on dielectric substrate 130k, and one end of conductive pattern 152 is connected to lateral electrode 133c. Further, conductive pattern 153 is also disposed opposite conductive pattern 154 on dielectric substrate 130i, and one end of conductive pattern 154 is connected to lateral electrode 133c.

Conductive pattern 153 is connected to conductive pattern 156 on dielectric substrate 130j through via conductor 155, and an end portion of conductive pattern 156 is connected to lateral electrode 133c. Conductive pattern 156 is connected to conductive pattern 158 on dielectric substrate 130k through via conductor 157, and conductive pattern 158 is connected to lateral electrode 133a. Further, conductive pattern 158 is connected to first output port 132a through via conductor 159.

First ground electrode 134a and second ground electrode 134b are connected through via conductor 160, and third ground electrode 134k and fourth ground electrode 134L are connected through via conductor 161.

A correspondence relationship between dielectric stacked substrate 130 constituting the left-handed filter illustrated in FIGS. 16A to 16L and the configuration of left-handed resonator 10A illustrated in FIG. 12 will be described below.

Capacitor 111A that is included in first series body 111 included in first left-handed resonator 10A illustrated in FIG. 12 includes conductive pattern 140 and conductive patterns 141 and 142 disposed opposite conductive pattern 140. Inductor 111B that is included in first series body 111 included in first left-handed resonator 10A mainly includes a length component of conductive pattern 140. Capacitor 121A that is included in first parallel body 121 included in first left-handed resonator 10A mainly includes conductive pattern 138 and second ground electrode 134*b* disposed opposite conductive pattern 138. Inductor 121B that is included in first parallel body 121 included in first left-handed resonator 10A includes a length component of conductive pattern 138.

A correspondence relationship between dielectric stacked substrate 130 constituting the left-handed filter illustrated in FIGS. 16A to 16L and the configuration of second left-handed resonator 10B illustrated in FIG. 12 will be described below.

Capacitor 112A that is included in second series body 112 included in second left-handed resonator 10B illustrated in FIG. 12 includes conductive pattern 144 and conductive patterns 145 and 146 that are disposed opposite conductive pattern 144. Inductor 112B that is included in second series body 112 included in second left-handed resonator 10B mainly includes a length component of conductive pattern 144. Capacitor 122A that is included in second parallel body 122 included in second left-handed resonator 10B mainly includes conductive pattern 148 and second ground electrode 134*b* disposed opposite conductive pattern 148. Inductor 122B that is included in second parallel body 122 included in second left-handed resonator 10B includes a length component of conductive pattern 148.

A correspondence relationship between dielectric stacked substrate 130 constituting the left-handed filter illustrated in FIGS. 16A to 16L and the configuration of third left-handed resonator 10C illustrated in FIG. 12 will be described below.

Capacitor 113A that is included in third series body 113 included in third left-handed resonator 10C illustrated in FIG. 12 mainly includes conductive pattern 153 and conductive patterns 152 and 154 that are disposed opposite conductive pattern 153. Inductor 113B that is included in third series body 113 included in third left-handed resonator 10C mainly includes a length component of conductive pattern 153. Capacitor 123A that is included in third parallel body 123 included in third left-handed resonator 10C mainly includes conductive pattern 157 and third ground electrode 134*k* disposed opposite conductive pattern 157. Inductor 123B that is included in third parallel body 123 included in third left-handed resonator 10C mainly includes a length component of conductive pattern 156.

Accordingly, the left-handed filter is formed into the structure in which first left-handed resonator 10A, second left-handed resonator 10B, and third left-handed resonator 10C are incorporated in dielectric stacked substrate 130.

A correspondence relationship among dielectric stacked substrate 130 constituting the left-handed filter illustrated in FIGS. 16A to 16L, the configuration of inter-step coupling element 15 illustrated in FIG. 12, and the magnetic field coupling between inductor 121B and inductor 123B will be described below.

Inter-step coupling element 15 illustrated in FIG. 12 has the structure in which conductive pattern 143 is disposed opposite conductive pattern 140 and conductive pattern 144 while the dielectric material is interposed therebetween. The magnetic field coupling between inductor 121B and inductor 123B corresponds to the magnetic field coupling between the length component of conductive pattern 138 and the length component of conductive pattern 156. The degree of the magnetic field coupling can be controlled by adjusting a thickness between dielectric substrate 30*d* and dielectric substrate 30*e* to stack dielectric substrate 30*d* and dielectric substrate 30*e*.

Input port 13 of FIG. 12 corresponds to input port 131 of FIG. 16A, first output port 14A of FIG. 12 corresponds to first output port 132*a* of FIG. 16A, and second output port 14B of FIG. 12 corresponds to second output port 132*b* of FIG. 16A. The left-handed filter illustrated in FIGS. 16A to 16L has the configuration in which third left-handed resonator 10C is disposed above first left-handed resonator 10A, so that the compact left-handed filter can be implemented.

In the configuration of the left-handed filter illustrated in FIGS. 16A to 16L, capacitor 111A and capacitor 113A of FIG. 12 are vertically stacked. When capacitor 111A and capacitor 113A are coupled, the signal is outputted from first output port 14A with a phase difference of −90 degrees with respect to the signal supplied to input port 13, and the design is hardly made such that the signal is outputted from second output port 14B with the phase difference of +90 degrees.

Figure 16E:
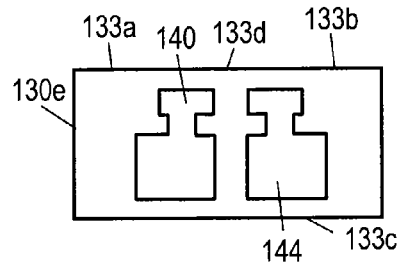
FIG. 16E is an exploded view illustrating a pattern of a dielectric substrate in order from the top while the dielectric stacked substrate constituting another left-handed filter according to the fourth embodiment of the present invention is exploded in each dielectric substrate.
Figure 16F:
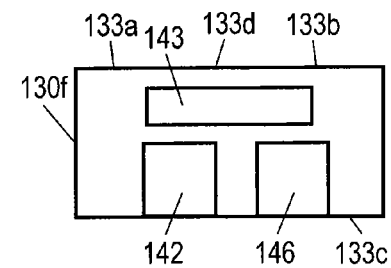
FIG. 16F is an exploded view illustrating a pattern of a dielectric substrate in order from the top while the dielectric stacked substrate constituting another left-handed filter according to the fourth embodiment of the present invention is exploded in each dielectric substrate.
Figure 16G:
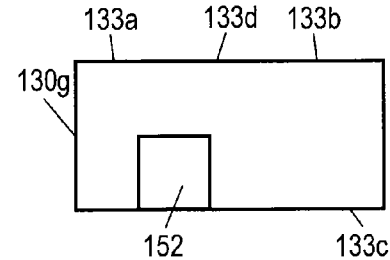
FIG. 16G is an exploded view illustrating a pattern of a dielectric substrate in order from the top while the dielectric stacked substrate constituting another left-handed filter according to the fourth embodiment of the present invention is exploded in each dielectric substrate.
Figure 16H:
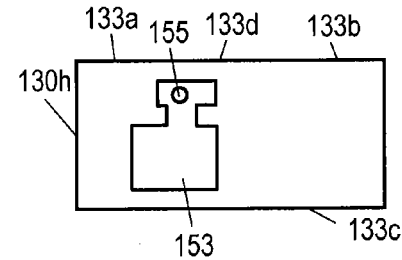
FIG. 16H is an exploded view illustrating a pattern of a dielectric substrate in order from the top while the dielectric stacked substrate constituting another left-handed filter according to the fourth embodiment of the present invention is exploded in each dielectric substrate.
Figure 16I:
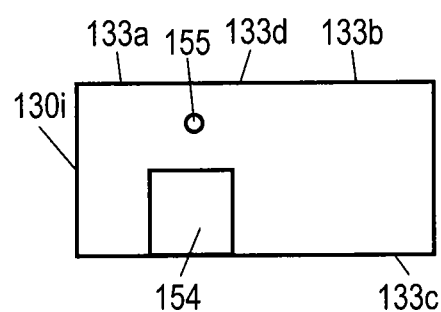
FIG. 16I is an exploded view illustrating a pattern of a dielectric substrate in order from the top while the dielectric stacked substrate constituting another left-handed filter according to the fourth embodiment of the present invention is exploded in each dielectric substrate.
Figure 16J:
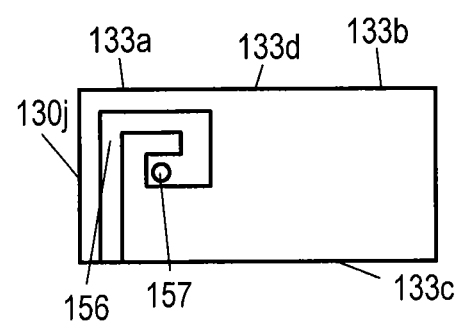
FIG. 16J is an exploded view illustrating a pattern of a dielectric substrate in order from the top while the dielectric stacked substrate constituting another left-handed filter according to the fourth embodiment of the present invention is exploded in each dielectric substrate.
Figure 16K:
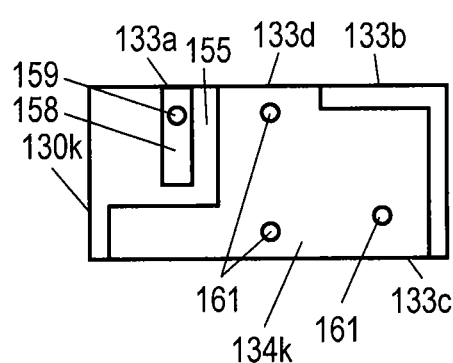
FIG. 16K is an exploded view illustrating a pattern of a dielectric substrate in order from the top while the dielectric stacked substrate constituting another left-handed filter according to the fourth embodiment of the present invention is exploded in each dielectric substrate.
Figure 16L:
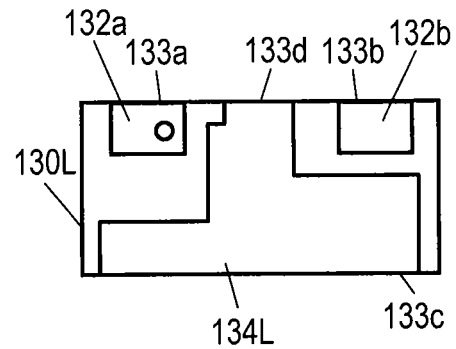
FIG. 16L is an exploded view illustrating a pattern of a dielectric substrate in order from the top while the dielectric stacked substrate constituting another left-handed filter according to the fourth embodiment of the present invention is exploded in each dielectric substrate.

However, in the fifth embodiment according to the invention of the application, capacitor 111A of FIG. 4 is implemented by the configuration in which conductive pattern 140 of FIG. 16E is sandwiched between conductive patterns 141 and 142 connected to lateral electrode 133*c* (the electrode connected to the ground). Similarly, capacitor 113A of FIG. 12 is implemented by the configuration in which conductive pattern 144 of FIG. 16E is sandwiched between conductive patterns 145 and 146 connected to lateral electrode 133*c* (the electrode connected to the ground). Therefore, the coupling between the capacitors can be reduced to implement the easy-to-design left-handed filter.

As described above, the good bandpass characteristic of the balanced-to-unbalanced filter can be obtained in the frequency band of 2.4 to 2.5 GHz used in the wireless LAN.

Sixth Embodiment

Figure 17:
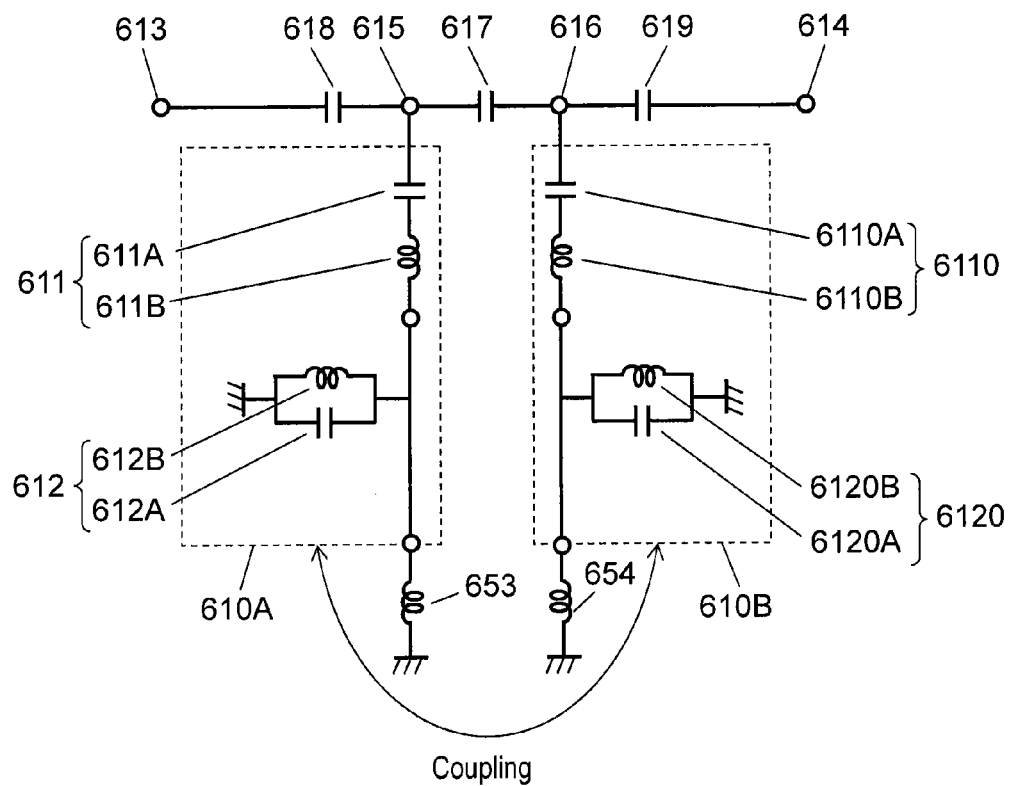
FIG. 17 is an equivalent circuit diagram illustrating a left-handed filter according to a sixth embodiment of the present invention.

FIG. 17 is an equivalent circuit diagram illustrating a left-handed filter according to a sixth embodiment of the present invention. In FIG. 17, the left-handed filter of the seventh embodiment is a filter including input port 613 and output port 614, and inter-step coupling element 617 is interposed between input port 613 and output port 614. One end of first series body 611 is electrically connected at connection point 615 between input port 613 and inter-step coupling element 617, and first series body 611 includes capacitor 611A and inductor 611B. One end of second series body 6110 is electrically connected at connection point 616 between output port 614 and inter-step coupling element 617, and second series body 6110 includes capacitor 6110A and inductor 6110B. One end of first parallel body 612 is electrically connected to the other end of first series body 611, and first parallel body 612 includes capacitor 612A and inductor 612B. One end of second parallel body 6120 is electrically connected to the other end of second series body 6110, and second parallel body 6120 includes capacitor 6120A and inductor 6120B. The other end of first parallel body 612 is electrically connected to the ground. The other end of second parallel body 6120 is electrically connected to the ground. First cell 610A includes first series body 611 and first parallel body 612, and second cell 610B includes second series body 6110 and second parallel body 6120. Input coupling element 618 is interposed between inter-step coupling element 617 and input port 613, and output coupling element 619 is interposed between inter-step coupling element 617 and output port 614. The electromagnetic field coupling is generated between unit cells 610A and 610B.

Further, one end of first parallel body 612 is connected to the ground through inductor 653 that is of a first parasitic component, and one end of second parallel body 6120 is connected to the ground through inductor 654 serving as a second parasitic component.

In the configuration above, the parallel resonant circuit is equivalently formed by first cell 610A and second cell 610B between which the electromagnetic field coupling is generated and inter-step coupling element 617. The impedance of the filter becomes zero when viewed from the input side or the output side, and the frequency at which the signal is passed to the ground exists, so that the number of poles can be increased by one in the passband. As a result, the attenuation characteristic can be improved.

In the left-handed filter according to the sixth embodiment of the present invention, because first parallel body 612 and second parallel body 6120 include inductors 612B and 6120B connected directly to the ground, a large high-frequency current is passed through inductors 612B and 6120B compared with the right-handed filter. As a result, compared with the right-handed filter, intensity of the electromagnetic field coupling between unit cells 610A and 610B can be enhanced to increase the number of attenuation poles in the passband, and the frequency can easily be controlled.

Further, the 0-order resonance coupling between the two unit cells 610A and 610B can easily be controlled by adjusting capacitance values of input coupling element 618, inter-step coupling element 617, and output coupling element 619. Therefore, the left-handed filter in which the passband is formed by the 0-order resonance can be configured. Since the attenuation pole generated by the electromagnetic field coupling between unit cells 610A and 610B and inter-step coupling element 617 can be disposed and controlled, the left-handed filter having more excellent filter characteristic than that of the general left-handed filter can be provided. Not the capacitor, but the inductor may be used as input coupling element 618, inter-step coupling element 617, and output coupling element 619.

Figure 18:
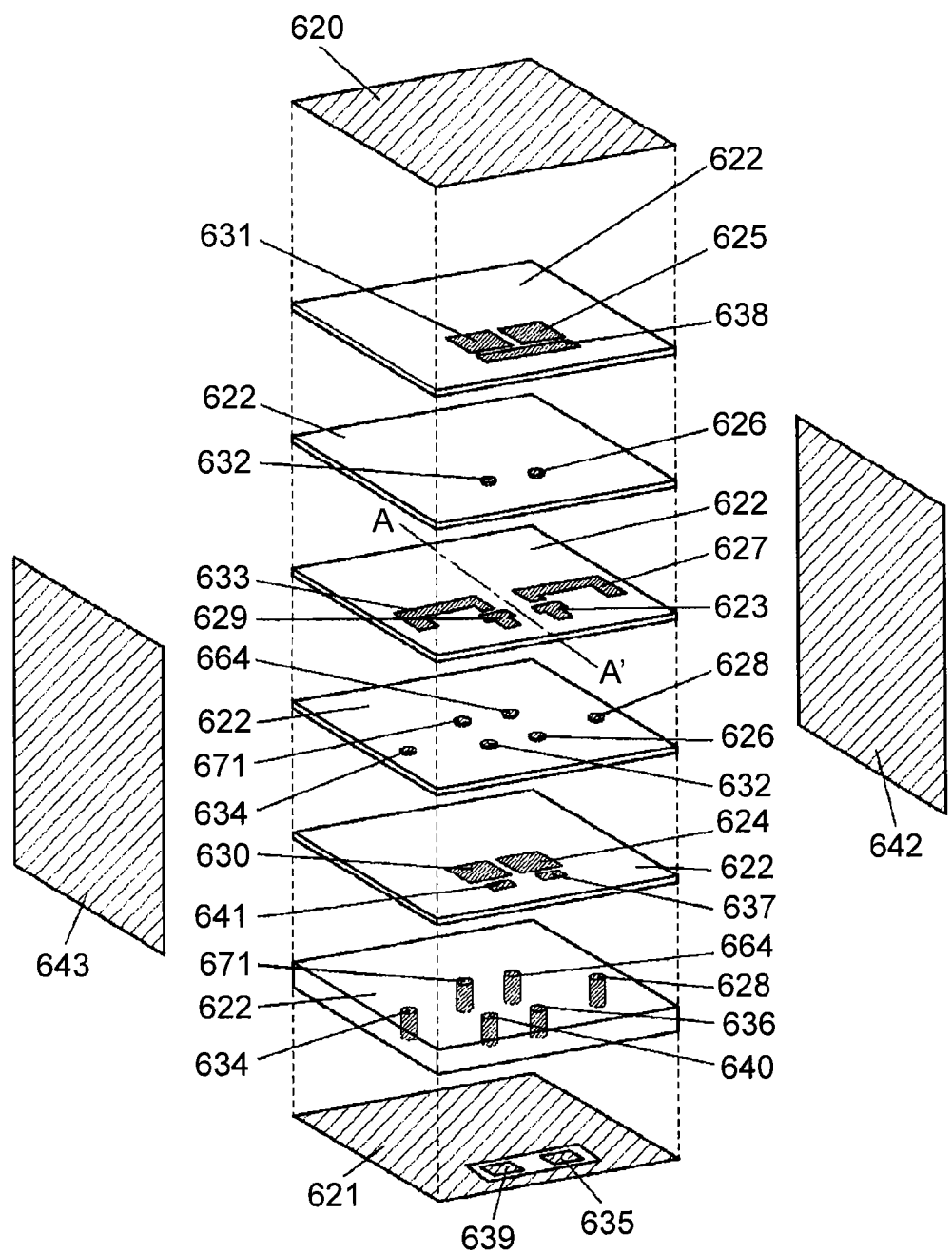
FIG. 18 is an exploded perspective view illustrating a structure of the left-handed filter according to the sixth embodiment of the present invention.

FIG. 18 is an exploded perspective view illustrating a structure of the left-handed filter according to the sixth embodiment of the present invention. In FIG. 18, the left-handed filter has the structure in which the space between grounded conductors 620 and 621 disposed opposite each other is filled with dielectric material 622. Conductive pattern 623 corresponds to inductor 611B illustrated in FIG. 17. Conductive pattern 623 and conductive pattern 627 are sandwiched between conductive patterns 624 and 625 that are connected through via conductor 626, thereby forming capacitor 611A illustrated in FIG. 17.

Conductive pattern 627 is connected to grounded conductor 621 through via conductor 628, thereby forming inductor 612B illustrated in FIG. 17. Capacitor 612A includes conductive pattern 627 and grounded conductors 620 and 621. Capacitor 611A, inductor 611B, capacitor 612A, and inductor 612B correspond to unit cell 610A.

Unit cells 610B and 610A illustrated in FIG. 17 are formed in a mirror-surface symmetrical manner in relation to line segment A-A' of FIG. 18, and conductive pattern 629 corresponds to inductor 6110B. Conductive pattern 629 and conductive pattern 633 are configured to be sandwiched between conductive patterns 630 and 631 that are connected through via conductor 632, thereby forming capacitor 6110A. Conductive pattern 633 is connected to grounded conductor 621 through via conductor 634, thereby forming inductor 6120B. Capacitor 6120A includes conductive pattern 633 and grounded conductors 620 and 621. Capacitor 6110A, inductor 6110B, capacitor 6120A, and inductor 6120B correspond to unit cell 610B.

Input coupling element 618 illustrated in FIG. 17 includes a conductive pattern 637 connected through via conductor 636 by input terminal 635 and conductive pattern 623 corresponding to inductor 611B. Inter-step coupling element 617 includes conductive pattern 623 constituting a part of unit cell 610A, conductive pattern 629 constituting a part of unit cell 610B, and conductive pattern 638. Output coupling element 619 includes conductive pattern 641 connected through via conductor 640 by output terminal 639 and conductive pattern 629 corresponding to inductor 611B.

Furthermore, via 664 is provided between conductive pattern 627 and grounded conductor 621, and via 671 is provided between conductive pattern 633 and grounded conductor 621.

In the configuration above, the impedance of the filter becomes zero when viewed from the input side or the output side, and the frequency at which the signal is passed to the ground exists, so that the number of poles can be increased by one in the passband. As a result, the attenuation characteristic can be improved. The quarter-wave mode is excited by inductor 653 and unit cell 610A of FIG. 17, which allows the −1-order mode to be excited by the same number of unit cells as the case in which the 0-order mode is excited. Therefore, the −1-order mode can be excited by half the number of the conventional unit cells. As a result, the no-load Q value can be improved to achieve the miniaturization.

Herein, input coupling element 618 and output coupling element 619 are expressed by the capacitors as illustrated in FIG. 17. However, when each of the capacitors has a capacitance of 10 pF or more, input coupling element 618 and output coupling element 619 may be removed to directly connect connection points to input port and output port.

The left-handed filter of the present invention has the effect that the attenuation characteristic can be improved, and the left-handed filter is usefully applied to various electronic instruments such as a cellular telephone.

Seventh Embodiment

Figure 19:
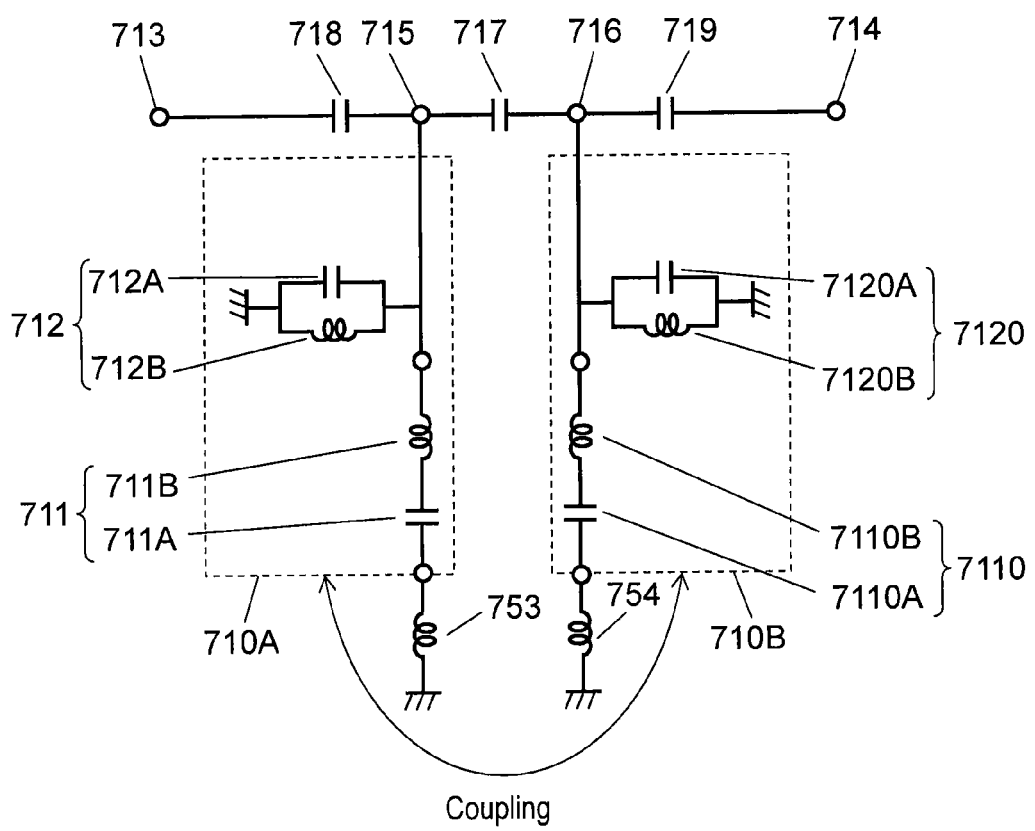
FIG. 19 is an equivalent circuit diagram illustrating a left-handed filter according to a seventh embodiment of the present invention.

FIG. 19 is an equivalent circuit diagram illustrating a left-handed filter according to a seventh embodiment of the present invention. In FIG. 19, the left-handed filter of the seventh embodiment is a filter including input port 713 and output port 714, and inter-step coupling element 717 is interposed between input port 713 and output port 714. One end of first parallel body 712 is electrically connected between input port 713 and inter-step coupling element 717, and first parallel body 712 includes capacitor 712A and inductor 712B. One end of second parallel body 7120 is electrically connected between output port 714 and inter-step coupling element 717, and second parallel body 7120 includes capacitor 7120A and inductor 7120B. One end of first series body 711 is electrically connected to one end of first parallel body 712, and first series body 711 includes capacitor 711A and inductor 711B. One end of second series body 7110 is electrically connected to one end of second parallel body 7120, and second series body 7110 includes capacitor 7110A and inductor 7110B. The other end of first parallel body 712 is electrically connected to the ground. The other end of second parallel body 7120 is electrically connected to the ground. First cell 710A includes first parallel body 712 and first series body 711, second cell 710B includes second parallel body 7120 and second series body 7110, and the electromagnetic field coupling is generated between first cell 710A and second cell 710B. Input coupling element 718 is interposed between inter-step coupling element 717 and input port 713, and output coupling element 719 is interposed between inter-step coupling element 717 and output port 714.

The other end of first series body 711 is connected to the ground through inductor 753 serving as a first parasitic component, and the other end of second series body 7110 is connected to the ground through inductor 754 serving as a second parasitic component.

In the configuration above, the impedance of the filter becomes infinite when the output side is viewed from the input side, and the number of poles can be increased by one in the passband. As a result, the attenuation characteristic can be improved. The quarter-wave mode is excited by inductor 753 and unit cell 710A of FIG. 19, which allows the −1-order mode to be excited by the same number of unit cells as the case in which the 0-order mode is excited. Therefore, the −1-order mode can be excited by half the number of the conventional unit cells. As a result, the no-load Q value can be improved to achieve the miniaturization.

In the configuration above, first parallel body 712 and first series body 711, and second parallel body 7120 and second series body 7110 constitute the parallel circuits, respectively. Therefore, the passband of the filter can be shifted to the lower side to form the more compact filter.

In the configuration above, the parallel resonant circuit is equivalently formed by first cell 710A and second cell 710B between which the electromagnetic field coupling is generated and inter-step coupling element 717. Accordingly, the impedance of the filter becomes zero when viewed from the input side or the output side, and the frequency at which the signal is passed to the ground exists, so that the number of poles can be increased by one in the passband. As a result, the attenuation characteristic can be improved.

The 0-order resonance coupling between the two unit cells 710A and 710B can easily be controlled by adjusting capacitance values of input coupling element 718, inter-step coupling element 717, and output coupling element 719. Therefore, the left-handed filter in which the passband is formed by the 0-order resonance can be configured. Since the attenuation pole generated by the electromagnetic field coupling between unit cells 710A and 710B and inter-step coupling element 717 can be disposed and controlled, the left-handed filter having more excellent filter characteristic than that of the general left-handed filter can be provided.

In the left-handed filter according to the seventh embodiment of the present invention, because first parallel body 712 and second parallel body 7120 include inductors 712B and 7120B that are directly connected to the ground, a large high-frequency current is passed through inductors 712B and 7120B compared with the right-handed filter. As a result, compared with the right-handed filter, the intensity of the electromagnetic field coupling between unit cells 710A and 710B can be enhanced to increase the number of attenuation poles in the passband, and the frequency can easily be controlled. Not the capacitor, but the inductor may be used as input coupling element 718, inter-step coupling element 717, and output coupling element 719.

Figure 20:
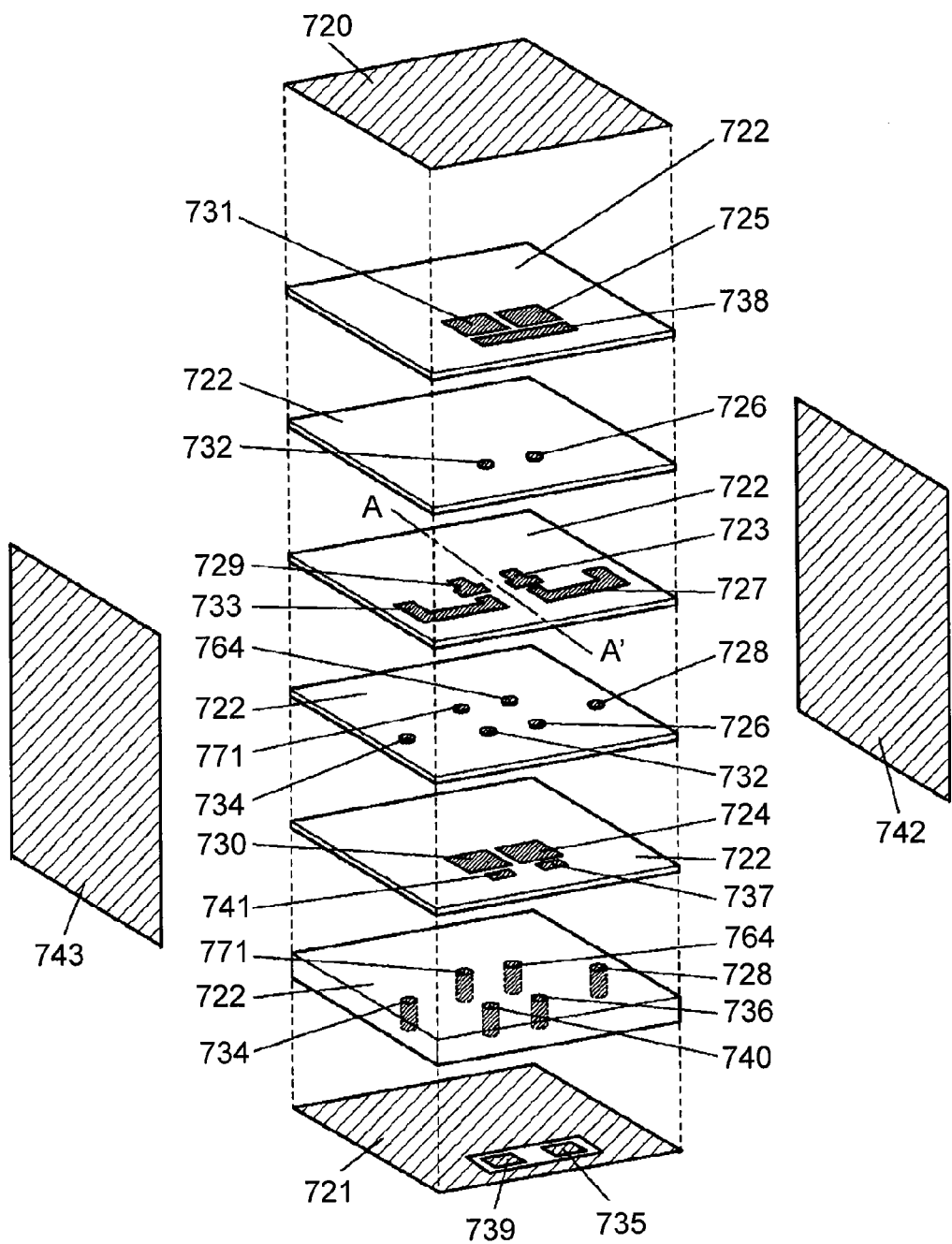
FIG. 20 is an exploded perspective view illustrating a structure of the left-handed filter according to the seventh embodiment of the present invention.

FIG. 20 is an exploded perspective view illustrating a structure of the left-handed filter according to the seventh embodiment of the present invention. In FIG. 20, the left-handed filter has the structure in which the space between grounded conductors 720 and 721 disposed opposite each other is filled with dielectric material 722. Conductive pattern 723 corresponds to inductor 711B of FIG. 19. Conductive pattern 723 and conductive pattern 727 are sandwiched between conductive patterns 724 and 725 that are connected through via conductor 726, thereby forming capacitor 711A illustrated in FIG. 19.

Conductive pattern 727 is connected to grounded conductor 721 through via conductor 728, thereby forming inductor 712B illustrated in FIG. 19. Capacitor 712A includes conductive pattern 727 and grounded conductors 720 and 721. Capacitor 711A, inductor 711B, capacitor 712A, and inductor 712B correspond to unit cell 710A.

Unit cells 710B and 710A illustrated in FIG. 19 are formed in a mirror-surface symmetrical manner in relation to line segment A-A' of FIG. 20, and conductive pattern 729 corresponds to inductor 7110B. Conductive pattern 729 and conductive pattern 733 are configured to be sandwiched between conductive patterns 730 and 731 that are connected through via conductor 732, thereby forming capacitor 7110A. Conductive pattern 733 is connected to grounded conductor 721 through via conductor 734, thereby forming inductor 7120B. Capacitor 7120A includes conductive pattern 733 and grounded conductors 720 and 721. Capacitor 7110A, inductor 7110B, capacitor 7120A, and inductor 7120B correspond to unit cell 710B.

Input coupling element 718 illustrated in FIG. 19 includes a conductive pattern 737 that is connected through via conductor 736 by input terminal 735 and conductive pattern 727 corresponding to inductor 712B. Inter-step coupling element 717 includes conductive pattern 727 constituting a part of unit cell 710A, conductive pattern 733 constituting a part of unit cell 710B, and conductive pattern 738. Output coupling element 719 includes conductive pattern 741 connected through via conductor 740 by output terminal 739 and conductive pattern 733 corresponding to inductor 712B.

Via 764 is provided between conductive pattern 723 and grounded conductor 721, and via 771 is provided between conductive pattern 729 and grounded conductor 721.

In the configuration above, the parallel resonant circuit is formed by unit cell 710A, and unit cell 710A includes via 764 and conductive pattern 723 constituting inductor 711B illustrated in FIG. 19, conductive patterns 723, 724, 725, and 727 constituting capacitor 711A and via conductor 726, conductive pattern 727 constituting inductor 712B and via conductor 728, and conductive pattern 727 constituting capacitor 712A and grounded conductors 720 and 721. The parallel resonant circuit is also formed by unit cell 710B, and unit cell 710B includes via 771 and conductive pattern 729 constituting inductor 7110B, conductive patterns 729, 730, 731, and 733 constituting capacitor 7110A and via conductor 32, conductive pattern 733 constituting inductor 7120B and via conductor 734, and conductive pattern 723 constituting capacitor 7120A and grounded conductors 720 and 721. Accordingly, the passband of the filter can be shifted to the lower side to implement the more compact filter.

Herein, input coupling element 718 and output coupling element 719 are expressed by the capacitors as illustrated in FIG. 19. However, when each of the capacitors has the capacitance of 10 pF or more, input coupling element 718 and output coupling element 719 may be removed to directly connect connection points to input port and output port.

Eighth Embodiment

Figure 21:
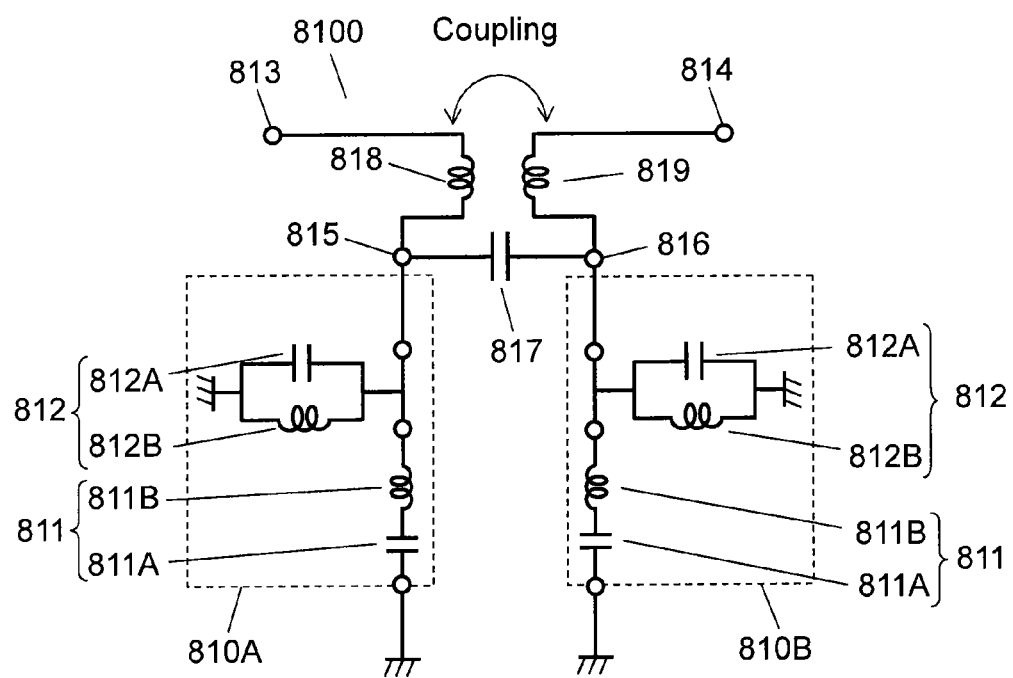
FIG. 21 is an equivalent circuit diagram of a left-handed filter according to an eighth embodiment of the present invention.

FIG. 21 is an equivalent circuit diagram of a left-handed filter according to an eighth embodiment of the present invention. With reference to FIG. 21, left-handed filter 8100 of the eighth embodiment includes input port 813, output port 814, inter-step coupling element 817 electrically connected to input port 813 and output port 814, and resonator 810A and resonator 810B that are connected to inter-step coupling element 817. Left-handed filter 8100 also includes first inductor 818 that is connected among input port 813, inter-step coupling element 817, and resonator 810A and second inductor 819 that is connected among output port 814, inter-step coupling element 817, and resonator 810B.

In resonator 810A, one end is connected to one end of inter-step coupling element 817, and the other end is grounded. At this point, a point at which one end of resonator 810A and one end of inter-step coupling element 817 are connected is defined as connection point 815. In resonator 810B, one end is connected to the other end of inter-step coupling element 817, and the other end is grounded. At this point, a point at which one end of resonator 810B and the other end of inter-step coupling element 817 are connected is defined as connection point 816.

In the eighth embodiment, the other end of each of resonators 810A and 810B is grounded. Alternatively, the other end of each of resonators 810A and 810B may be opened. Further, each of resonators 810A and 810B includes one resonator. Alternatively, each of resonators 810A and 810B may include a plurality of resonators connected in series.

Resonator 810A includes parallel body 812 and series body 811. Parallel body 812 includes capacitor 812A and inductor 812B, and capacitor 812A and inductor 812B are connected in parallel. Series body 811 includes capacitor 811A and inductor 811B, and capacitor 811A and inductor 811B are connected in series. In series body 811, one end is connected to one end 815 of inter-step coupling element 817. In parallel body 812, one end is connected to the other end of series body 811, and the other end is grounded. Since resonator 810B has the same structure as resonator 810A, the description of resonator 810B is omitted.

In the eighth embodiment, series body 811 included in resonator 810A has a configuration in which inductor 811B is connected to parallel body 812 while capacitor 811A is connected to connection point 815. Alternatively, series body 811 may have a configuration in which capacitor 811A is connected to parallel body 812 while inductor 811B is connected to connection point 815. Resonator 810B may have the similar configuration.

First inductor 818 is connected between connection point 815 and input port 813. Second inductor 819 is connected between connection point 816 and output port 814. The disposition relationship between first inductor 818 and second inductor 819 is adjusted such that the magnetic field coupling can be generated between first inductor 818 and second inductor 819. That is, a distance between first inductor 818 and second inductor 819 is shortened. When the distance between first inductor 818 and second inductor 819 becomes a predetermined value or less, the magnetic field coupling is generated between first inductor 818 and second inductor 819. On the other hand, when the distance between first inductor 818 and second inductor 819 is more than the predetermined value, the magnetic field coupling is not generated between first inductor 818 and second inductor 819.

A characteristic of left-handed filter 8100 in generating the magnetic field coupling between first inductor 818 and second inductor 819 will be described below.

Figure 22:
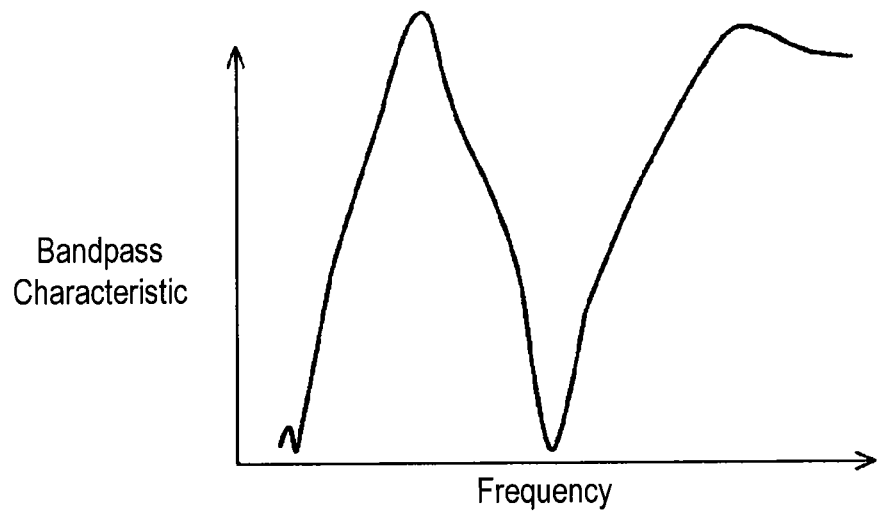
FIG. 22 is a frequency characteristic diagram when magnetic field coupling between a first inductor and a second inductor is not generated in the left-handed filter according to the eighth embodiment of the present invention.
Figure 23:
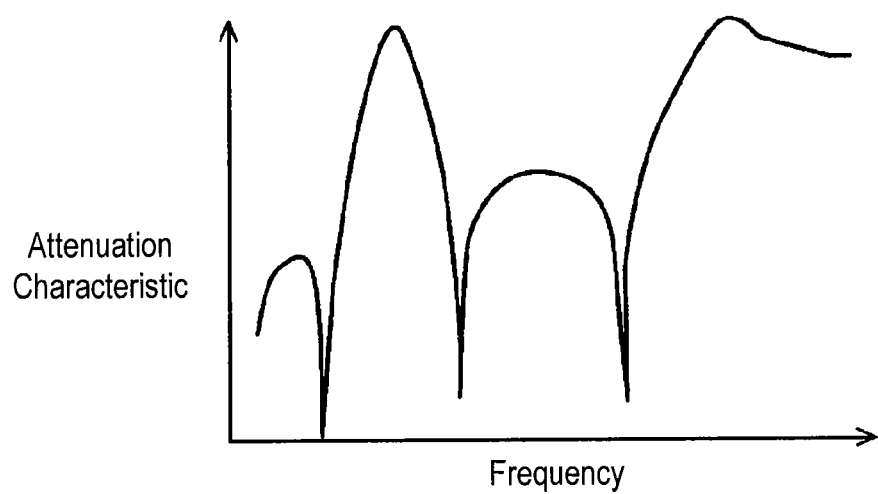
FIG. 23 is a frequency characteristic diagram when the magnetic field coupling between the first inductor and the second inductor is generated in the left-handed filter according to the eighth embodiment of the present invention.

FIG. 22 is a frequency characteristic diagram when magnetic field coupling between the first inductor 818 and the second inductor 819 is not generated in the left-handed filter according to the eighth embodiment of the present invention. FIG. 23 is a frequency characteristic diagram when the magnetic field coupling between the first inductor 818 and the second inductor 819 is generated in the left-handed filter according to the eighth embodiment of the present invention.

In FIGS. 22 and 23, when the magnetic field coupling is generated between first inductor 818 and second inductor 819, the attenuation pole is newly generated within the passband in the left-handed filter 8100. Accordingly, the number of attenuation poles generated in left-handed filter 8100 can be increased by generating the magnetic field coupling between first inductor 818 and second inductor 819. Further, all the attenuation poles including the attenuation poles possessed originally by left-handed filter 8100 can be disposed at any frequency by adjusting the distance between first inductor 818 and second inductor 819. Accordingly, in the left-handed filter of the eighth embodiment, a balance can be established between the improvement of the attenuation characteristic and the adjustment of the attenuation characteristic.

In the eighth embodiment, resonator 810A and resonator 810B are the left-handed resonators that are connected in parallel between input port 813 and output port 814. Alternatively, at least three left-handed resonators may be connected in parallel. In such cases, each one inter-step coupling element is connected between the left-handed resonators. First inductor 818 is connected among input port 813, the left-handed resonator on the side closest to input port 813, and the inter-step coupling element on the side closest to input port 813. Second inductor 819 is connected among output port 814, the left-handed resonator on the side closest to output port 814, and the inter-step coupling element on the side closest to output port 814.

Figure 24:
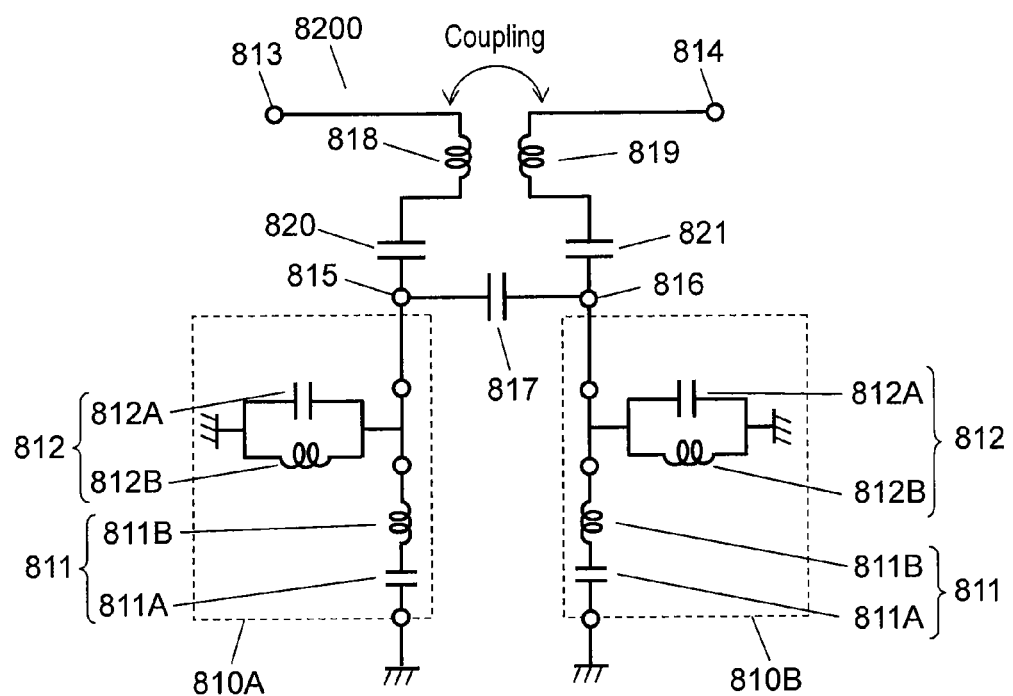
FIG. 24 is an equivalent circuit diagram of another left-handed filter according to the eighth embodiment of the present invention.

FIG. 24 is an equivalent circuit diagram of another left-handed filter according to the eighth embodiment of the present invention. With reference to FIG. 24, in addition to the configuration of the eighth embodiment illustrated in FIG. 21, left-handed filter 8200 further includes input coupling element 820 that is connected between first inductor 818 and connection point 815 and output coupling element 821 that is connected between second inductor 819 and connection point 816. In the configuration above, the balance can easily be established between the improvement of the attenuation characteristic and the adjustment of the attenuation characteristic.

Figure 25:
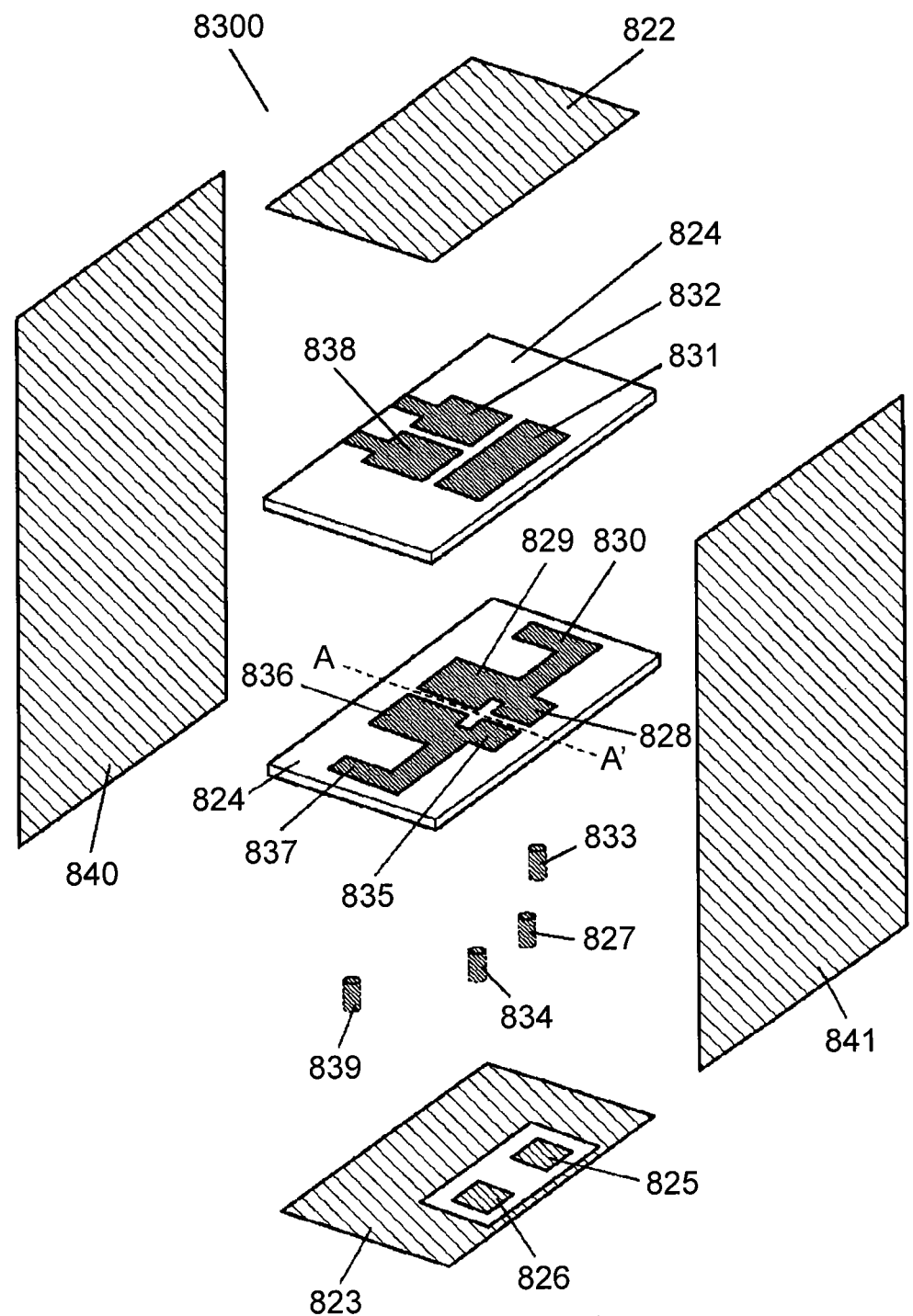
FIG. 25 is an exploded perspective view illustrating a structure of the left-handed filter according to the eighth embodiment of the present invention.

FIG. 25 is an exploded perspective view illustrating a structure of the left-handed filter according to the eighth embodiment of the present invention. In FIG. 25, left-handed filter 8300 has a structure in which a space between grounded conductor 822 and 823 that are disposed opposite each other is filled with dielectric material 824. Input port 825 and output port 826 that are insulated from grounded conductor 823 are provided on the same plane as grounded conductor 823. Input port 825 and output port 826 are insulated from each other. Conductive pattern 828 is connected to input port 825 through via conductor 827. Conductive pattern 828 is connected to conductive pattern 829 and conductive pattern 830, and conductive pattern 828, conductive pattern 829, and conductive pattern 830 are disposed on the same plane. Conductive pattern 828 is disposed opposite conductive pattern 831 while dielectric material 824 is interposed therebetween. Conductive pattern 829 is disposed opposite conductive pattern 832 while dielectric material 824 is interposed therebetween. Conductive pattern 830 is connected to grounded conductor 823 through via conductor 833. Conductive pattern 835 is connected to output port 826 through via conductor 834. Conductive pattern 835 is connected to conductive pattern 836 and conductive pattern 837, and conductive pattern 835, conductive pattern 836, and conductive pattern 837 are disposed on the same plane. That is, conductive patterns 828, 829, 830, 835, 836, and 837 are disposed on the same plane. Conductive pattern 835 is disposed opposite conductive pattern 831 while dielectric material 824 is interposed therebetween. Conductive pattern 836 is disposed opposite conductive pattern 838 while dielectric material 824 is interposed therebetween. Conductive pattern 837 is connected to grounded conductor 823 through via conductor 839. Conductive patterns 831, 832, and 838 are disposed on the same plane. Grounded conductors 822 and 823 are connected to lateral electrodes 840 and 841. Accordingly, a potential at grounded conductor 822 is equal to a potential at grounded conductor 823.

A correspondence relationship between the structure of left-handed filter 8300 illustrated in FIG. 25 and the configuration of resonator 810A illustrated in FIG. 21 will be described below.

Capacitor 811A of FIG. 21 includes conductive pattern 829 and conductive pattern 832 disposed opposite conductive pattern 829. Inductor 811B includes a parasitic inductor possessed by conductive patterns 829 and 832. Inductor 812B includes a parasitic inductor possessed by via conductor 833 connected to grounded conductor 823. Capacitor 812A mainly includes conductive patterns 829, 830, and 832 and grounded conductors 822 and 823 that are disposed opposite conductive patterns 829, 830, and 832. Resonator 810B and resonator 810A are disposed in the line symmetrical manner in relation to line segment A-A', and the configuration of the resonator 810B is similar to that of resonator 810A. Therefore, the description of resonator 810B is omitted.

A correspondence relationship between the structure of left-handed filter 8300 illustrated in FIG. 25 and the configuration of inter-step coupling element 817 illustrated in FIG. 21 will be described below.

Inter-step coupling element 817 is formed by the structure in which conductive pattern 828 and conductive pattern 831 are disposed opposite each other while dielectric material 824 is interposed therebetween and the structure in which conductive pattern 835 and conductive pattern 831 are disposed opposite each other while dielectric material 824 is interposed therebetween.

A correspondence relationship among the structure of left-handed filter 8300 illustrated in FIG. 25 and the configuration of first inductor 818 and the configuration of second inductor 819 illustrated in FIG. 21 will be described below.

First inductor 818 includes a parasitic inductor possessed by via conductor 827. Second inductor 819 includes a parasitic inductor possessed by via conductor 834. All the attenuation poles including the attenuation poles possessed originally by left-handed filter 8300 can be disposed at any frequency by adjusting the distance between via conductor 827 and via conductor 834 to stack via conductor 827 and via conductor 834.

When the stacked structure is realized by the above configuration in left-handed filter 8300, it is not necessary to adjust the components of the already-designed left-handed filter. The number of attenuation poles generated in left-handed filter 8300 can be increased only by newly providing the inductor while the passband is secured. Further, all the attenuation poles including the attenuation poles possessed originally by left-handed filter 8300 can be disposed at any frequency only by adjusting the distance between the via conductors. Accordingly, it is not necessary to repeat the design. Since the inductor including the via conductor can be accommodated in the space already defined by the design, it is not necessary to secure the new space. As described above, production cost is suppressed, the compact left-handed filter is maintained, the number of attenuation poles generated is increased while the passband is secured, and all the attenuation poles including the attenuation poles possessed originally by the left-handed filter can be controlled.

The configuration corresponding to input coupling element 820 or output coupling element 821 illustrated in FIG. 24 does not exist in the structure of left-handed filter 8300. Generally input coupling element 820 or output coupling element 821 needs a large space to prevent the miniaturization. Accordingly, as illustrated in FIG. 25, left-handed filter 8300 in which the configuration corresponding to input coupling element 820 or output coupling element 821 is removed can suppress the production cost, maintain the compact left-handed filter, increase the number of attenuation poles generated while the passband is secured, control all the attenuation poles including the attenuation poles possessed originally by left-handed filter 8100, and achieve the further miniaturization.

The left-handed filter according to the eighth embodiment of the present invention can suppress the production cost, maintain the compact left-handed filter, increase the number of attenuation poles generated while the passband is secured, and control all the attenuation poles including the attenuation poles possessed originally by left-handed filter. The left-handed filter of the eighth embodiment is usefully applied to various electronic instruments such as a cellular telephone.

Ninth Embodiment

Figure 26:
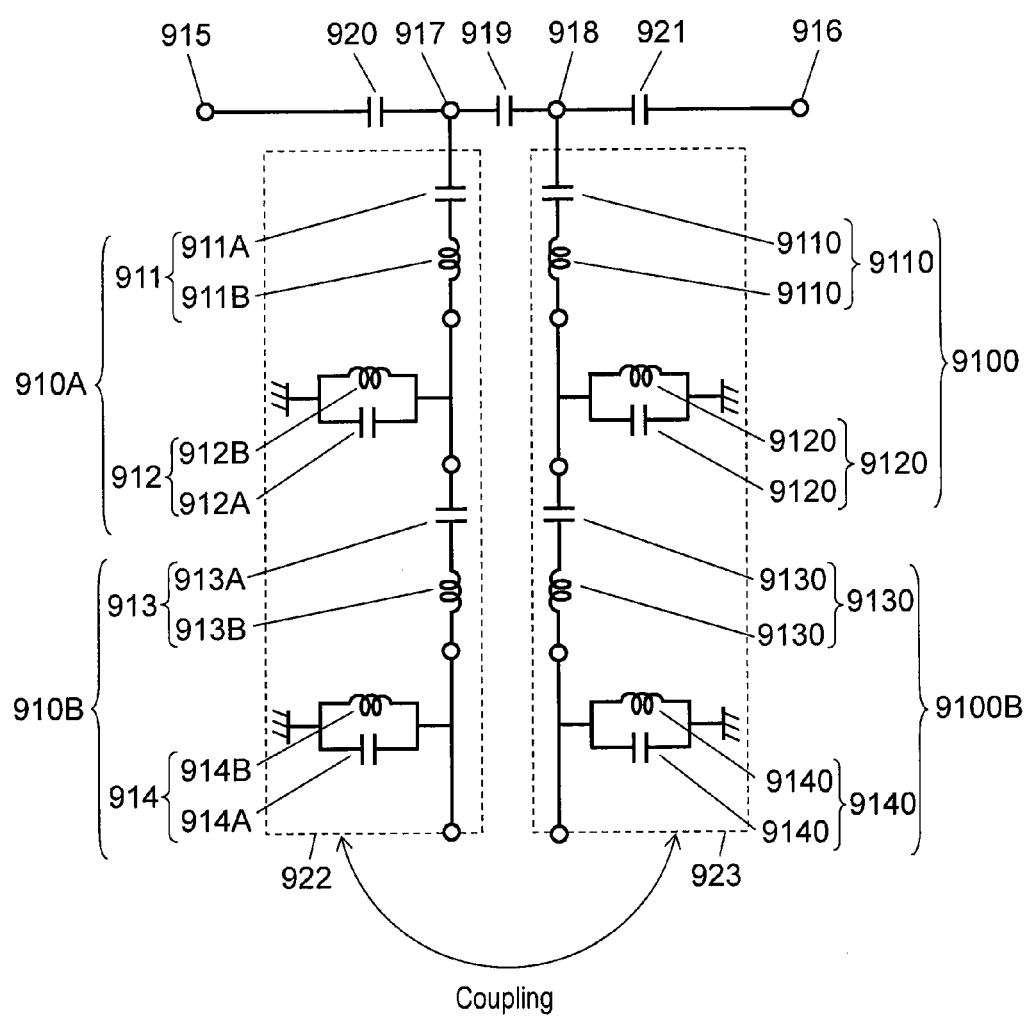
FIG. 26 is an equivalent circuit illustrating a left-handed filter according to a ninth embodiment of the present invention.

FIG. 26 is an equivalent circuit illustrating a left-handed filter according to a ninth embodiment of the present invention. In FIG. 26, the left-handed filter of the ninth embodiment is a filter including input port 915 and output port 916, inter-step coupling element 919 is interposed between input port 915 and output port 916, and one end of first series body 911 including capacitor 911A and inductor 911B is electrically connected at connection point 917 between input port 915 and inter-step coupling element 919. One end of second series body 9110 including capacitor 9110A and inductor 9110B is electrically connected at connection point 918 between output port 916 and inter-step coupling element 919. One end of first parallel body 912 including capacitor 912A and inductor 912B is electrically connected to the other end of first series body 911. One end of second parallel body 9120 including capacitor 9120A and inductor 9120B is electrically connected to the other end of second series body 9110. The other end of first parallel body 912 is electrically connected to the ground. The other end of second parallel body 9120 is electrically connected to the ground. First series body 911 and first parallel body 912 constitute first cell 910A, and second series body 9110 and second parallel body 9120 constitute second cell 9100A. The other end of first series body 911 is connected to one end of third series body 913 including capacitor 913A and inductor 913B. The other end of second series body 9110 is connected to one end of fourth series body 9130 including capacitor 9130A and inductor 9130B. One end of third parallel body 914 including capacitor 914A and inductor 914B is electrically connected to the other end of third series body 913. One end of fourth parallel body 9140 including capacitor 9140A and inductor 9140B is electrically connected to the other end of fourth series body 9130. The other end of third parallel body 914 is electrically connected to the ground. The other end of fourth parallel body 9140 is electrically connected to the ground. Third series body 913 and third parallel body 914 constitute third cell 910B, and fourth series body 9130 and fourth parallel body 9140 constitute fourth cell 9100B.

Input coupling element 920 is interposed between inter-step coupling element 919 and input port 915, and output coupling element 921 is interposed between inter-step coupling element 919 and output port 916. The electromagnetic field coupling is generated between first CRLH resonator 922 including unit cells 910A and 910B and second CRLH resonator 923 including unit cells 9100A and 9100B.

In the configuration above, because of inter-step coupling element 919 and the electromagnetic field coupling generated between first CRLH resonator 922 and second CRLH resonator 923, the impedance of the filter becomes zero when viewed from the input side or the output side, and the frequency at which the signal is passed to the ground exists, so that the number of poles can be increased by one in the passband. As a result, the attenuation characteristic can be improved.

The −1-order resonance coupling between two CRLH resonators 922 and 923 can easily be controlled by adjusting capacitance values of input coupling element 920, inter-step coupling element 919, and output coupling element 921. Therefore, the left-handed filter in which the passband is formed by the −1-order resonance can be configured. Since the attenuation pole generated by the electromagnetic field coupling between CRLH resonators 922 and 923 and inter-step coupling element 915 can be disposed and controlled, the left-handed filter having more excellent filter characteristic than that of the general left-handed filter can be provided.

In the left-handed filter according to the ninth embodiment of the present invention, because first parallel body 912, second parallel body 9120, third parallel body 914, and fourth parallel body 9140 include inductors 912B, 9120B, 914B, and 9140B that are directly connected to the ground, the large high-frequency current is passed through inductors 912B, 9120B, 914B, and 9140B compared with the right-handed filter. As a result, compared with the right-handed filter, the intensity of the electromagnetic field coupling between CRLH resonators 922 and 923 can be enhanced to increase the number of attenuation poles in the passband, and the frequency can easily be controlled. Not the capacitor, but the inductor may be used as input coupling element 920, inter-step coupling element 919, and output coupling element 921.

Figure 27:
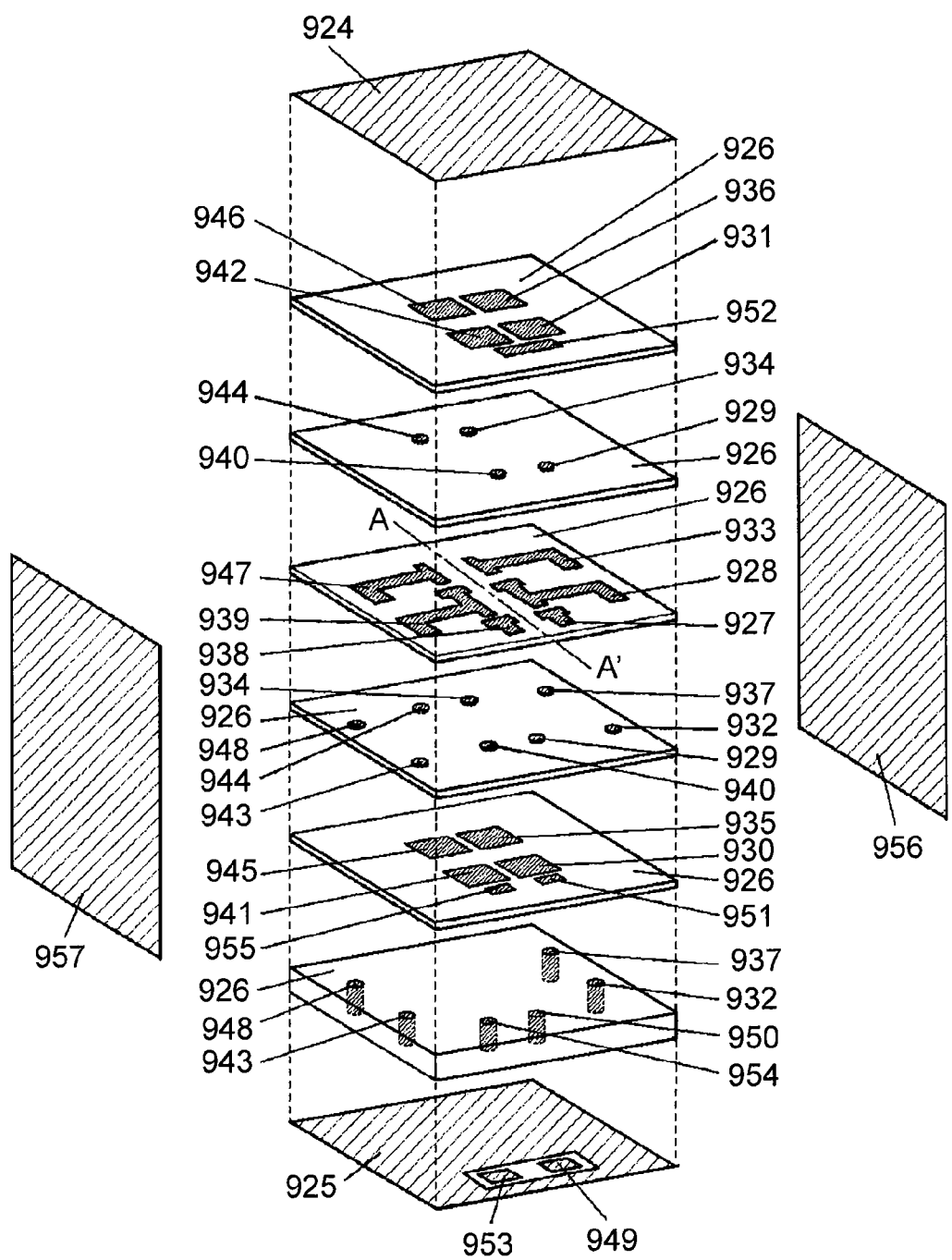
FIG. 27 is an exploded perspective view illustrating a structure of the left-handed filter according to the ninth embodiment of the present invention.

FIG. 27 is an exploded perspective view illustrating a structure of the left-handed filter according to the ninth embodiment of the present invention. In FIG. 27, the left-handed filter has the structure in which the space between grounded conductors 924 and 925 that are disposed opposite each other is filled with dielectric material 926. Conductive pattern 927 corresponds to inductor 911B of FIG. 26. Conductive pattern 927 and conductive pattern 928 are sandwiched between conductive patterns 930 and 931 that are connected through via conductor 929, thereby forming capacitor 912A. Conductive pattern 928 is connected to grounded conductor 925 through via conductor 932, thereby forming inductor 912B. Capacitor 912A includes conductive pattern 928 and grounded conductors 924 and 925. Capacitor 911A, inductor 911B, capacitor 912A, and inductor 912B correspond to unit cell 910A.

Conductive pattern 928 also corresponds to inductor 913B illustrated in FIG. 26. Conductive pattern 928 and conductive pattern 933 are configured to be sandwiched between conductive patterns 935 and 936 that are connected through via conductor 934, thereby forming capacitor 913A. Conductive pattern 933 is connected to grounded conductor 925 through via conductor 937, thereby forming inductor 914B. Capacitor 914A illustrated in FIG. 26 includes conductive pattern 933 and grounded conductors 924 and 925. Capacitor 913A, inductor 913B, capacitor 914A, and inductor 914B correspond to unit cell 910B. Unit cells 910A and 910B constitute first CRLH resonator 922.

First CRLH resonator 922 and second CRLH resonator 923 illustrated in FIG. 26 are formed in a mirror-surface symmetrical manner in relation to line segment A-A' of FIG. 27, and conductive pattern 938 corresponds to inductor 9110B. Conductive pattern 938 and conductive pattern 939 are configured to be sandwiched between conductive patterns 941 and 942 that are connected through via conductor 940, thereby forming capacitor 9110A. Conductive pattern 939 is connected to grounded conductor 925 through via conductor 943, thereby forming inductor 9120B. Capacitor 9120A includes conductive pattern 939 and grounded conductors 924 and 925. Capacitor 9110A, inductor 9110B, capacitor 9120A, and inductor 9120B correspond to unit cell 9100A.

Conductive pattern 939 also corresponds to inductor 9130B illustrated in FIG. 26. Conductive pattern 939 and conductive pattern 947 are configured to be sandwiched between conductive patterns 945 and 946 that are connected through via conductor 944, thereby forming capacitor 9130A. Conductive pattern 947 is connected to grounded conductor 925 through via conductor 948, thereby forming inductor 9140B. Capacitor 9140A includes conductive pattern 947 and grounded conductors 924 and 925. Capacitor 9130A, inductor 9130B, capacitor 9140A, and inductor 9140B correspond to unit cell 9100B. Unit cells 9100A and 9100B constitute second CRLH resonator 923.

Input coupling element 920 illustrated in FIG. 26 includes conductive pattern 951 connected through via conductor 950 by input terminal 949 and conductive pattern 927 corresponding to inductor 911B. Inter-step coupling element 919 includes conductive pattern 927 constituting a part of unit cell 910A, conductive pattern 938 constituting a part of unit cell 9100A, and conductive pattern 952. Output coupling element 921 includes conductive pattern 955 connected through via conductor 954 by output terminal 953 and conductive pattern 938 corresponding to inductor 9110B.

In the ninth embodiment, the electromagnetic field coupling can be generated between first CRLH resonator 922 and second CRLH resonator 923 by incorporating first CRLH resonator 922 and second CRLH resonator 923 in dielectric material 926. At this point, as illustrated in FIG. 9, the attenuation pole can newly be provided by the electromagnetic field coupling and the resonance of inter-step coupling element 919, and the attenuation characteristic can be improved. In such cases, preferably grounded conductors 924 and 925 are connected by lateral electrodes 956 and 957.

Herein, input coupling element 920 and output coupling element 921 are expressed by the capacitors as illustrated in FIG. 26. However, when each of the capacitors has the capacitance of 10 pF or more, input coupling element 920 and output coupling element 921 may be removed to directly connect connection points to input port and output port.

Tenth Embodiment

Figure 28:
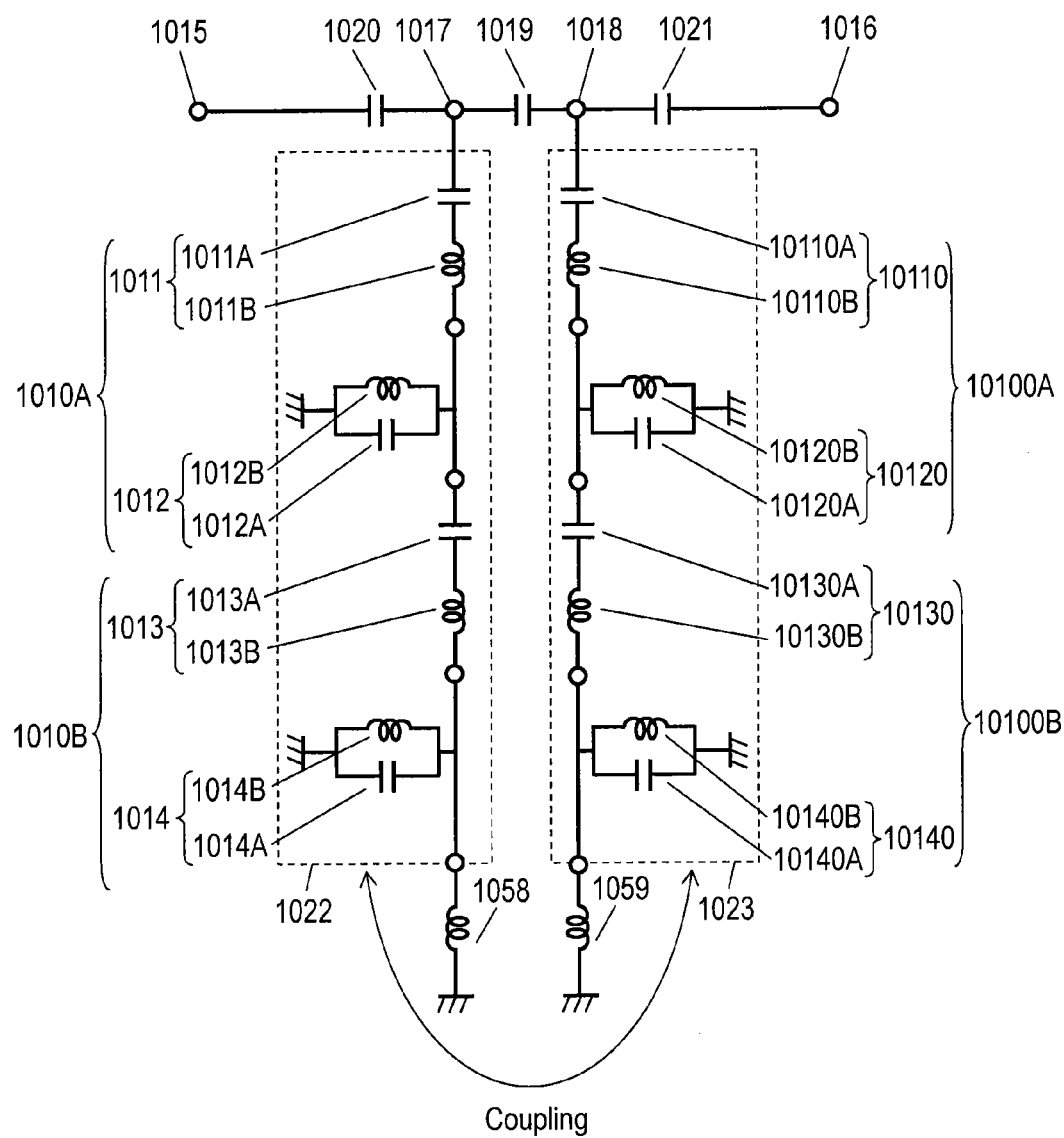
FIG. 28 is an equivalent circuit diagram illustrating a left-handed filter according to a tenth embodiment of the present invention.

FIG. 28 is an equivalent circuit diagram illustrating a left-handed filter according to a tenth embodiment of the present invention. In FIG. 28, the left-handed filter of the tenth embodiment differs from that of the ninth embodiment in that one end of third parallel body 1014 is connected to the ground through inductor 1058 serving as a first parasitic component and one end of fourth parallel body 10140 is connected to the ground through inductor 1059 serving as a second parasitic component. In the tenth embodiment, the configuration similar to that of the ninth embodiment is designated by the same numeral, and the description thereof is omitted.

Figure 29:
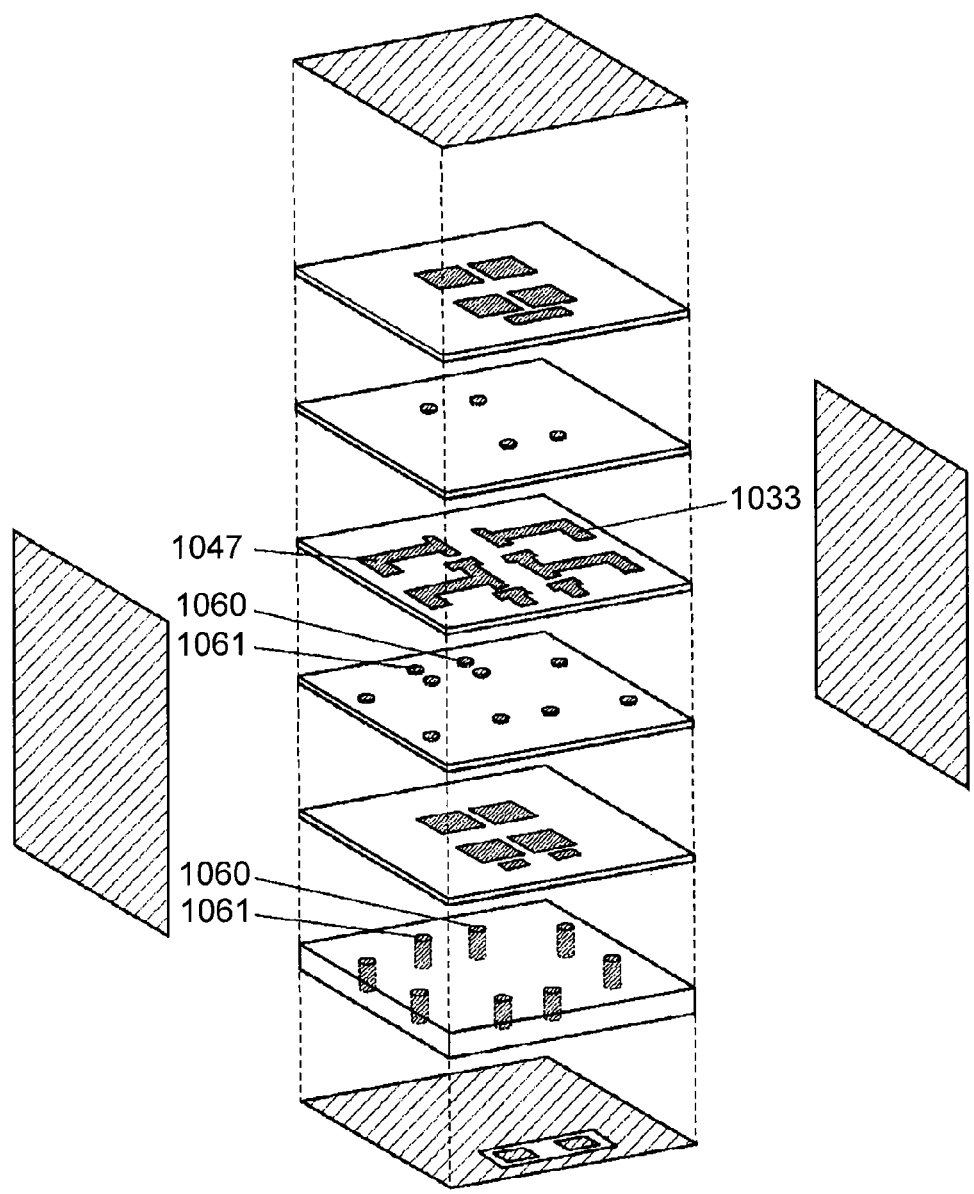
FIG. 29 is an exploded perspective view illustrating a structure of the left-handed filter according to the tenth embodiment of the present invention.

FIG. 29 is an exploded perspective view illustrating a structure of the left-handed filter according to the tenth embodiment of the present invention. In FIG. 29, via conductor 1060 is provided between conductive pattern 1033 and grounded conductor 1025, and via conductor 1061 is provided between conductive pattern 1047 and grounded conductor 1025. In the configuration above, the 0-order resonance in which the unnecessary passband is formed can be shifted onto the high-frequency side.

The left-handed filter of the present invention has the effect that the attenuation characteristic can be improved, and the left-handed filter can usefully be applied to various electronic instruments such as a cellular telephone.

Eleventh Embodiment

Figure 30:
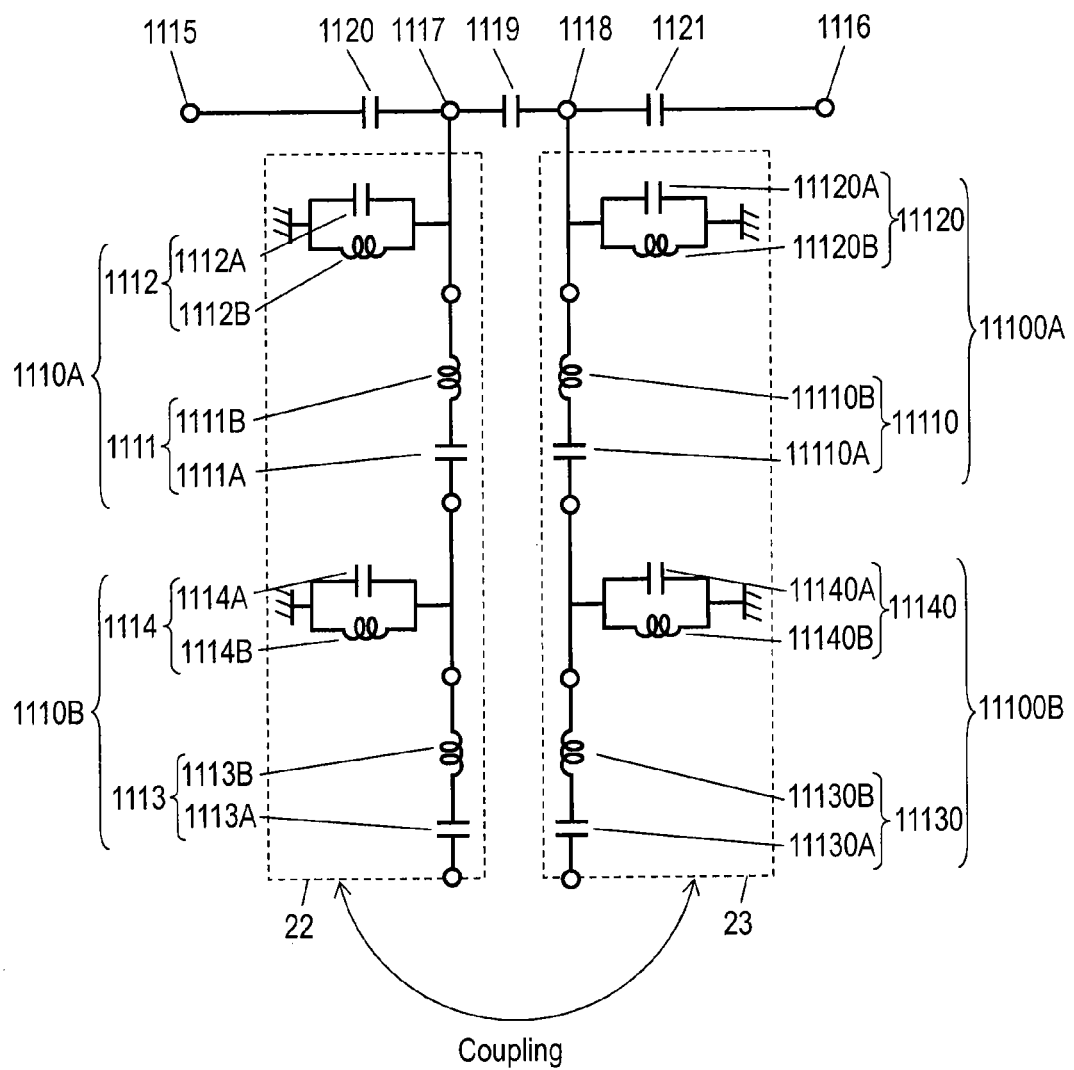
FIG. 30 is an equivalent circuit diagram illustrating a left-handed filter according to an eleventh embodiment of the present invention.

FIG. 30 is an equivalent circuit diagram illustrating a left-handed filter according to an eleventh embodiment of the present invention. In FIG. 30, the left-handed filter of the eleventh embodiment is a filter including input port 1115 and output port 1116, inter-step coupling element 1119 is interposed between input port 1115 and output port 1116, and one end of first parallel body 1112 including capacitor 1112A and inductor 1112B is electrically connected at connection point 1117 between input port 1115 and inter-step coupling element 1119. One end of second parallel body 11120 including capacitor 11120A and inductor 11120B is electrically connected at connection point 1118 between output port 1116 and inter-step coupling element 1119. One end of first series body 1111 including capacitor 1111A and inductor 1111B is electrically connected to one end of first parallel body 1112. One end of second series body 11110 including capacitor 11110A and inductor 11110B is electrically connected to one end of second parallel body 11120. The other end of first parallel body 1112 is electrically connected to the ground. The other end of second parallel body 11120 is electrically connected to the ground. First series body 1111 and first parallel body 1112 constitute first cell 1110A, and second series body 11110 and second parallel body 11120 constitute second cell 11100A. The other end of first series body 1111 is connected to one end of third parallel body 1114 including capacitor 1114A and inductor 1114B. The other end of second series body 11110 is connected to one end of fourth parallel body 11140 including capacitor 11140A and inductor 11140B. One end of third series body 1113 is electrically connected to one end of third parallel body 1114 including capacitor 1113A and inductor 1113B. One end of fourth series body 11130 including capacitor 11130A and inductor 11130B is electrically connected to one end of fourth parallel body 11140. The other end of third parallel body 1114 is electrically connected to the ground. The other end of fourth parallel body 11140 is electrically connected to the ground. Third series body 1113 and third parallel body 1114 constitute third cell 1110B, and fourth series body 11130 and fourth parallel body 11140 constitute fourth cell 11100B.

Input coupling element 1120 is interposed between inter-step coupling element 1119 and input port 1115, and output coupling element 1121 is interposed between inter-step coupling element 1119 and output port 1116. The electromagnetic field coupling is generated between first CRLH resonator 1122 including unit cells 1110A and 1110B and second CRLH resonator 1123 including unit cells 11100A and 11100B.

In the configuration above, the parallel resonant circuit is equivalently formed by first CRLH resonator 1122 and second CRLH resonator 1123 between which the electromagnetic field coupling is generated and inter-step coupling element 1119. Therefore, the impedance of the filter becomes zero when viewed from the input side or output side, and the frequency at which the signal is passed to the ground exists, so that the number of poles can be increased by one in the passband. As a result, the attenuation characteristic can be improved.

The −1-order resonance coupling between two CRLH resonators 1122 and 1123 can easily be controlled by adjusting capacitance values of input coupling element 1120, inter-step coupling element 1119, and output coupling element 1121. Therefore, the left-handed filter in which the passband is formed by the −1-order resonance can be configured. Since the attenuation pole generated by the electromagnetic field coupling between CRLH resonators 1122 and 1123 and inter-step coupling element 1119 can be disposed and controlled, the left-handed filter having more excellent filter characteristic than that of the general left-handed filter can be provided.

In the left-handed filter according to the eleventh embodiment of the present invention, since first parallel body 1112, second parallel body 11120, third parallel body 1114, and fourth parallel body 11140 include inductors 1112B, 11120B, 1114B, and 11140B that are directly connected to the ground, the large high-frequency current is passed through inductors 1112B, 11120B, 1114B, and 11140B compared with the right-handed filter. As a result, compared with the right-handed filter, the intensity of the electromagnetic field coupling between CRLH resonators 1122 and 1123 can be enhanced to increase the number of attenuation poles in the passband, and the frequency can easily be controlled. Not the capacitor, but the inductor may be used as input coupling element 1120, inter-step coupling element 1119, and output coupling element 1121.

Figure 31:
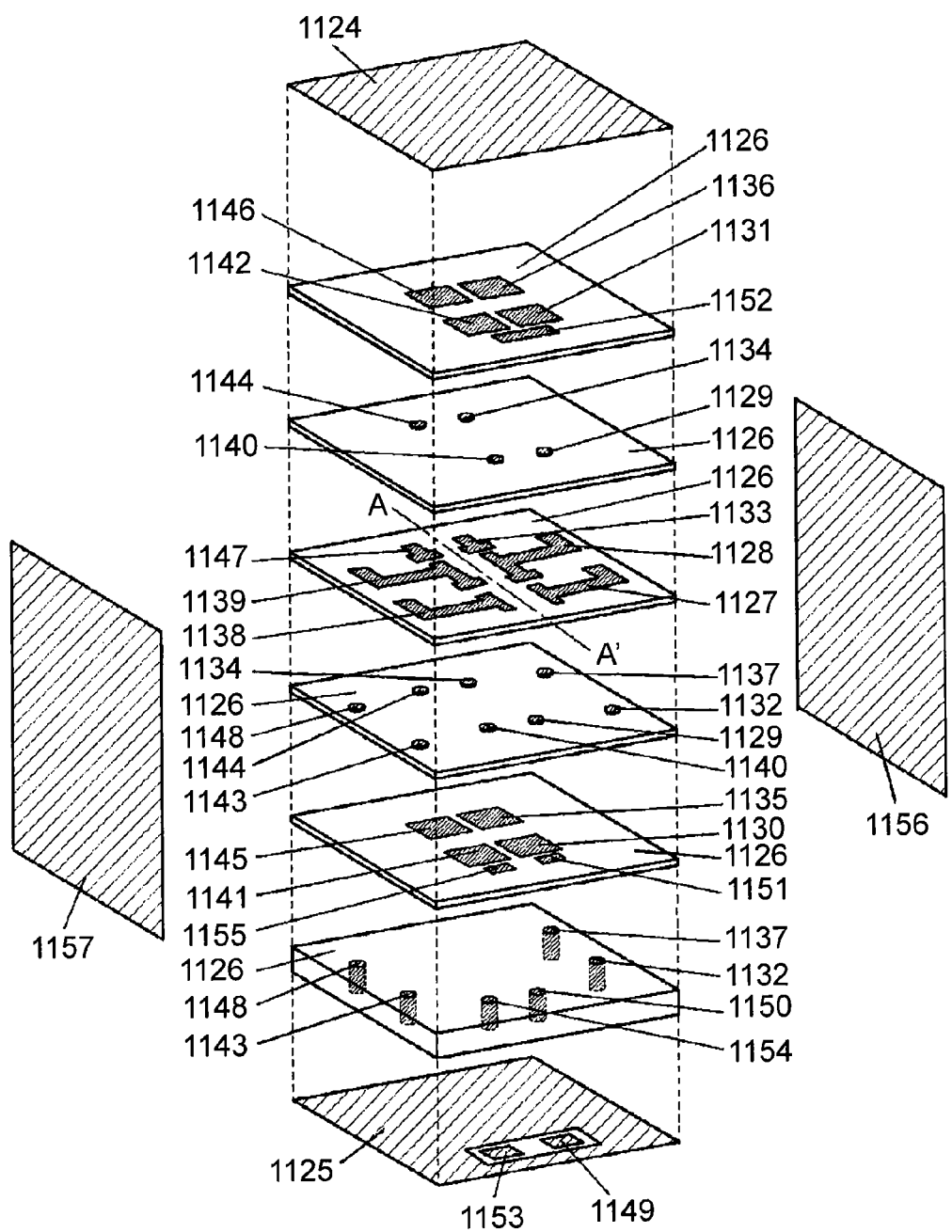
FIG. 31 is an exploded perspective view illustrating a structure of the left-handed filter according to the eleventh embodiment of the present invention.

FIG. 31 is an exploded perspective view illustrating a structure of the left-handed filter according to the eleventh embodiment of the present invention. In FIG. 31, the left-handed filter has the structure in which the space between grounded conductors 1124 and 1125 that are disposed opposite each other is filled with dielectric material 1126. Conductive pattern 1127 is connected to grounded conductor 1125 through via conductor 1132. Conductive pattern 1127 corresponds to inductor 1112B of FIG. 30. In conductive pattern 1127, grounded conductors 1124 and 1125 constitute capacitor 1112A. Conductive pattern 1127 and conductive pattern 1128 are sandwiched between conductive patterns 1130 and 1131 that are connected through via conductor 1129, thereby forming capacitor 1111A. Conductive pattern 1128 also corresponds to inductor 1111B illustrated in FIG. 30. Capacitor 1111A, inductor 1111B, capacitor 1112A, and inductor 1112B correspond to unit cell 1110A.

Conductive pattern 1128 is connected to grounded conductor 1125 through via conductor 1137, thereby forming inductor 1114B illustrated in FIG. 30. In conductive pattern 1128, capacitor 1114A includes conductive pattern 1133 and grounded conductors 1124 and 1125. Conductive pattern 1128 and conductive pattern 1133 are configured to be sandwiched between conductive patterns 1135 and 1136 that are connected through via conductor 1134, thereby forming capacitor 1113A. Conductive pattern 1133 also corresponds to inductor 1113B. Capacitor 1113A, inductor 1113B, capacitor 1114A, and inductor 1114B correspond to unit cell 1110B. Unit cells 1110A and 1110B constitute first CRLH resonator 1122.

First CRLH resonator 1122 and second CRLH resonator 1123 illustrated in FIG. 30 are formed in a mirror-surface symmetrical manner in relation to line segment A-A' of FIG. 31, and conductive pattern 1138 is connected to grounded conductor 1125 through via conductor 1143. Conductive pattern 1138 corresponds to inductor 11120B. In conductive pattern 1138, grounded conductors 1124 and 1125 constitute capacitor 11120A. Conductive pattern 1138 and conductive pattern 1139 are configured to be sandwiched between conductive patterns 1141 and 1142 that are connected through via conductor 1140, thereby forming capacitor 11110A. Conductive pattern 1139 also corresponds to inductor 11110B. Capacitor 11110A, inductor 11110B, capacitor 11120A, and inductor 11120B correspond to unit cell 11100A.

Conductive pattern 1139 is connected to grounded conductor 1125 through via conductor 1148, thereby forming inductor 11140B illustrated in FIG. 30. Capacitor 11140A includes conductive pattern 1139 and grounded conductors 1124 and 1125. Conductive pattern 1139 and conductive pattern 1147 are configured to be sandwiched between conductive patterns 1145 and 1146 that are connected through via conductor 1144, thereby forming capacitor 11130A. Conductive pattern 1147 also corresponds to inductor 11130B. Capacitor 11130A, inductor 11130B, capacitor 11140A, and inductor 11140B correspond to unit cell 11100B. Unit cells 11100A and 11100B constitute second CRLH resonator 1123.

Input coupling element 1120 illustrated in FIG. 30 includes a conductive pattern 1151 that is connected through via conductor 1150 by input terminal 1149 and conductive pattern 1127 corresponding to inductor 1112B. Inter-step coupling element 1119 includes conductive pattern 1127 constituting a part of unit cell 1110A, conductive pattern 1138 constituting a part of unit cell 11100A, and conductive pattern 1152. Output coupling element 1121 illustrated in FIG. 30 includes conductive pattern 1155 that is connected through via conductor 1154 by output terminal 1153 and conductive pattern 1138 corresponding to inductor 11120B.

Figure 32:
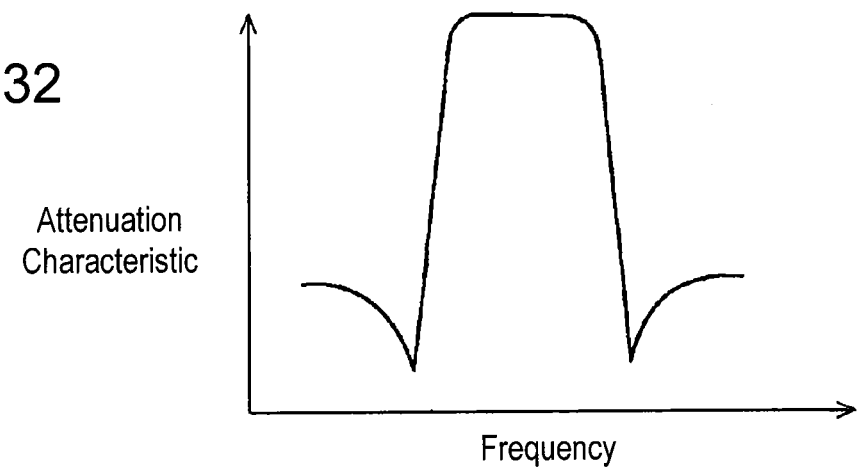
FIG. 32 is a frequency characteristic diagram of the left-handed filter according to an eleventh embodiment of the present invention.

FIG. 32 is a frequency characteristic diagram of the left-handed filter of the eleventh embodiment. In FIG. 32, the electromagnetic field coupling can be generated between first CRLH resonator 1122 and second CRLH resonator 1123 by incorporating first CRLH resonator 1122 and second CRLH resonator 1123 in dielectric material 1126. Therefore, the attenuation pole can newly be provided by the electromagnetic field coupling and the resonance of inter-step coupling element 1119, and the attenuation characteristic can be improved. At this point, preferably grounded conductors 1124 and 1125 are connected by lateral electrodes 1156 and 1157.

Herein, input coupling element 1120 and output coupling element 1121 are expressed by the capacitors as illustrated in FIG. 30. However, when each of the capacitors has the capacitance of 10 pF or more, input coupling element 1120 and output coupling element 1121 may be removed to directly connect connection points to input port and output port.

Twelfth Embodiment

Figure 33:
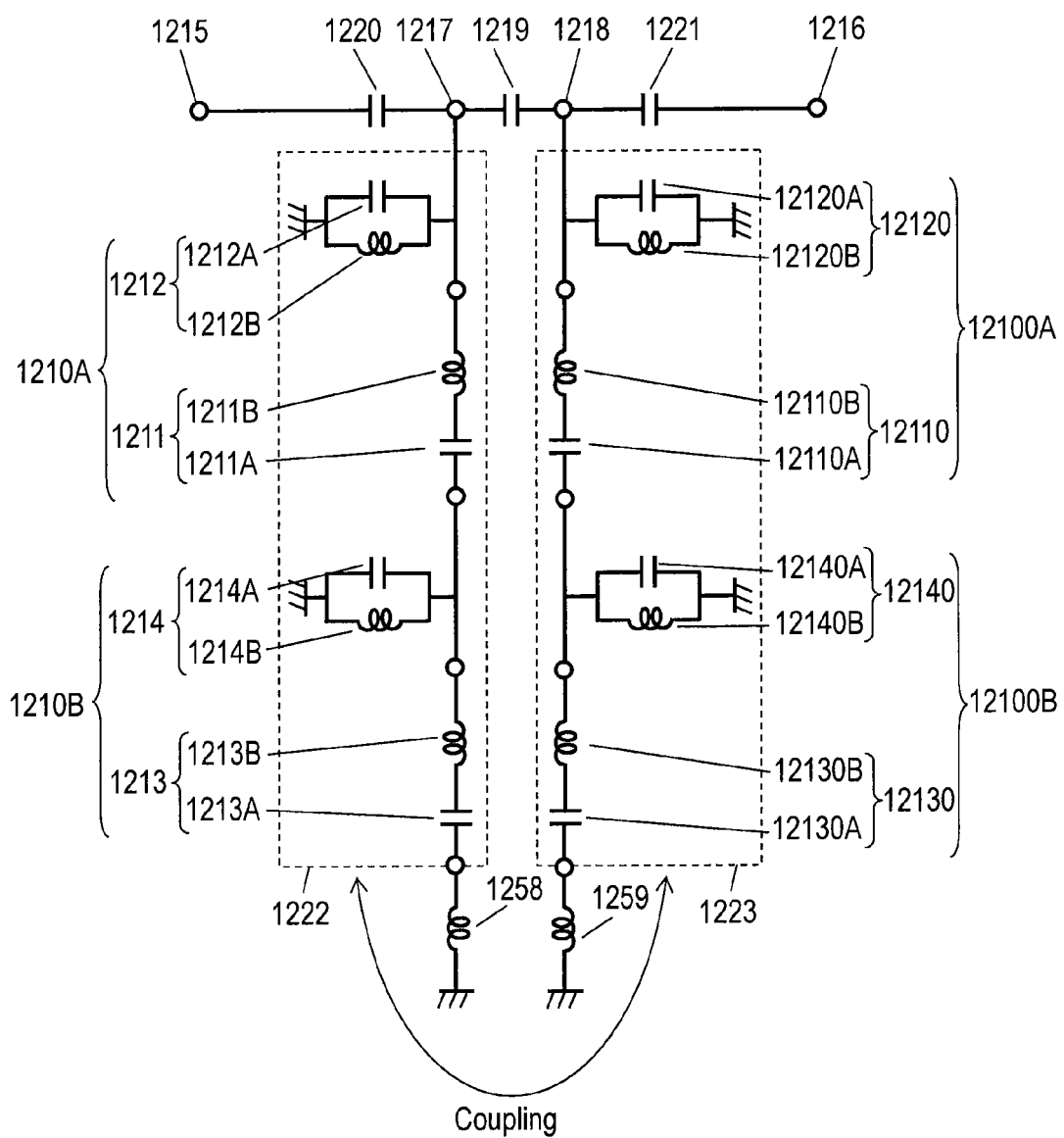
FIG. 33 is an equivalent circuit diagram illustrating a left-handed filter according to a twelfth embodiment of the present invention.

FIG. 33 is an equivalent circuit diagram illustrating a left-handed filter according to a twelfth embodiment of the present invention. With reference to FIG. 33, the left-handed filter of the twelfth embodiment differs from that of the eleventh embodiment in that the other end of third series body 1213 is connected to the ground through inductor 1258 serving as a first parasitic component and the other end of fourth series body 12130 is connected to the ground through inductor 1259 that is of a second parasitic component. In the twelfth embodiment, the configuration similar to that of the eleventh embodiment is designated by the same numeral, and the description thereof is omitted.

Figure 34:
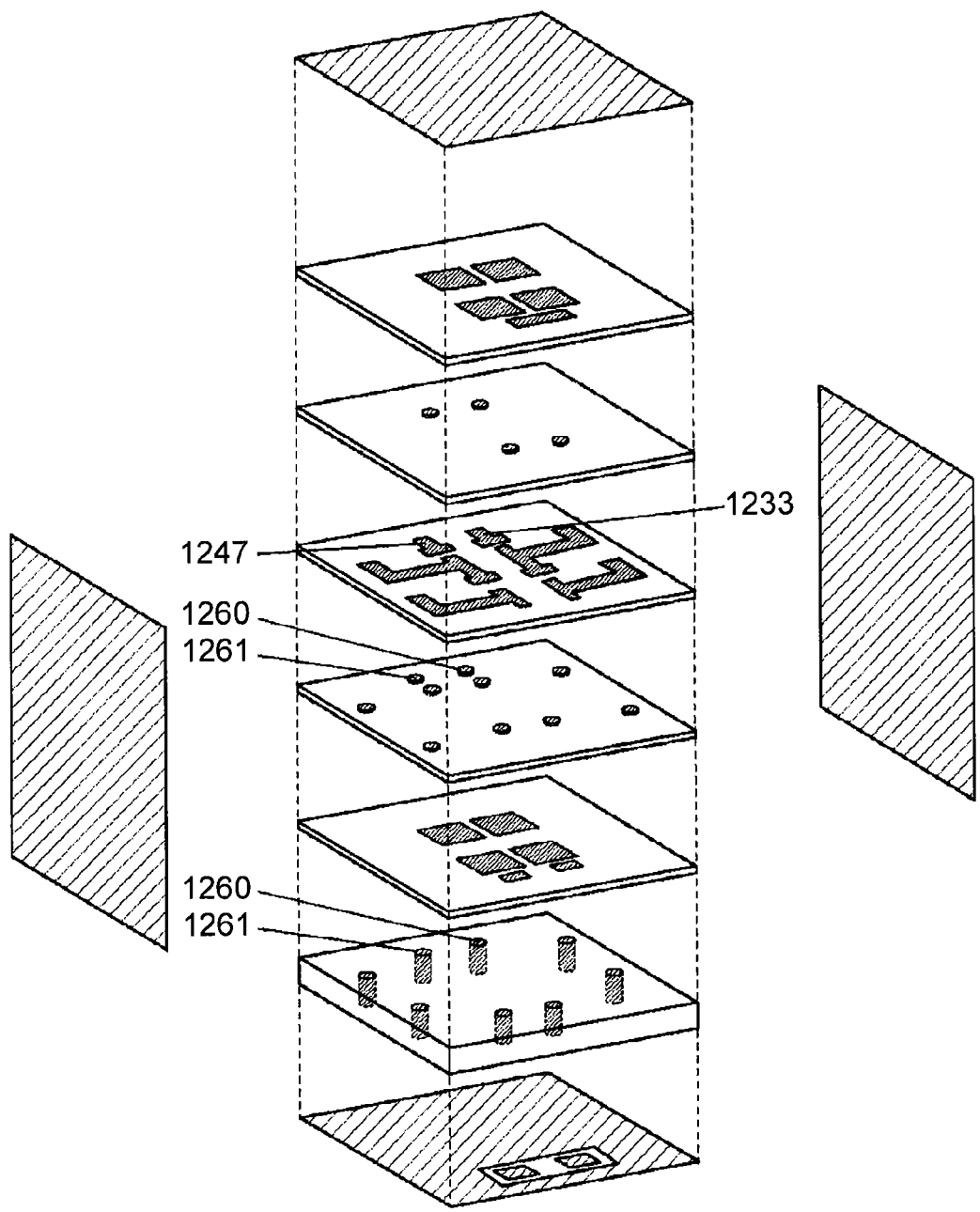
FIG. 34 is an exploded perspective view illustrating a structure of the left-handed filter according to the twelfth embodiment of the present invention.

FIG. 34 is an exploded perspective view illustrating a structure of the left-handed filter according to the twelfth embodiment of the present invention. In FIG. 34, via conductor 1260 is provided between conductive pattern 1233 and grounded conductor 1225, and via conductor 1261 is provided between conductive pattern 1247 and grounded conductor 1225.

In the configuration above, the left-handed filter has the characteristic of the eleventh embodiment, and the 0-order resonance at which the unnecessary passband is formed can be shifted onto the high-frequency side.

Thirteenth Embodiment

Figure 35:
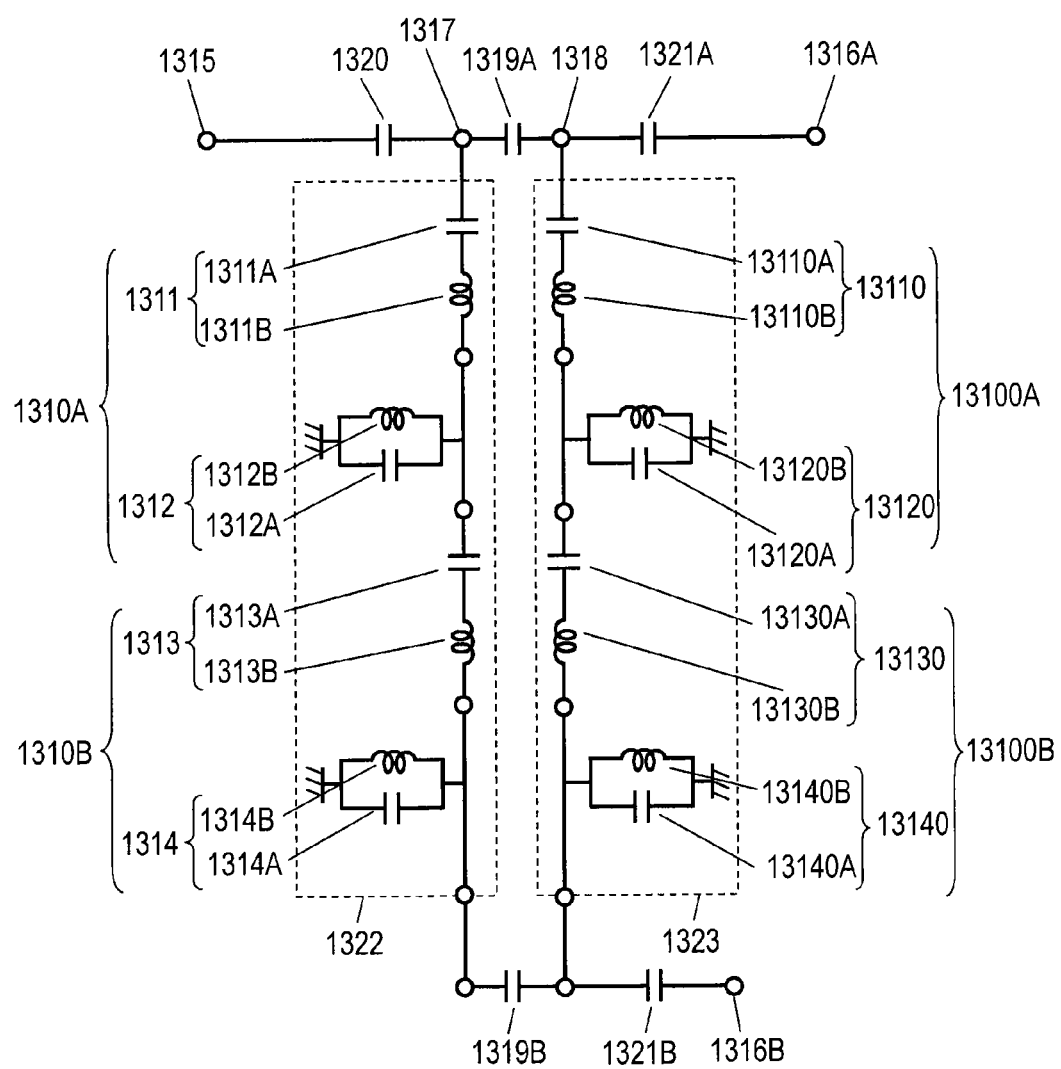
FIG. 35 is an equivalent circuit diagram illustrating a left-handed filter according to a thirteenth embodiment of the present invention.

FIG. 35 is an equivalent circuit diagram illustrating a left-handed filter according to a thirteenth embodiment of the present invention. In FIG. 35, the left-handed filter of the thirteenth embodiment is a filter including input port 1315, first output port 1316A, and second output port 1316B, inter-step coupling element 1319A is interposed between input port 1315 and first output port 1316A, and one end of first series body 1311 including capacitor 1311A and inductor 1311B is electrically connected at connection point 1317 between input port 1315 and inter-step coupling element 1319A. One end of second series body 13110 including capacitor 13110A and inductor 13110B is electrically connected at connection point 1318 between first output port 1316A and inter-step coupling element 1319A. One end of first parallel body 1312 including capacitor 1312A and inductor 1312B is electrically connected to one end of first series body 1311. One end of second parallel body 13120 including capacitor 13120A and inductor 13120B is electrically connected to one end of second series body 13110. The other end of first parallel body 1312 is electrically connected to the ground. The other end of second parallel body 13120 is electrically connected to the ground. First series body 1311 and first parallel body 1312 constitute first cell 1310A, and second series body 13110 and second parallel body 13120 constitute second cell 13100A.

The other end of first series body 1311 is connected to one end of third series body 1313 including capacitor 1313A and inductor 1313B. The other end of second series body 13110 is connected to one end of fourth series body 13130 including capacitor 13130A and inductor 13130B. One end of third parallel body 1314 including capacitor 1314A and inductor 1314B is electrically connected to one end of third series body 1313. One end of fourth parallel body 13140 including capacitor 13140A and inductor 13140B is electrically connected to one end of fourth series body 13130. The other end of third parallel body 1314 is electrically connected to the ground. The other end of fourth parallel body 13140 is electrically connected to the ground. Third series body 1313 and third parallel body 1314 constitute third cell 1310B, and fourth series body 13130 and fourth parallel body 13140 constitute fourth cell 13100B.

Input coupling element 1320 is interposed between inter-step coupling element 1319A and input port 1315. Output coupling element 1321A is interposed between inter-step coupling element 1319A and first output port 1316A. Inter-step coupling element 1319B is interposed between the other end of third cell 1310B and the other end of fourth cell 13100B. Output coupling element 1321B is interposed between the other end of fourth cell 13100B and second output port 1316B.

In the configuration above, because the number of unit cells constituting the CRLH resonator becomes two, the 0-order left-handed resonance and the −1-order left-handed resonance are generated. As a result, the pieces of 0-order resonance in which the vibration is generated at the same potential cancel each other when the signal is extracted by the differential, and only the −1-order resonance in which the vibration is generated such that the potential amplitude becomes the reverse phase at both ends of the resonator can be extracted.

Additionally, the electromagnetic field coupling is generated between first CRLH resonator 1322 including unit cells 1310A and 1310B and second CRLH resonator 1323 including unit cells 13100A and 13100B. Since the parallel resonant circuit is equivalently formed by first CRLH resonator 1322 and second CRLH resonator 1323 between which the electromagnetic field coupling is generated and inter-step coupling elements 1319A and 1319B, the impedance of the filter becomes zero when viewed from the input side or output side. The frequency at which the signal is passed to the ground exists, so that the number of poles can be increased by one in the passband. As a result, the attenuation characteristic can be improved.

The −1-order resonance coupling between two CRLH resonators 1322 and 1323 can easily be controlled by adjusting capacitance values of input coupling element 1320, inter-step coupling elements 1319A and 1319B, and output coupling elements 1321A and 1321B. Therefore, the left-handed filter in which the passband is formed by the −1-order resonance can be configured. Since the attenuation pole generated by the electromagnetic field coupling between CRLH resonators 1322 and 1323 and inter-step coupling element 1315 can be disposed and controlled, the left-handed filter having more excellent filter characteristic than that of the general left-handed filter can be provided.

In the left-handed filter according to the thirteenth embodiment of the present invention, because first parallel body 1312, second parallel body 13120, third parallel body 1314, and fourth parallel body 13140 include inductors 1312B, 13120B, 1314B, and 13140B that are directly connected to the ground, a large high-frequency current is passed through inductors 1312B, 13120B, 1314B, and 13140B compared with the right-handed filter. As a result, compared with the right-handed filter, the intensity of the electromagnetic field coupling between CRLH resonators 1322 and 1323 can be enhanced to increase the number of attenuation poles in the passband, and the frequency can easily be controlled. Not the capacitor, but the inductor may be used as input coupling element 1320, inter-step coupling elements 1319A and 1319B, and output coupling elements 1321A and 1321B.

Figure 36:
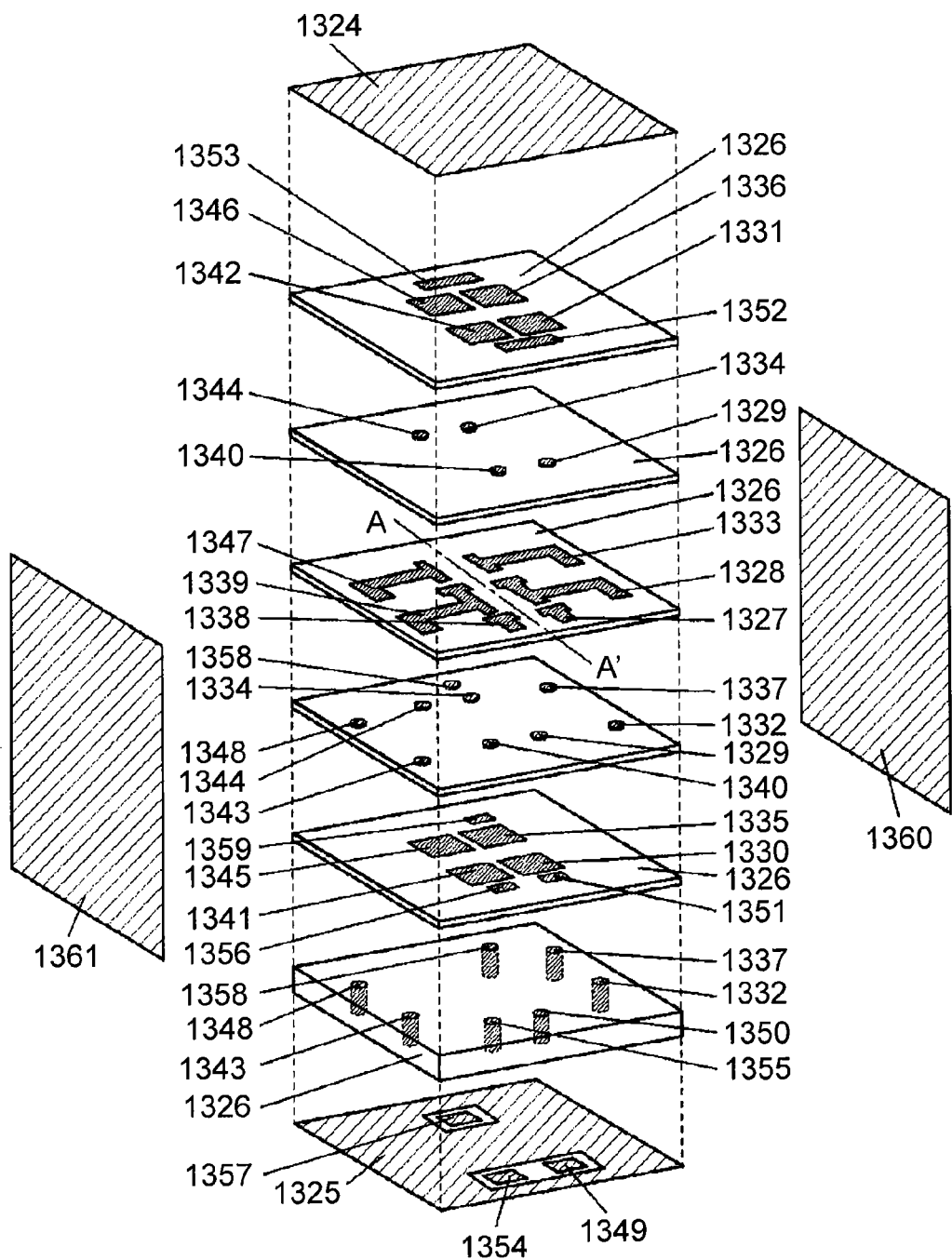
FIG. 36 is an exploded perspective view illustrating a structure of the left-handed filter according to the thirteenth embodiment of the present invention.

FIG. 36 is an exploded perspective view illustrating a structure of the left-handed filter according to the thirteenth embodiment of the present invention. In FIG. 36, the left-handed filter has the structure in which the space between grounded conductors 1324 and 1325 that are disposed opposite each other is filled with dielectric material 1326. Conductive pattern 1327 corresponds to inductor 1311B of FIG. 35. Conductive pattern 1327 and conductive pattern 1328 are sandwiched between conductive patterns 1330 and 1331 that are connected through via conductor 1329, thereby forming capacitor 1311A. Conductive pattern 1328 is connected to grounded conductor 1325 through via conductor 1332. Conductive pattern 1328 corresponds to inductor 1312B. Capacitor 1312A includes conductive pattern 1328 and grounded conductors 1324 and 1325. Capacitor 1311A, inductor 1311B, capacitor 1312A, and inductor 1312B correspond to unit cell 1310A.

Conductive pattern 1328 also corresponds to inductor 1313B illustrated in FIG. 35. Conductive pattern 1328 and conductive pattern 1333 are configured to be sandwiched between conductive patterns 1335 and 1336 that are connected through via conductor 1334, thereby forming capacitor 1313A. Conductive pattern 1333 is connected to grounded conductor 1325 through via conductor 1337, thereby forming inductor 1314B. Capacitor 1314A includes conductive pattern 1333 and grounded conductors 1324 and 1325. Capacitor 1313A, inductor 1313B, capacitor 1314A, and inductor 1314B correspond to unit cell 1310B. Unit cells 1310A and 1310B constitute first CRLH resonator 1322.

First CRLH resonator 1322 and second CRLH resonator 1323 illustrated in FIG. 35 are formed in a mirror-surface symmetrical manner in relation to line segment A-A' of FIG. 36, and conductive pattern 1338 corresponds to inductor 13110B. Conductive pattern 1338 and conductive pattern 1339 are configured to be sandwiched between conductive patterns 1341 and 1342 that are connected through via conductor 1340, thereby forming capacitor 13110A. Conductive pattern 1339 is connected to grounded conductor 1325 through via conductor 134. Conductive pattern 1339 corresponds to inductor 13120B. Capacitor 13120A includes conductive pattern 1339 and grounded conductors 1324 and 1325. Capacitor 13110A, inductor 13110B, capacitor 13120A, and inductor 13120B correspond to unit cell 13100A.

Conductive pattern 1339 also corresponds to inductor 13130B illustrated in FIG. 35. Conductive pattern 1339 and conductive pattern 1347 are configured to be sandwiched between conductive patterns 1345 and 1346 that are connected through via conductor 1344, thereby forming capacitor 13130A. Conductive pattern 1347 is connected to grounded conductor 1325 through via conductor 1348, thereby forming inductor 13140B. Further, capacitor 13140A includes conductive pattern 1347 and grounded conductors 1324 and 1325. Capacitor 13130A, inductor 13130B, capacitor 13140A, and inductor 13140B correspond to unit cell 13100B. Unit cells 13100A and 13100B constitute second CRLH resonator 1323.

Input coupling element 1320 illustrated in FIG. 35 includes conductive pattern 1356 that is connected through via conductor 1355 by input terminal 1354 and conductive pattern 1338 corresponding to inductor 13120B. Inter-step coupling element 1319A includes conductive pattern 1327 constituting a part of unit cell 1310A, conductive pattern 1338 constituting a part of unit cell 13100A, and conductive pattern 1352. Inter-step coupling element 1319B includes conductive pattern 1333 corresponding to inductor 1314B, conductive pattern 1347 corresponding to inductor 13140B, and conductive pattern 1353. Output coupling element 1321A includes conductive pattern 1351 that is connected through via conductor 1350 by first output terminal 1349 and conductive pattern 1327 corresponding to inductor 1312B. Output coupling element 1321B includes conductive pattern 1359 that is connected through via conductor 1358 by second output terminal 1357 and conductive pattern 1347 corresponding to inductor 13140B.

Figure 37:
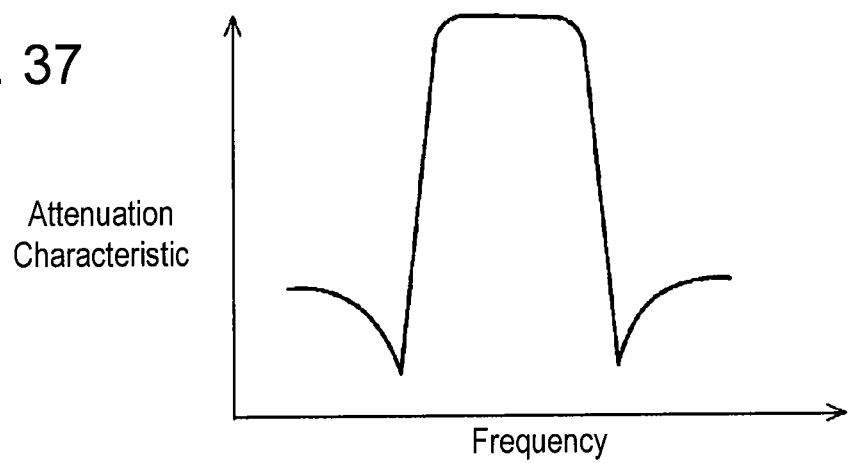
FIG. 37 is a frequency characteristic diagram of the left-handed filter according to the thirteenth embodiment of the present invention.

FIG. 37 is a frequency characteristic diagram of the left-handed filter according to the thirteenth embodiment of the present invention. In FIG. 37, the electromagnetic field coupling is generated between first CRLH resonator 1322 and second CRLH resonator 1323 by incorporating first CRLH resonator 1322 and second CRLH resonator 1323 in dielectric material 1326. The attenuation pole can newly be provided by the electromagnetic field coupling and the resonance of inter-step coupling element 1319, and the attenuation characteristic can be improved. At this point, preferably grounded conductors 1324 and 1325 are connected by lateral electrodes 1360 and 1361.

Herein, input coupling element 1320 and output coupling elements 1321A and 1321B are expressed by the capacitors as illustrated in FIG. 35. However, when each of the capacitors has the capacitance of 10 pF or more, input coupling element 1320 and output coupling elements 1321A and 1321B may be removed to directly connect the connection points to the input port and the output port.

The left-handed filter of the present invention has the effect that the attenuation characteristic can be improved, and the left-handed filter can usefully be applied to various electronic instruments such as a cellular telephone.

Fourteenth Embodiment

Figure 38:
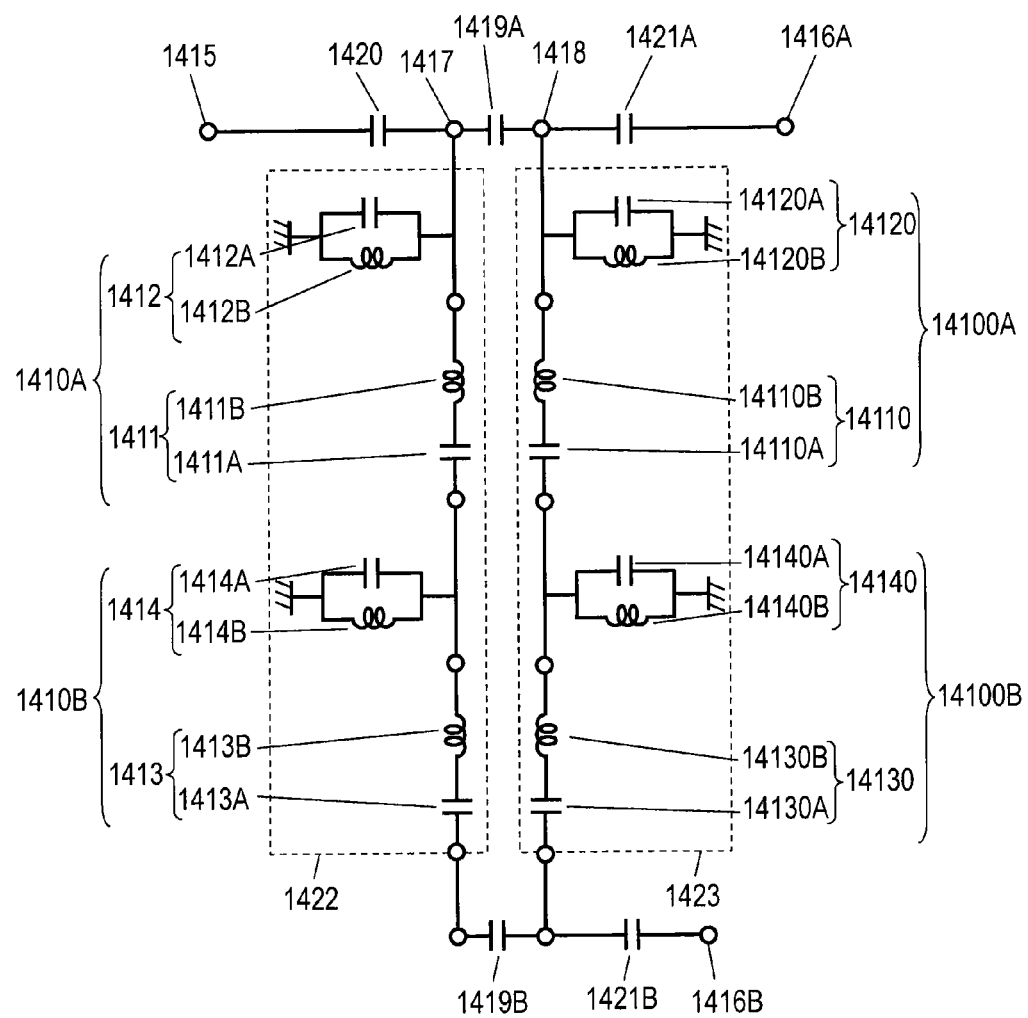
FIG. 38 is an equivalent circuit diagram illustrating a left-handed filter according to a fourteenth embodiment of the present invention.

FIG. 38 is an equivalent circuit diagram illustrating a left-handed filter according to a fourteenth embodiment of the present invention. In FIG. 38, the left-handed filter of the fourteenth embodiment is a filter including input port 1415, first output port 1416A, and second output port 1416B, inter-step coupling element 1419A is interposed between input port 1415 and first output port 1416A, and one end of first series body 1411 including capacitor 1411A and inductor 1411B is electrically connected at connection point 1417 between input port 1415 and inter-step coupling element 1419A. One end of second series body 14110 including capacitor 14110A and inductor 14110B is electrically connected at connection point 1418 between first output port 1416A and inter-step coupling element 1419A. One end of first parallel body 1412 including capacitor 1412A and inductor 1412B is electrically connected to one end of first series body 1411. One end of second parallel body 14120 including capacitor 14120A and inductor 14120B is electrically connected to one end of second series body 14110. The other end of first parallel body 1412 is electrically connected to the ground. The other end of second parallel body 14120 is electrically connected to the ground. First series body 1411 and first parallel body 1412 constitute first cell 1410A, and second series body 14110 and second parallel body 14120 constitute second cell 14100A.

The other end of first series body 1411 is connected to one end of third series body 1413 including capacitor 1413A and inductor 1413B. The other end of second series body 14110 is connected to one end of fourth series body 14130 including capacitor 14130A and inductor 14130B. One end of third parallel body 1414 including capacitor 1414A and inductor 1414B is electrically connected to one end of third series body 1413. One end of fourth parallel body 14140 including capacitor 14140A and inductor 14140B is electrically connected to one end of fourth series body 14130. The other end of third parallel body 1414 is electrically connected to the ground. The other end of fourth parallel body 14140 is electrically connected to the ground. Third series body 1413 and third parallel body 1414 constitute third cell 1410B, and fourth series body 14130 and fourth parallel body 14140 constitute fourth cell 14100B.

Input coupling element 1420 is interposed between inter-step coupling element 1419A and input port 1415. Output coupling element 1421A is interposed between inter-step coupling element 1419A and first output port 1416A. Inter-step coupling element 1419B is interposed between the other end of third cell 1410B and the other end of fourth cell 14100B. Output coupling element 1421B is interposed between the other end of fourth cell 14100B and second output port 1416B.

In the configuration above, because the number of unit cells constituting the CRLH resonator becomes two, the 0-order left-handed resonance and the −1-order left-handed resonance are generated. As a result, the pieces of 0-order resonance in which the vibration is generated at the same potential cancel each other when the signal is extracted by the differential, and only the −1-order frequency in which the vibration is generated such that the potential amplitude becomes the reverse phase at both ends of the resonator can be extracted.

Additionally, the electromagnetic field coupling is generated between first CRLH resonator 1422 including unit cells 1410A and 1410B and second CRLH resonator 1423 including unit cells 14100A and 14100B. Since the parallel resonant circuit is equivalently formed by first CRLH resonator 1422 and second CRLH resonator 1423 between which the electromagnetic field coupling is generated and inter-step coupling elements 1419A and 1419B, the impedance of the filter becomes zero when viewed from the input side or output side. The frequency at which the signal is passed to the ground exists, so that the number of poles can be increased by one in the passband. As a result, the attenuation characteristic can be improved.

The −1-order resonance coupling between two CRLH resonators 1422 and 1423 can easily be controlled by adjusting capacitance values of input coupling element 1420, inter-step coupling elements 1419A and 1419B, and output coupling elements 1421A and 1421B. Therefore, the left-handed filter in which the passband is formed by the −1-order resonance can be configured. Since the attenuation pole generated by the electromagnetic field coupling between CRLH resonators 1422 and 1423 and inter-step coupling elements 1419A and 1419B can be disposed and controlled, the left-handed filter having more excellent filter characteristic than that of the general left-handed filter can be provided.

In the left-handed filter according to the fourteenth embodiment of the present invention, because first parallel body 1412, second parallel body 14120, third parallel body 1414, and fourth parallel body 14140 include inductors 1412B, 14120B, 1414B, and 14140B that are directly connected to the ground, the large high-frequency current is passed through inductors 1412B, 14120B, 1414B, and 14140B compared with the right-handed filter. As a result, compared with the right-handed filter, the intensity of the electromagnetic field coupling between CRLH resonators 1422 and 1423 can be enhanced to increase the number of attenuation poles in the passband, and the frequency can easily be controlled. Not the capacitor, but the inductor may be used as input coupling element 1420, inter-step coupling elements 1419A and 1419B, and output coupling elements 1421A and 1421B.

Figure 39:
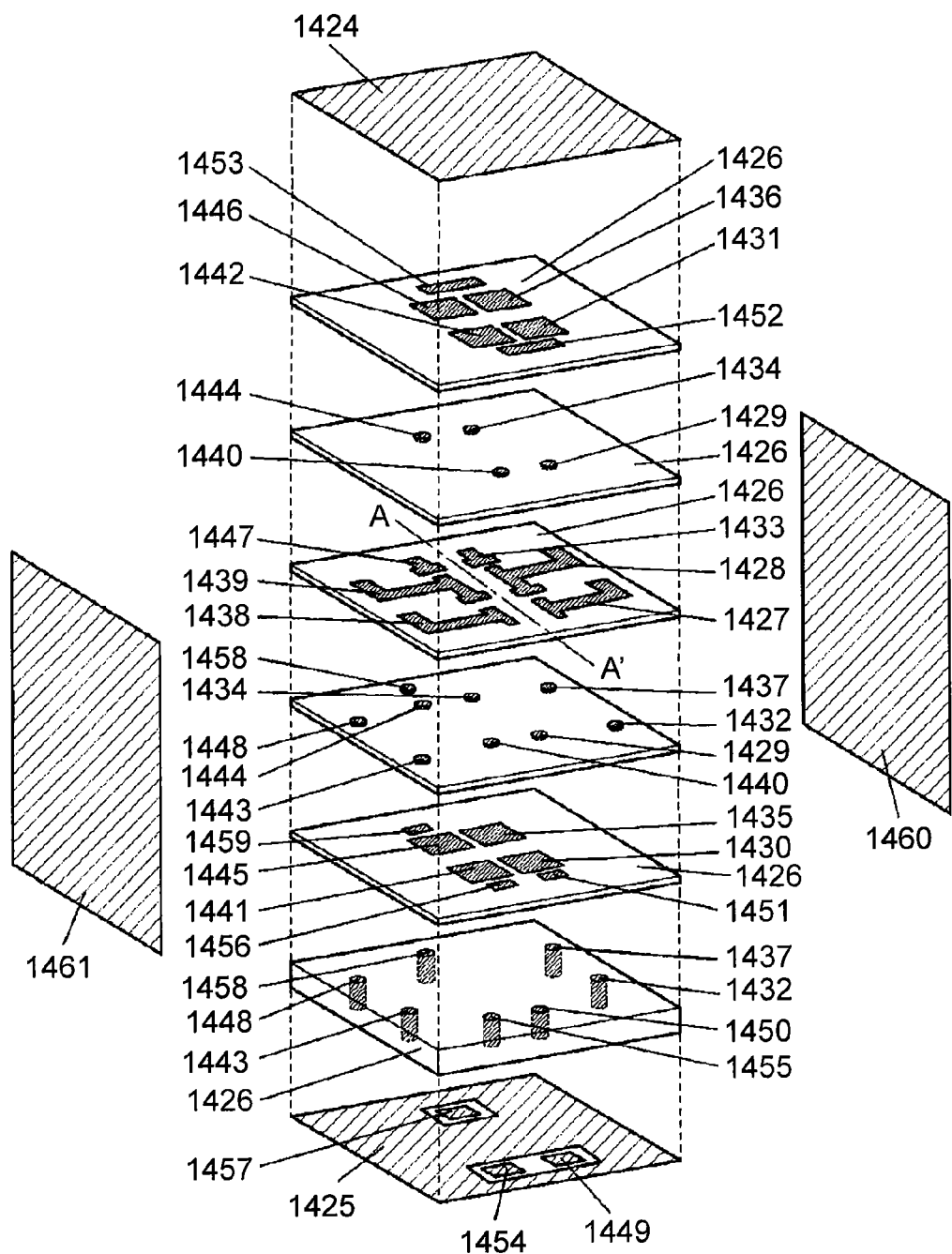
FIG. 39 is an exploded perspective view illustrating a structure of the left-handed filter according to the fourteenth embodiment of the present invention.

FIG. 39 is an exploded perspective view illustrating a structure of the left-handed filter according to the fourteenth embodiment of the present invention. In FIG. 39, the left-handed filter has the structure in which the space between grounded conductors 1424 and 1425 that are disposed opposite each other is filled with dielectric material 1426, and conductive pattern 1427 is connected to grounded conductor 1425 through via conductor 1432. Further, conductive pattern 1427 corresponds to inductor 1412B of FIG. 38. In conductive pattern 1427, grounded conductor 1424 and 1425 constitute capacitor 1412A. Conductive pattern 1427 and conductive pattern 1428 are sandwiched between conductive patterns 1430 and 1431 that are connected through via conductor 1429, thereby forming capacitor 1411A. Conductive pattern 1428 also corresponds to inductor 1411B. Capacitor 1411A, inductor 1411B, capacitor 1412A, and inductor 1412B correspond to unit cell 1410A.

Conductive pattern 1428 is connected to grounded conductor 1425 through via conductor 1437, thereby forming inductor 1414B illustrated in FIG. 38. In conductive pattern 1428, conductive pattern 1433 and grounded conductors 1424 and 1425 constitute capacitor 1414A. Conductive pattern 1428 and conductive pattern 1433 are sandwiched between conductive patterns 1435 and 1436 that are connected through via conductor 1434, thereby forming capacitor 1413A. Conductive pattern 1433 also corresponds to inductor 1413B. Capacitor 1413A, inductor 1413B, capacitor 1414A, and inductor 1414B correspond to unit cell 1410B. Unit cells 1410A and 1410B constitute first CRLH resonator 1422.

First CRLH resonator 1422 and second CRLH resonator 1423 illustrated in FIG. 38 are formed in a mirror-surface symmetrical manner in relation to line segment A-A' of FIG. 39, and conductive pattern 1438 is connected to grounded conductor 1425 through via conductor 1443. Conductive pattern 1438 corresponds to inductor 14120B. In conductive pattern 1438, grounded conductor 1424 and 1425 constitute capacitor 14120A. Conductive pattern 1438 and conductive pattern 1439 are configured to be sandwiched between conductive patterns 1441 and 1442 that are connected through via conductor 1440, thereby forming capacitor 14110A. Conductive pattern 1439 also corresponds to inductor 14110B. Capacitor 14110A, inductor 14110B, capacitor 14120A, and inductor 14120B correspond to unit cell 14100A.

Conductive pattern 1439 is connected to grounded conductor 1425 through via conductor 1448, thereby forming inductor 14140B illustrated in FIG. 38. Capacitor 14140A includes conductive pattern 1439 and grounded conductors 1424 and 1425. Conductive pattern 1439 and conductive pattern 1447 are configured to be sandwiched between conductive patterns 1445 and 1446 that are connected through via conductor 1444, thereby forming capacitor 14130A. Conductive pattern 1447 also corresponds to inductor 14130B. Capacitor 14130A, inductor 14130B, capacitor 14140A, and inductor 14140B correspond to unit cell 14100B. Unit cells 14100A and 14100B constitute second CRLH resonator 1423.

Input coupling element 1420 illustrated in FIG. 38 includes conductive pattern 1451 connected through via conductor 1450 by input terminal 1449 and conductive pattern 1427 corresponding to inductor 1412B. Inter-step coupling element 1419A includes conductive pattern 1427 constituting a part of unit cell 1410A, conductive pattern 1438 constituting a part of unit cell 14100A, and conductive pattern 1452. Inter-step coupling element 1419B includes conductive pattern 1433 corresponding to inductor 1413B, conductive pattern 1447 corresponding to inductor 14130B, and conductive pattern 1453. Output coupling element 1421A includes conductive pattern 1456 that is connected through via conductor 1455 by first output terminal 1454 and conductive pattern 1438 corresponding to inductor 14120B. Output coupling element 1421B includes conductive pattern 1459 that is connected through via conductor 1458 by second output terminal 1457 and conductive pattern 1447 corresponding to inductor 14130B.

Figure 40:
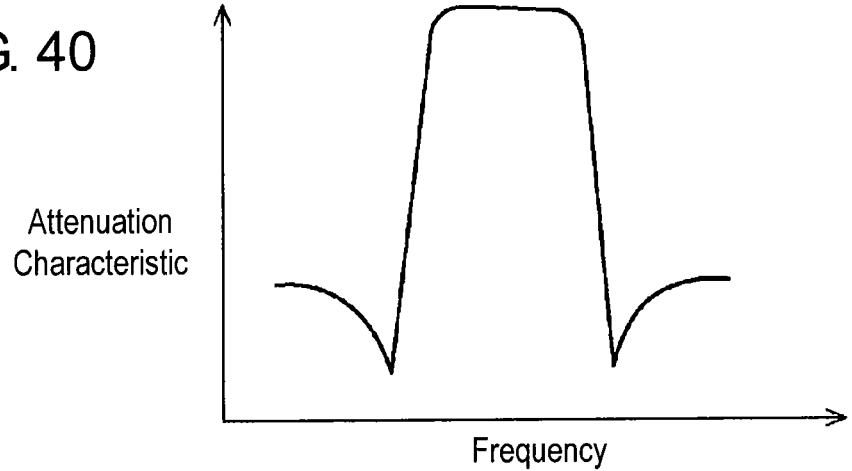
FIG. 40 is a frequency characteristic diagram of the left-handed filter according to the fourteenth embodiment of the present invention.

FIG. 40 is a frequency characteristic diagram of the left-handed filter according to the fourteenth embodiment of the present invention. In FIG. 40, the electromagnetic field coupling is generated between first CRLH resonator 1422 and second CRLH resonator 1423 by incorporating first CRLH resonator 1422 and second CRLH resonator 1423 in dielectric material 1426. The attenuation pole can newly be provided by the electromagnetic field coupling and the resonance of inter-step coupling element 1419, and the attenuation characteristic can be improved. In such cases, preferably grounded conductors 1424 and 1425 are connected by lateral electrodes 1460 and 1461.

Herein, input coupling element 1420 and output coupling elements 1421A and 1421B are expressed by the capacitors as illustrated in FIG. 38. However, when each of the capacitors has the capacitance of 10 pF or more, input coupling element 1420 and output coupling elements 1421A and 1421B may be removed to directly connect the connection points to the input port and the output port.

The left-handed filter of the present invention has the effect that the attenuation characteristic can be improved, and the left-handed filter can usefully be applied to various electronic instruments such as a cellular telephone.

Fifteenth Embodiment

Figure 41:
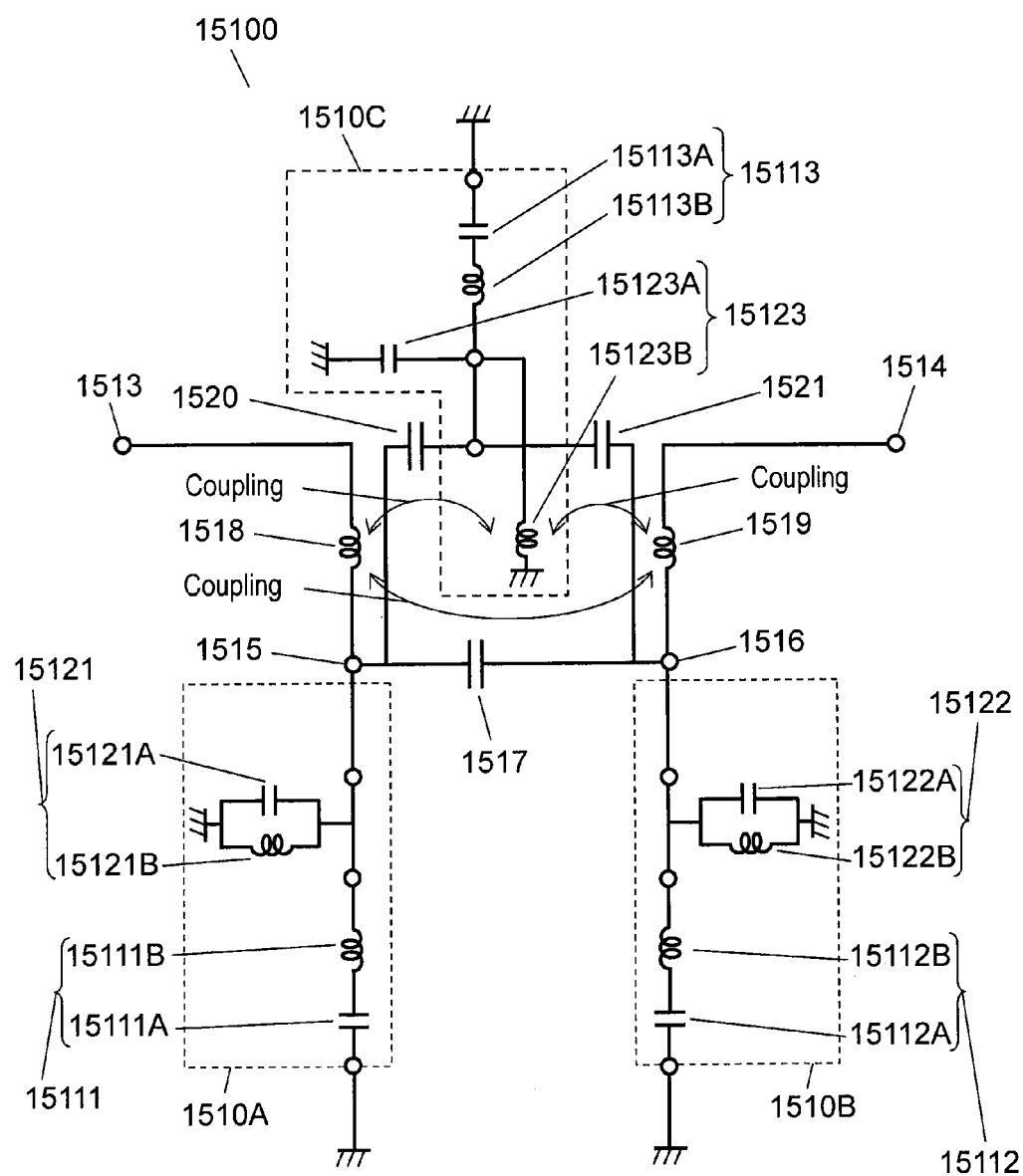
FIG. 41 is an equivalent circuit diagram of a left-handed filter according to a fifteenth embodiment of the present invention.

FIG. 41 is an equivalent circuit diagram of a left-handed filter according to a fifteenth embodiment of the present invention. With reference to FIG. 41, left-handed filter 15100 of the fifteenth embodiment includes input port 1513, output port 1514, first inter-step coupling element 1517 electrically connected to input port 1513 and output port 1514, second inter-step coupling element 1520, and third inter-step coupling element 1521. Left-handed filter 15100 also includes first left-handed resonator 1510A connected to first inter-step coupling element 1517 and second inter-step coupling element 1520, second left-handed resonator 1510B connected to first inter-step coupling element 1517 and third inter-step coupling element 1521, and third left-handed resonator 1510C connected to second inter-step coupling element 1520 and third inter-step coupling element 1521. Left-handed filter 15100 also includes first inductor 1518 that is connected among input port 1513, first inter-step coupling element 1517, second inter-step coupling element 1520, and first left-handed resonator 1510A and second inductor 1519 that is connected among output port 1514, first inter-step coupling element 1517, third inter-step coupling element 1521, and second left-handed resonator 1510B.

In first left-handed resonator 1510A, one end is connected to one end of first inter-step coupling element 1517 and one end of second inter-step coupling element 1520, and the other end is grounded. At this point, a point at which one end of first left-handed resonator 1510A, one end of first inter-step coupling element 1517, and one end of second inter-step coupling element 1520 are connected is defined as connection point 1515. In second left-handed resonator 1510B, one end is connected to the other end of first inter-step coupling element 1517 and one end of third inter-step coupling element 1521, and the other end is grounded. At this point, a point at which one end of second left-handed resonator 1510B, the other end of first inter-step coupling element 1517, and one end of third inter-step coupling element 1521 are connected is defined as connection point 1516. In third left-handed resonator 1510C, one end is connected to the other end of second inter-step coupling element 1520 and the other end of third inter-step coupling element 1521, and the other end is grounded.

In the fifteenth embodiment, the other end of each of first left-handed resonator 1510A, second left-handed resonator 1510B, and third left-handed resonator 1510C is grounded. Alternatively, the other end of each of first left-handed resonator 1510A, second left-handed resonator 1510B, and third left-handed resonator 1510C may be opened. Furthermore, each of first left-handed resonator 1510A, second left-handed resonator 1510B, and third left-handed resonator 1510C includes one left-handed resonator. Alternatively, each of first left-handed resonator 1510A, second left-handed resonator 1510B, and third left-handed resonator 1510C may include a plurality of left-handed resonators that are connected in series.

First left-handed resonator 1510A includes parallel body 15121 and series body 15111. Parallel body 15121 includes capacitor 15121A and inductor 15121B, and capacitor 15121A and inductor 15121B are connected in parallel. Series body 15111 includes capacitor 15111A and inductor 15111B, and capacitor 15111A and inductor 15111B are connected in series. In series body 15111, one end is connected to one end of first inter-step coupling element 1517 and one end of second inter-step coupling element 1520. In parallel body 15121, one end is connected to the other end of series body 15111, and the other end is grounded.

Second left-handed resonator 1510B includes parallel body 15122 and series body 15112. Parallel body 15122 includes capacitor 151212A and inductor 15122B, and capacitor 15122A and inductor 15122B are connected in parallel. Series body 15112 includes capacitor 15112A and inductor 15112B, and capacitor 15112A and inductor 15112B are connected in series. In series body 15112, one end is connected to the other end of first inter-step coupling element 1517 and one end of third inter-step coupling element 1521. In parallel body 15122, one end is connected to the other end of series body 15112, and the other end is grounded.

Third left-handed resonator 1510C includes parallel body 15123 and series body 15113. Parallel body 15123 includes capacitor 15123A and inductor 15123B, and capacitor 15123A and inductor 15123B are connected in parallel. Series body 15113 includes capacitor 15113A and inductor 15113B, and capacitor 15113A and inductor 15113B are connected in series. In series body 15113, one end is connected to the other end of second inter-step coupling element 1520 and the other end of third inter-step coupling element 1521. In parallel body 15123, one end is connected to the other end of series body 15113, and the other end is grounded.

In the fifteenth embodiment, series body 15111 included in first left-handed resonator 1510A has the configuration in which inductor 15111B is connected to parallel body 15121 while capacitor 15111A is connected to connection point 1515. Alternatively, series body 15111 may have a configuration in which capacitor 15111A is connected to parallel body 15121 while inductor 15111B is connected to connection point 1515. Second left-handed resonator 1510B and third left-handed resonator 1510C may have the similar configuration.

First inductor 1518 is connected between connection point 1515 and input port 1513. Second inductor 1519 is connected between connection point 1516 and output port 1514. A disposition relationship among first inductor 1518, second inductor 1519, and inductor 15123B of parallel body 15123 of third left-handed resonator 1510C is adjusted such that the magnetic field coupling is generated among first inductor 1518, second inductor 1519, and inductor 15123B of parallel body 15123 of third left-handed resonator 1510C. When first inductor 1518, second inductor 1519, and inductor 15123B of parallel body 15123 of third left-handed resonator 1510C come close to one another, the degree of magnetic field coupling is increased in each of first inductor 1518, second inductor 1519, and inductor 15123B of parallel body 15123 of third left-handed resonator 1510C. On the other hand, when first inductor 1518, second inductor 1519, and inductor 15123B of parallel body 15123 of third left-handed resonator 1510C are disposed distant from one another, the degree of magnetic field coupling is decreased in each of first inductor 1518, second inductor 1519, and inductor 15123B of parallel body 15123 of third left-handed resonator 1510C.

Figure 42:
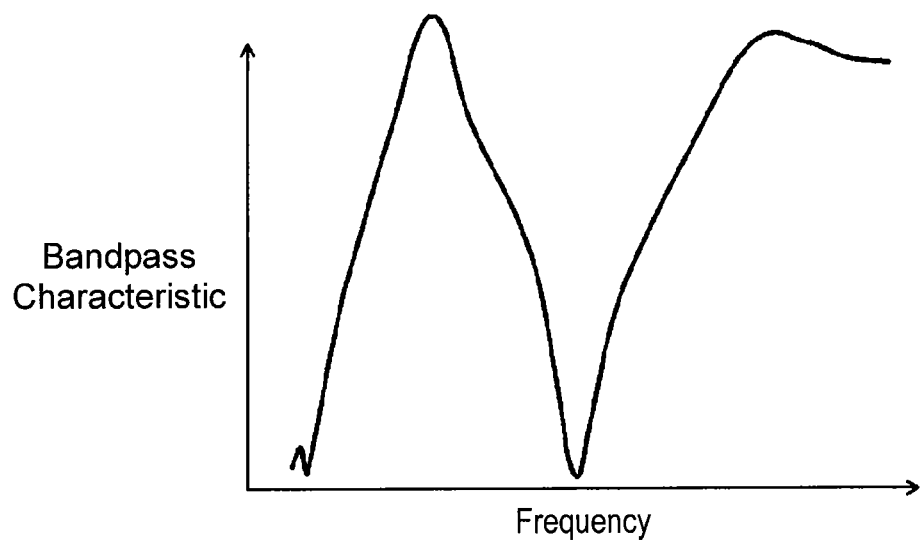
FIG. 42 is a frequency characteristic diagram when the magnetic field coupling is not generated in the left-handed filter according to the fifteenth embodiment of the present invention.
Figure 43:
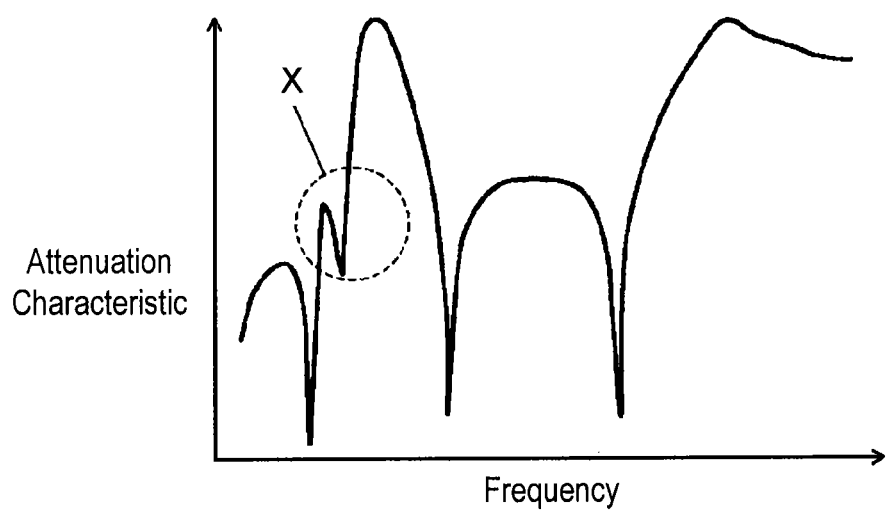
FIG. 43 is a frequency characteristic diagram when the magnetic field coupling is generated in the left-handed filter according to the fifteenth embodiment of the present invention.

FIG. 42 is a frequency characteristic diagram when the magnetic field coupling is not generated in the left-handed filter according to the fifteenth embodiment of the present invention. FIG. 43 is a frequency characteristic diagram when the magnetic field coupling is generated in the left-handed filter according to the fifteenth embodiment of the present invention. In FIGS. 42 and 43, when the magnetic field coupling is generated among first inductor 1518, second inductor 1519, and inductor 15123B of parallel body 15123 of third left-handed resonator 1510C, the attenuation pole is newly generated in the passband in left-handed filter 15100. Accordingly, the number of attenuation poles generated in left-handed filter 15100 can be increased by generating the magnetic field coupling among first inductor 1518, second inductor 1519, and inductor 15123B of parallel body 15123 of third left-handed resonator 1510C.

All the attenuation poles including the attenuation poles possessed originally by left-handed filter 15100 can be disposed at any frequency by adjusting the distance among first inductor 1518, second inductor 1519, and inductor 15123B of parallel body 15123 of third left-handed resonator 1510C. Accordingly, in the left-handed filter of the fifteenth embodiment, the balance can be established between the improvement of the attenuation characteristic and the adjustment of the attenuation characteristic. Particularly, as illustrated by area X of FIG. 43, the attenuation of 30 dB or more can be achieved in the frequency band of 2.4 GHz to 2.5 GHz used in W-LAN, and the attenuation can be prevented in the frequency band of 1.9 GHz to 2.2 GHz for transmission and reception of the cellular telephone. Therefore, interference can be prevented between the W-LAN and the transmission and reception of the cellular telephone, in which the frequency bands are close to each other.

In the fifteenth embodiment, first left-handed resonator 1510A, second left-handed resonator 1510B, and third left-handed resonator 1510C are the left-handed resonator that is connected in parallel between input port 1513 and output port 1514. Alternatively, at least three left-handed resonators may be connected in parallel. In such cases, one inter-step coupling element is connected between the left-handed resonators. First inductor 1518 is connected to one end of first inter-step coupling element and one end of second inter-step coupling element. Second inductor 1519 is connected to the other end of first inter-step coupling element and one end of third inter-step coupling element. In the fifteenth embodiment, the left-handed filter may further include input coupling element that is connected between first inductor 1518 and connection point 1515 and output coupling element that is connected between second inductor 1519 and connection point 1516.

FIGS. 44A to 44J are exploded views each illustrating a pattern of a dielectric substrate constituting a dielectric stacked substrate in the left-handed filter according to the fifteenth embodiment of the present invention in order from the top. In FIGS. 44A to 44J, patterns of the dielectric substrates are provided in parallel with one another. Hereinafter, for the sake of convenience, the dielectric substrates illustrated in FIGS. 44A to 44J are sequentially designated by numerals 1530a to 1530j from the top.

Figure 44A:
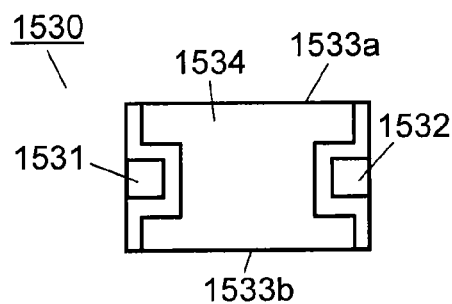
FIG. 44A is an exploded view illustrating a pattern of a dielectric substrate constituting a dielectric stacked substrate in the left-handed filter according to the fifteenth embodiment of the present invention in order from the top.
Figure 44B:
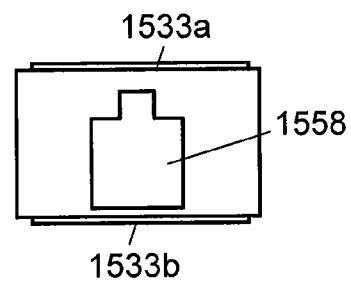
FIG. 44B is an exploded view illustrating a pattern of a dielectric substrate constituting the dielectric stacked substrate in the left-handed filter according to the fifteenth embodiment of the present invention in order from the top.
Figure 44C:
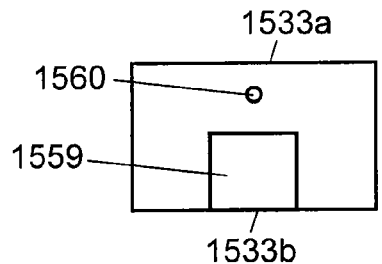
FIG. 44C is an exploded view illustrating a pattern of a dielectric substrate constituting the dielectric stacked substrate in the left-handed filter according to the fifteenth embodiment of the present invention in order from the top.
Figure 44D:
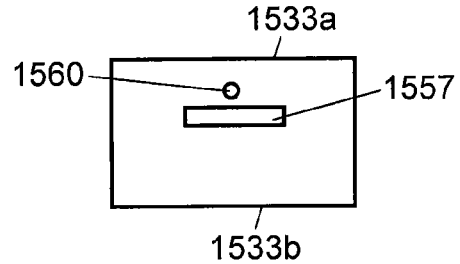
FIG. 44D is an exploded view illustrating a pattern of a dielectric substrate constituting the dielectric stacked substrate in the left-handed filter of according to the fifteenth embodiment of the present invention in order from the top.
Figure 44E:
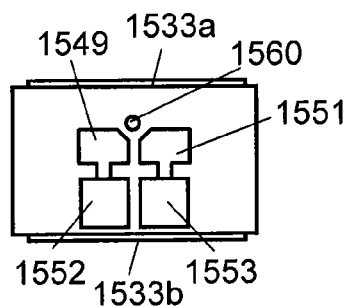
FIG. 44E is an exploded view illustrating a pattern of a dielectric substrate constituting the dielectric stacked substrate in the left-handed filter according to the fifteenth embodiment of the present invention in order from the top.
Figure 44F:
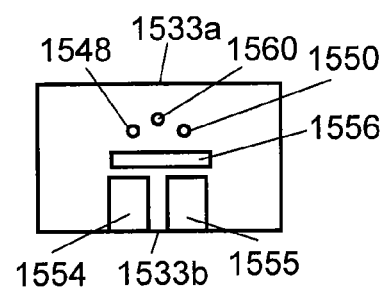
FIG. 44F is an exploded view illustrating a pattern of a dielectric substrate constituting the dielectric stacked substrate in the left-handed filter according to the fifteenth embodiment of the present invention in order from the top.
Figure 44G:
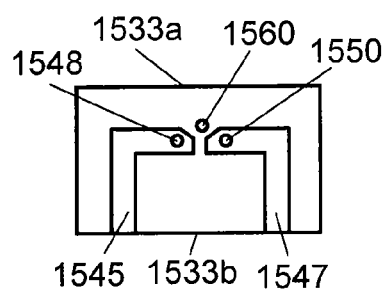
FIG. 44G is an exploded view illustrating a pattern of a dielectric substrate constituting the dielectric stacked substrate in the left-handed filter according to the fifteenth embodiment of the present invention in order from the top.

Dielectric substrates 1530a to 1530j include input port 1531, output port 1532, and lateral electrodes 1533a and 1533b. As illustrated in FIGS. 44A and 44J, input port 1531 and output port 1532 extend to an upper surface and a lower surface of dielectric stacked substrate 1530 along a side face of dielectric stacked substrate 1530. As illustrated in FIG. 44A, dielectric substrate 1530a includes first ground electrode 1534. As illustrated in FIG. 44J, dielectric substrate 1530j includes second ground electrode 1535. First ground electrode 1534 and second ground electrode 1535 are connected to lateral electrodes 1533a and 1533b to maintain the equal potential. Input port 1531 and output port 1532 are insulated from first ground electrode 1534, second ground electrode 1535, and lateral electrodes 1533a and 1533b.

Figure 44H:
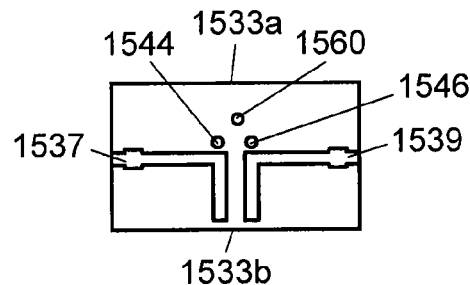
FIG. 44H is an exploded view illustrating a pattern of a dielectric substrate constituting the dielectric stacked substrate in the left-handed filter according to the fifteenth embodiment of the present invention in order from the top.
Figure 44I:
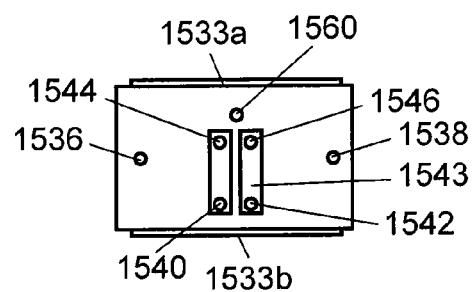
FIG. 44I is an exploded view illustrating a pattern of a dielectric substrate constituting the dielectric stacked substrate in the left-handed filter according to the fifteenth embodiment of the present invention in order from the top.
Figure 44J:
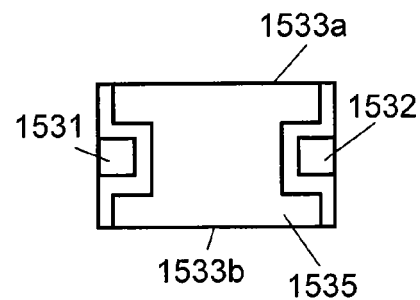
FIG. 44J is an exploded view illustrating a pattern of a dielectric substrate constituting the dielectric stacked substrate in the left-handed filter according to the fifteenth embodiment of the present invention in order from the top.

As illustrated in FIGS. 44H to 44J, input port 1531 is connected to conductive pattern 1537 through via conductor 1536. Output port 1532 is connected to conductive pattern 1539 through via conductor 1538. Conductive pattern 1537 is connected to conductive pattern 1541 through via conductor 1540. Conductive pattern 1539 is connected to conductive pattern 1543 through via conductor 1542.

As illustrated in FIGS. 44G to 44I, conductive pattern 1541 is connected to conductive pattern 1545 through via conductor 1544. Conductive pattern 1543 is connected to conductive pattern 1547 through via conductor 1546. One end of conductive pattern 1545 and one end of conductive pattern 1547 are connected to lateral electrode 1533$b$. Conductive pattern 1545 and conductive pattern 1547 are disposed opposite first ground electrode 1534 and second ground electrode 1535.

As illustrated in FIGS. 44E to 44G, conductive pattern 1545 is connected to conductive pattern 1549 through via conductor 1548. Conductive pattern 1547 is connected to conductive pattern 1551 through via conductor 1550. Conductive pattern 1549 is connected to another conductive pattern 1552 on the same dielectric substrate. Conductive pattern 1551 is connected to another conductive pattern 1553 on the same dielectric substrate.

As illustrated in FIGS. 44 and 44F, conductive pattern 1554 is disposed opposite conductive pattern 1552. Conductive pattern 1555 is disposed opposite conductive pattern 1553 on the same dielectric substrate as conductive pattern 1554. Conductive pattern 1556 is disposed on the same dielectric substrate as conductive patterns 1554 and 1555. As illustrated in FIGS. 44D and 44E, conductive pattern 1557 is disposed opposite conductive patterns 1549 and 1551. As illustrated in FIGS. 44A, 44B, 44D, and 44J, conductive pattern 1558 is disposed opposite conductive pattern 1557, first ground electrode 1534, and second ground electrode 1535. As illustrated in FIGS. 44B and 44C, conductive pattern 1559 is disposed opposite conductive pattern 1558. As illustrated in FIGS. 44B to 44J, conductive pattern 1558 is connected to second ground electrode 1535 through via conductor 1560.

Capacitor 15111A included in series body 15111 of first left-handed resonator 1510A illustrated in FIG. 41 includes conductive pattern 1552 and conductive pattern 1554 that is disposed opposite conductive pattern 1552. Inductor 15111B included in series body 15111 of first left-handed resonator 1510A mainly includes conductive pattern 1552 and a depth-direction component of conductive pattern 1554. Capacitor 15121A included in parallel body 15121 of first left-handed resonator 1510A mainly includes conductive pattern 1545 and first ground electrode 1534 and second ground electrode 1535, and first ground electrode 1534 and second ground electrode 1535 are disposed opposite conductive pattern 1545. Inductor 15121B included in parallel body 15121 of first left-handed resonator 1510A includes a depth-direction component of conductive pattern 1545.

Capacitor 15112A included in series body 15112 of second left-handed resonator 1510B illustrated in FIG. 41 includes conductive pattern 1553 and conductive pattern 1555 disposed opposite conductive pattern 1553. Inductor 15112B included in series body 15112 of second left-handed resonator 1510B mainly includes conductive pattern 1553 and a depth-direction component of conductive pattern 1555. Capacitor 15122A included in parallel body 15122 of second left-handed resonator 1510B mainly includes conductive pattern 1547 and first ground electrode 1534 and second ground electrode 1535, and first ground electrode 1534 and second ground electrode 1535 are disposed opposite conductive pattern 1547. Inductor 15122B included in parallel body 15122 of second left-handed resonator 1510B includes a depth-direction component of conductive pattern 1547.

Capacitor 15113A included in series body 15113 of third left-handed resonator 1510C illustrated in FIG. 41 includes conductive pattern 1558 and conductive pattern 1559 that is disposed opposite conductive pattern 1558. Inductor 15113B included in series body 15113 of third left-handed resonator 1510C mainly includes conductive pattern 1558 and a depth-direction component of conductive pattern 1559. Capacitor 15123A included in parallel body 15123 of third left-handed resonator 1510C mainly includes conductive pattern 1558 and first ground electrode 1534 and second ground electrode 1535, and first ground electrode 1534 and second ground electrode 1535 are disposed opposite conductive pattern 1558. Inductor 15123B included in parallel body 15123 of third left-handed resonator 1510C includes via conductor 1560.

First inter-step coupling element 1517 has the structure in which conductive pattern 1556 and conductive pattern 1557 are disposed opposite conductive pattern 1549 and conductive pattern 1551 while the dielectric material is interposed therebetween. Second inter-step coupling element 1520 mainly has the structure in which conductive pattern 1557 is disposed opposite conductive pattern 1549 and conductive pattern 1558 while the dielectric material is interposed therebetween. Third inter-step coupling element 1521 mainly has the structure in which conductive pattern 1557 is disposed opposite conductive pattern 1551 and conductive pattern 1558 while the dielectric material is interposed therebetween.

First inductor 1518 includes a parasitic inductor, and the parasitic inductor is formed by conductive pattern 1537, via conductor 1540 connected to conductive pattern 1537, conductive pattern 1541 connected to via conductor 1540, and via conductor 1544 connected to conductive pattern 1541. Second inductor 1519 includes a parasitic inductor, and the parasitic inductor is formed by conductive pattern 1539, via conductor 1542 connected to conductive pattern 1539, conductive pattern 1543 connected to via conductor 1542, and via conductor 1546 connected to conductive pattern 1543.

All the attenuation poles including the attenuation poles possessed originally by the left-handed filter can be disposed at any frequency by adjusting the distance among conductive patterns 1537, 1539, 1541, and 1543, via conductor 1544, via conductor 1546, and via conductor 1560 to stack conductive patterns 1537, 1539, 1541, and 1543, via conductor 1544, via conductor 1546, and via conductor 1560.

When the stacked structure is realized by the above configuration in the left-handed filter, it is not necessary to adjust the components of the already-designed left-handed filter. The number of attenuation poles is newly increased in the left-handed filter, and the newly-increased attenuation pole can be controlled. That is, all the attenuation poles including the attenuation poles possessed originally by the left-handed filter can be disposed at any frequency only by adjusting the distance between the conductive pattern and via conductor, which act as the inductor. Further, third left-handed resonator 1510C in which the inductor is expressed by via conductor 1560 is used as first left-handed resonator 1510A and second left-handed resonator 1510B, and first left-handed resonator 1510A and second left-handed resonator 1510B have the similar structure, so that third left-handed resonator 1510C can be disposed while stacked on first left-handed resonator 1510A and second left-handed resonator 1510B. Therefore, it is not necessary to secure the new space on the plane.

Accordingly, the production cost can be suppressed, the compact left-handed filter can be maintained, the number of attenuation poles generated can be increased while the passband is secured, and all the attenuation poles including the attenuation poles possessed originally by the left-handed filter can be controlled.

The left-handed filter of the present invention can suppress the production cost, maintain the compact left-handed filter, increase the number of attenuation poles generated while the passband is secured, and control all the attenuation poles including the attenuation poles possessed originally by left-handed filter. The left-handed filter of the present invention is usefully applied to various electronic instruments such as a cellular telephone.

Sixteenth Embodiment

Figure 45:
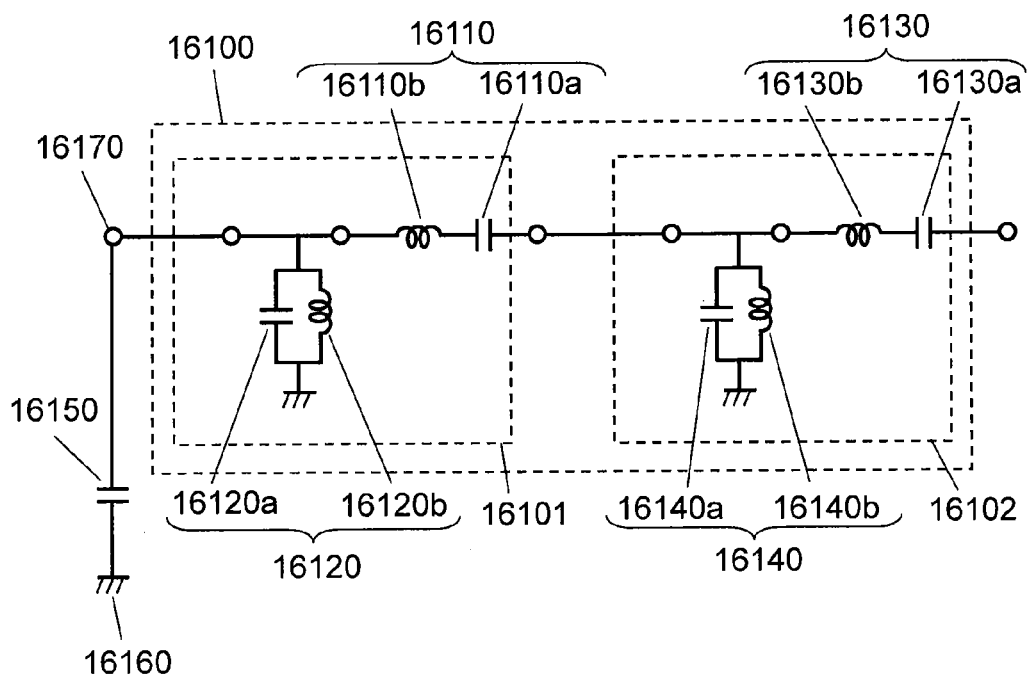
FIG. 45 is an equivalent circuit diagram of a left-handed transmission line of a left-handed resonator according to a sixteenth embodiment of the present invention.

FIG. 45 is an equivalent circuit diagram of a left-handed transmission line of a left-handed resonator according to a sixteenth embodiment of the present invention. With reference to FIG. 45, left-handed resonator 16100 of the sixteenth embodiment includes first cell 16101 and second cell 16102 connected to first cell 16101. First cell 16101 includes first series body 16110 and first parallel body 16120. First series body 16110 includes capacitor 16110a and inductor 16110b, and first parallel body 16120 includes capacitor 16120a and inductor 16120b. One end of first parallel body 16120 is connected to input/output port 16170, and the other end of first parallel body 16120 is connected to the ground. That is, one end of capacitor 16120a and one end of inductor 16120b are connected to input/output port 16170. The other end of capacitor 16120a and the other end of inductor 16120b are connected to the ground. One end of first parallel body 16120 is connected to one end of first series body 16110. That is, one end of capacitor 16110a and one end of inductor 16110b are connected to one end of capacitor 16120a and one end of inductor 16120b. After one end of first parallel body 16120 is connected to input/output port 16170, one end of first series body 16110 is connected to one end of first parallel body 16120. However, the connection order may be reversed.

Second cell 16102 includes second series body 16130 and second parallel body 16140. Second series body 16130 includes capacitor 16130a and inductor 16130b, and second parallel body 16140 includes capacitor 16140a and inductor 16140b. One end of second parallel body 16140 is connected to the other end of first series body 16110, and the other end of second parallel body 16140 is connected to the ground. That is, one end of capacitor 16140a and one end of inductor 16140b are connected to the other end of capacitor 16110a and the other end of inductor 16110b. The other end of capacitor 16140a and the other end of inductor 16140b are connected to the ground. One end of second series body 16130 is connected to one end of second parallel body 16140. That is, one end of capacitor 16140a and one end of inductor 16140b are connected to one end of capacitor 16130a and one end of inductor 16130b. After one end of second parallel body 16140 is connected to the other end of first series body 16110 corresponding to the other end of first cell 16101, and one end of second series body 16130 is connected to the other end of second parallel body 16140. However, the connection order may be reversed.

In capacitor 16150, one end is connected to first cell 16101 through input/output port 16170, and the other end is connected to ground 16160. A susceptance component of capacitor 16150 is added to a susceptance component of left-handed resonator 16100 by connecting capacitor 16150 in parallel with left-handed resonator 16100. As a result, a zero point of the susceptance component possessed by left-handed resonator 16100 is shifted onto the low-frequency side, and an amount of change of the susceptance component possessed by left-handed resonator 16100 becomes small near the zero point.

The other end of second series body 16130 may be connected to the ground through the inductor serving as the parasitic component. In such cases, the resonator excites only left-handed odd-numbered-order resonance and right-handed odd-numbered-order resonance. Therefore, the amount of change of the susceptance component of the resonator can be loosened with respect to the frequency.

Figure 46:
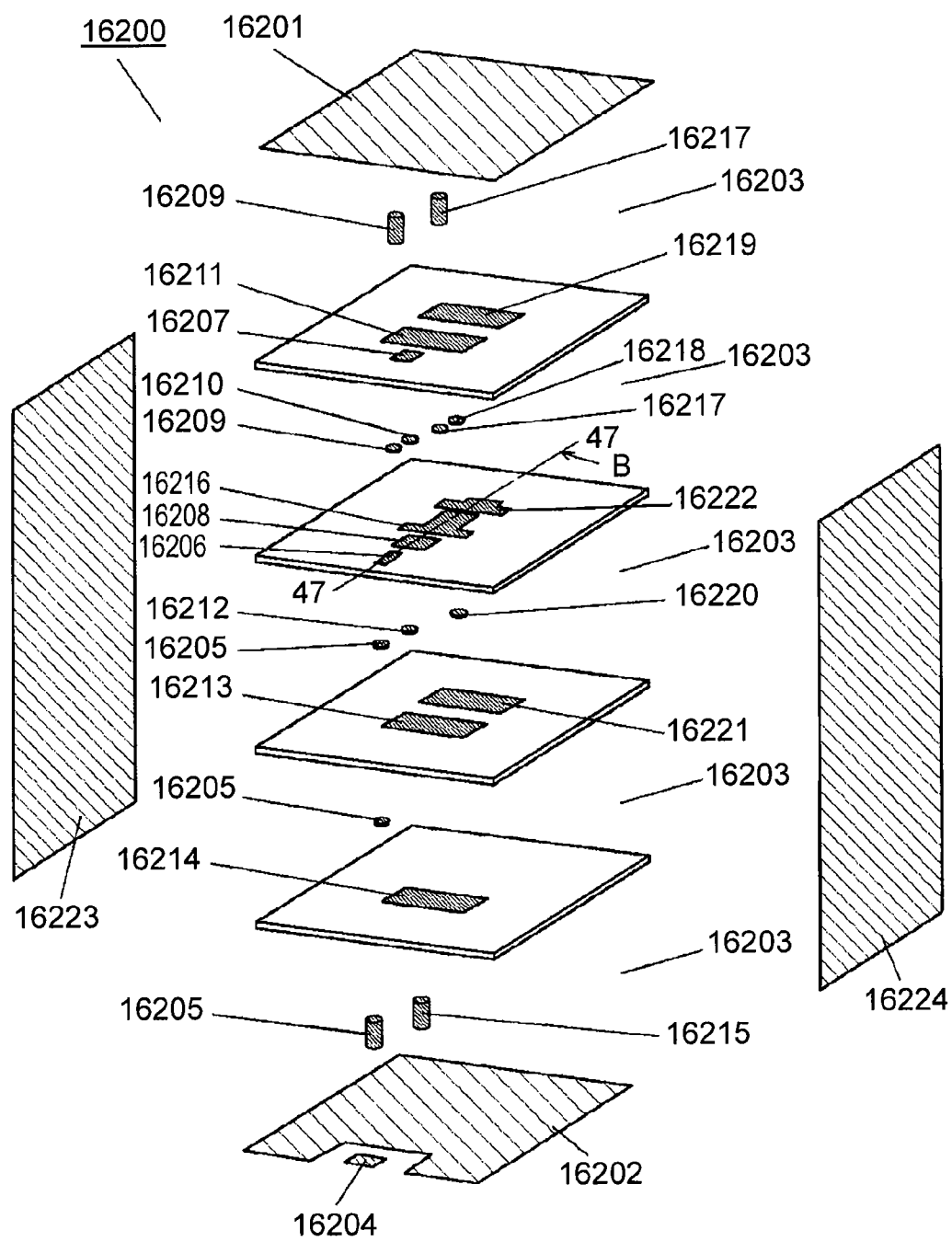
FIG. 46 is an exploded perspective view illustrating a structure of the left-handed resonator according to the sixteenth embodiment of the present invention.
Figure 47:
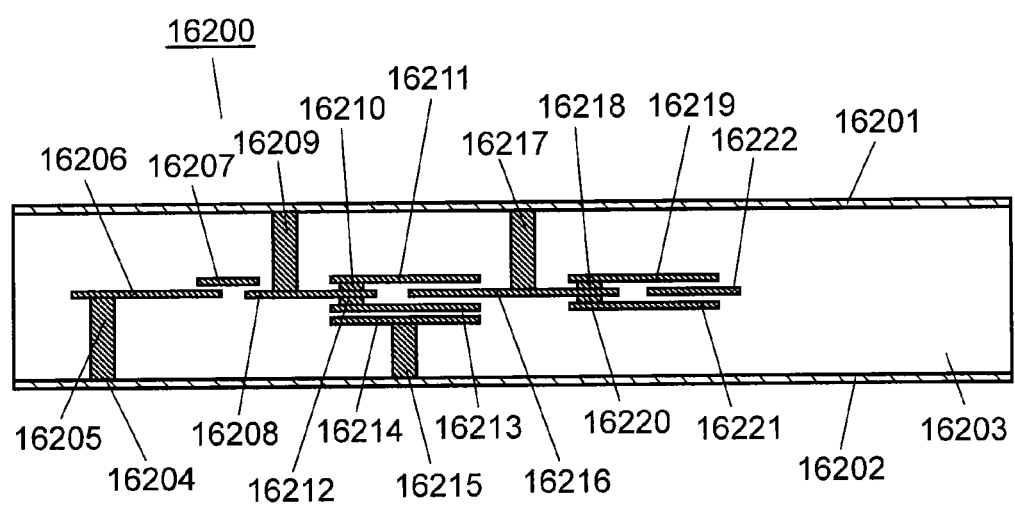
FIG. 47 is a sectional view taken on line 47-47 of FIG. 46 when a section is viewed from a direction of arrow B.

FIG. 46 is an exploded perspective view illustrating a structure of the left-handed resonator according to the sixteenth embodiment of the present invention. FIG. 47 is a sectional view taken on line 47-47 of FIG. 46 when a section is viewed from a direction of arrow B. A connection relationship of left-handed resonator 16200 illustrated in FIGS. 46 and 47 will be described.

Left-handed resonator 16200 has the structure in which the space between grounded conductors 16201 and 16202 that are disposed opposite each other is filled with dielectric material 16203. Input/output port 16204 that is insulated from grounded conductor 16202 is provided on the same plane as grounded conductor 16202. Conductive pattern 16206 is connected to input/output port 16204 through via conductor 16205. Conductive pattern 16207 is provided opposite conductive pattern 16206 while dielectric material 16203 is interposed therebetween. Conductive pattern 16208 is disposed opposite conductive pattern 16207 while dielectric material 16203 is interposed therebetween. Conductive pattern 16208 is connected to grounded conductor 16201 through via conductor 16209. Conductive pattern 16208 is connected to conductive pattern 16211 through via conductor 16210. Conductive pattern 16208 is connected to conductive pattern 16213 through via conductor 16212. Conductive pattern 16214 that is disposed opposite conductive pattern 16213 while dielectric material 16203 is interposed therebetween is connected to grounded conductor 16202 through via conductor 16215. Conductive pattern 16216 is sandwiched between conductive pattern 16211 and conductive pattern 16213 while dielectric material 16203 is interposed therebetween. Conductive pattern 16216 is connected to grounded conductor 16201 through via conductor 16217. Conductive pattern 16219 is connected to conductive pattern 16216 through via conductor 16218. Conductive pattern 16221 is connected to conductive pattern 16216 through via conductor 16220. Conductive pattern 16222 is sandwiched between conductive pattern 16219 and conductive pattern 16221 while dielectric material 16203 is interposed therebetween. The attenuation of the output can be increased by conductive patterns 16206, 16207, and 16208 when the left-handed resonator 16200 resonated, and the change of the output can clearly be recognized. Grounded conductors 16201 and 16202 are connected to lateral electrodes 16223 and 16224. Accordingly, grounded conductor 16201 and grounded conductor 16202 can be maintained at the same potential.

A correspondence relationship between the structure of left-handed resonator 16200 illustrated in FIGS. 46 and 47 and the configuration of left-handed resonator 16100 illustrated in FIG. 45 will be described below.

Capacitor 16110a illustrated in FIG. 45 is formed by the structure in which conductive pattern 16211 and conductive pattern 16216 are disposed opposite each other while dielectric material 16203 is interposed therebetween and the structure in which conductive pattern 16213 and conductive pattern 16216 are disposed opposite each other while dielectric material 16203 is interposed therebetween. Inductor 16110b mainly includes a depth-direction component of conductive pattern 16216. Capacitor 16120a is mainly formed by the structure in which conductive pattern 16211 and grounded conductor 16201 are disposed opposite each other while dielectric material 16203 is interposed therebetween. Inductor 16120b includes via conductor 16209.

Capacitor 16130a illustrated in FIG. 45 is formed by the structure in which conductive pattern 16219 and conductive pattern 16222 are disposed opposite each other while dielectric material 16203 is interposed therebetween and the structure in which conductive pattern 16221 and conductive pattern 16222 are disposed opposite each other while dielectric material 16203 is interposed therebetween. Inductor 16130b mainly includes the depth-direction component of conductive pattern 16216. Capacitor 16140a is mainly formed by the structure in which conductive pattern 16219 and grounded conductor 16201 are disposed opposite each other while dielectric material 16203 is interposed therebetween. Inductor 16140b includes via conductor 16217.

Capacitor 16150 illustrated in FIG. 45 is formed by the structure in which conductive pattern 16213 and conductive pattern 16214 are disposed opposite each other while dielectric material 16203 is interposed therebetween. Thus, when left-handed resonator 16200 is formed by the stacked structure, because capacitor 16150 can be provided using a part of left-handed resonator 16200, it is not necessary to newly secure the space for providing capacitor 16150. Accordingly, the band width can be widened at low production cost without changing the dimensions of the left-handed resonator.

Figure 48:
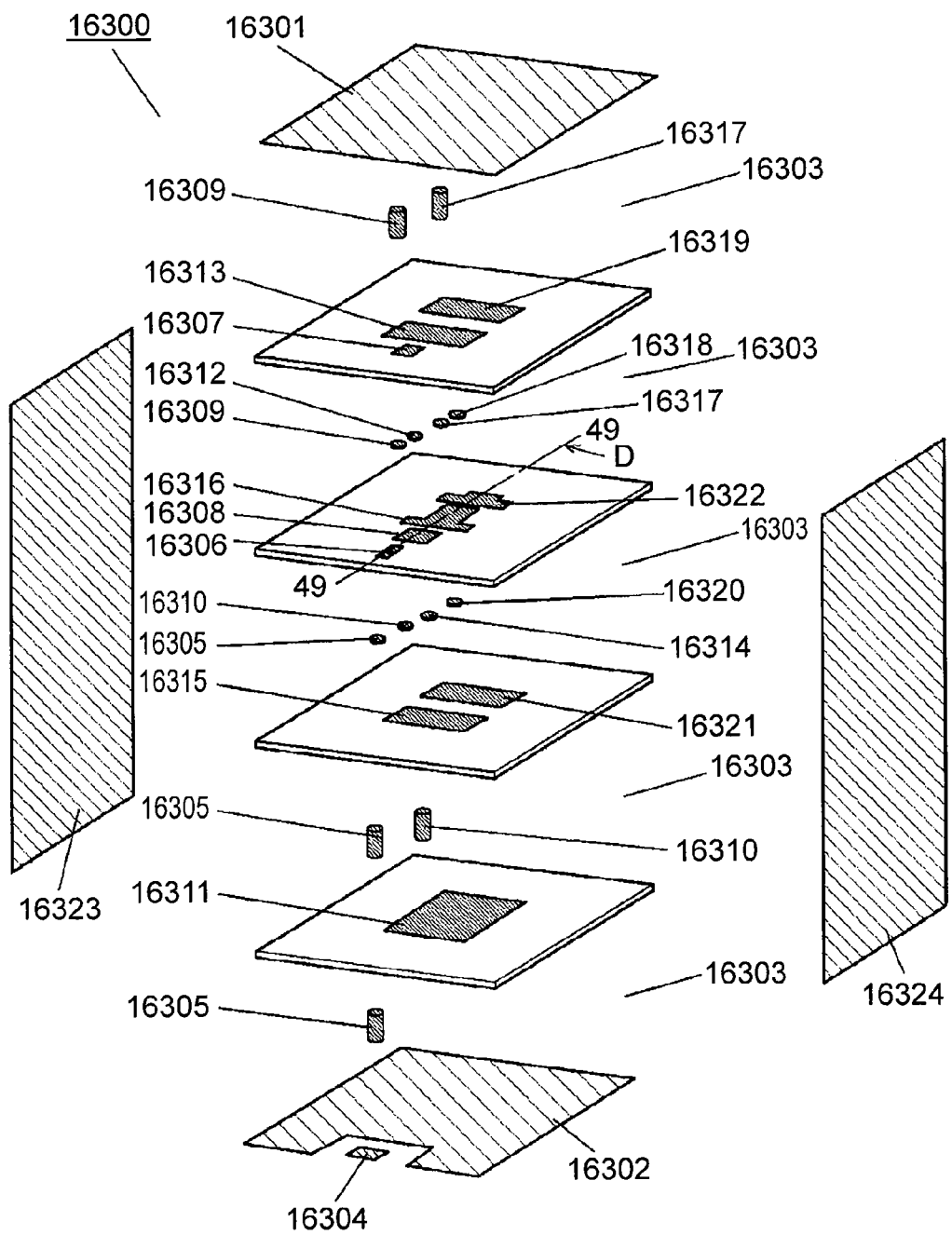
FIG. 48 is an exploded perspective view illustrating a structure of another left-handed resonator according to the sixteenth embodiment of the present invention.
Figure 49:
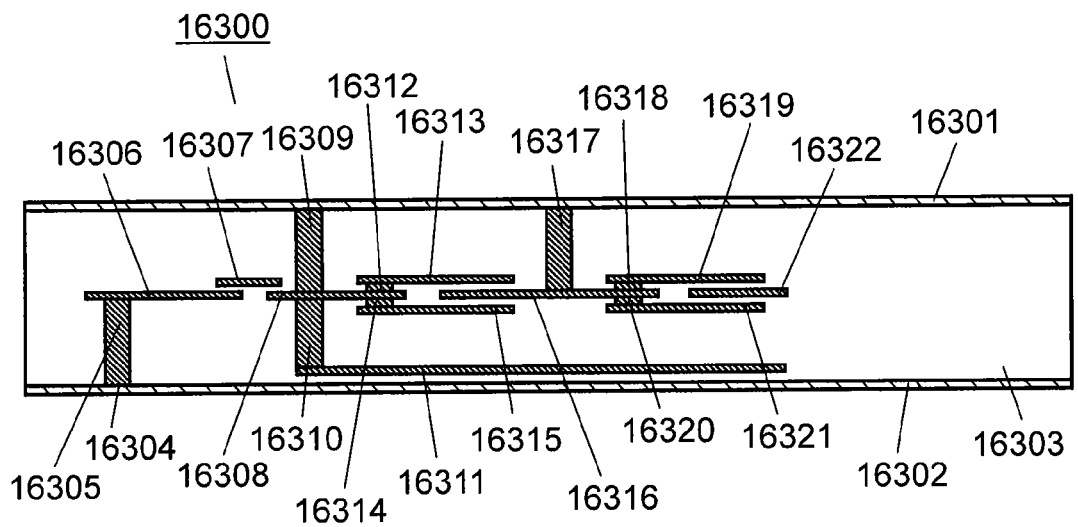
FIG. 49 is a sectional view taken on line 49-49 of FIG. 48 when a section is viewed from a direction of arrow D.

FIG. 48 is an exploded perspective view illustrating a structure of another left-handed resonator according to the sixteenth embodiment of the present invention. FIG. 49 is a sectional view taken on line 49-49 of FIG. 48 when a section is viewed from a direction of arrow D. A connection relationship of left-handed resonator 16300 illustrated in FIGS. 48 and 49 will be described.

Left-handed resonator 16300 has the structure in which the space between grounded conductors 16301 and 16302 that are disposed opposite each other is filled with dielectric material 16303. Input/output port 16304 that is insulated from grounded conductor 16302 is provided on the same plane as grounded conductor 16302. Conductive pattern 16306 is connected to input/output port 16304 through via conductor 16305. Conductive pattern 16307 is provided opposite conductive pattern 16306 while dielectric material 16303 is interposed therebetween. Conductive pattern 16308 is disposed opposite conductive pattern 16307 while dielectric material 16303 is interposed therebetween. Conductive pattern 16308 is connected to grounded conductor 16301 through via conductor 16309. Conductive pattern 16308 is connected to conductive pattern 16311 through via conductor 16310. Conductive pattern 16308 is connected to conductive pattern 16313 through via conductor 16312. Conductive pattern 16308 is connected to conductive pattern 16315 through via conductor 16314. Conductive pattern 16316 is sandwiched between conductive pattern 16313 and conductive pattern 16315 while dielectric material 16303 is interposed therebetween. Conductive pattern 16316 is connected to grounded conductor 16301 through via conductor 16317. Conductive pattern 16319 is connected to conductive pattern 16316 through via conductor 16318. Conductive pattern 16321 is connected to conductive pattern 16316 through via conductor 16320. Conductive pattern 16322 is sandwiched between conductive pattern 16319 and conductive pattern 16321 while dielectric material 16303 is interposed therebetween. The attenuation of the output can be increased by conductive patterns 16306, 16307, and 16308 when the left-handed resonator 16300 resonated, and the change of the output can clearly be recognized.

A correspondence relationship between the structure of left-handed resonator 16300 illustrated in FIGS. 48 and 49 and the configuration of left-handed resonator 16100 illustrated in FIG. 45 will be described below.

Capacitor 16110a illustrated in FIG. 45 is formed by the structure in which conductive pattern 16313 and conductive pattern 16316 are disposed opposite each other while dielectric material 16303 is interposed therebetween and the structure in which conductive pattern 16315 and conductive pattern 16316 are disposed opposite each other while dielectric material 16303 is interposed therebetween. Inductor 16110b mainly includes a depth-direction component of conductive pattern 16316. Capacitor 16120a is mainly formed by the structure in which conductive pattern 16313 and grounded conductor 16301 are disposed opposite each other while dielectric material 16303 is interposed therebetween. Inductor 16120b includes via conductor 16309.

Capacitor 16130a illustrated in FIG. 45 is formed by the structure in which conductive pattern 16319 and conductive pattern 16322 are disposed opposite each other while dielectric material 16303 is interposed therebetween and the structure in which conductive pattern 16321 and conductive pattern 16322 are disposed opposite each other while dielectric material 16303 is interposed therebetween. Inductor 16130b mainly includes the depth-direction component of conductive pattern 16316. Capacitor 16140a is mainly formed by the structure in which conductive pattern 16319 and grounded conductor 16301 are disposed opposite each other while dielectric material 16303 is interposed therebetween. Inductor 16140b includes via conductor 16317.

Capacitor 16150 illustrated in FIG. 45 is formed by the structure in which conductive pattern 16311 and conductive pattern 16302 that is not part of left-handed resonator 16300 are disposed opposite each other while dielectric material 16303 is interposed therebetween. Grounded conductor 16302 has a large area and is not part of left-handed resonator 16300. Therefore, when the capacitor 16150 is formed, the area of conductive pattern 16311 substantially directly becomes the area of capacitor 16150, and the disposition of conductive pattern 16311 is not influenced by the size of left-handed resonator 16300. Accordingly, capacitor 16150 can be formed with the large area in the left-handed resonator 16300. Preferably grounded conductors 16301 and 16302 are connected by lateral electrodes 16323 and 16324.

Figure 50:
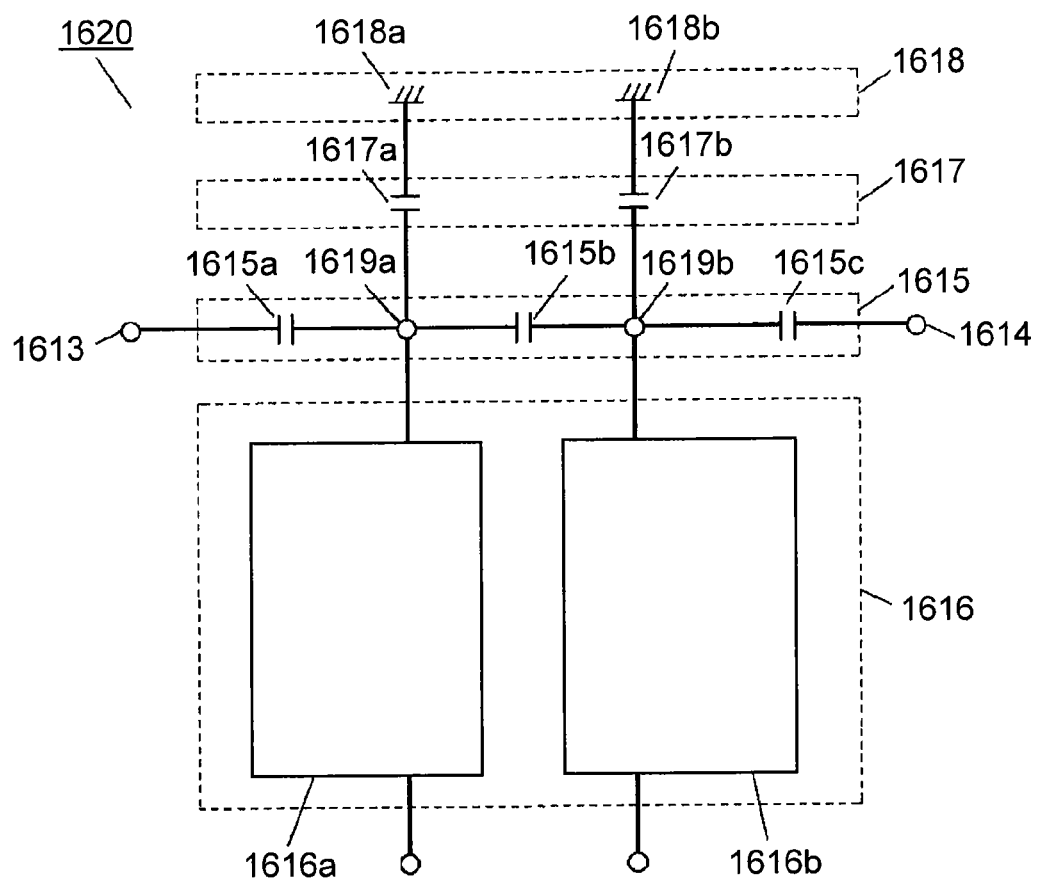
FIG. 50 is an equivalent circuit diagram of a left-handed filter according to the sixteenth embodiment of the present invention.

An entire configuration of the left-handed filter of the sixteenth embodiment will be described below. FIG. 50 is an equivalent circuit diagram of the left-handed filter according to the sixteenth embodiment of the present invention. With reference to FIG. 50, left-handed filter 1620 includes input port 1613, output port 1614, coupling element group 1615 connected to input port 1613 and output port 1614, cell group 1616 connected to coupling element group 1615, capacitor group 1617 connected to coupling element group 1615, and ground group 1618 connected to capacitor group 1617. Coupling element group 1615 includes input coupling element 1615a whose one end is connected to input port 1613, inter-step coupling element 1615b whose one end is connected to the other end of input coupling element 1615a, and output coupling element 1615c in which one end is connected to the other end of inter-step coupling element 1615b while the other end is connected to output port 1614. Cell group 1616 includes first cell assembly 1616a and second cell assembly 1616b.

One end of first cell assembly 1616a is connected to first connection point 1619a that is provided between input coupling element 1615a and inter-step coupling element 1615b. One end of second cell assembly 1616b is connected to second connection point 1619b that is provided between inter-step coupling element 1615b and output coupling element 1615c. The other end of first cell assembly 1616a is opened or grounded. The other end of second cell assembly 1616b is opened or grounded.

Figure 51:
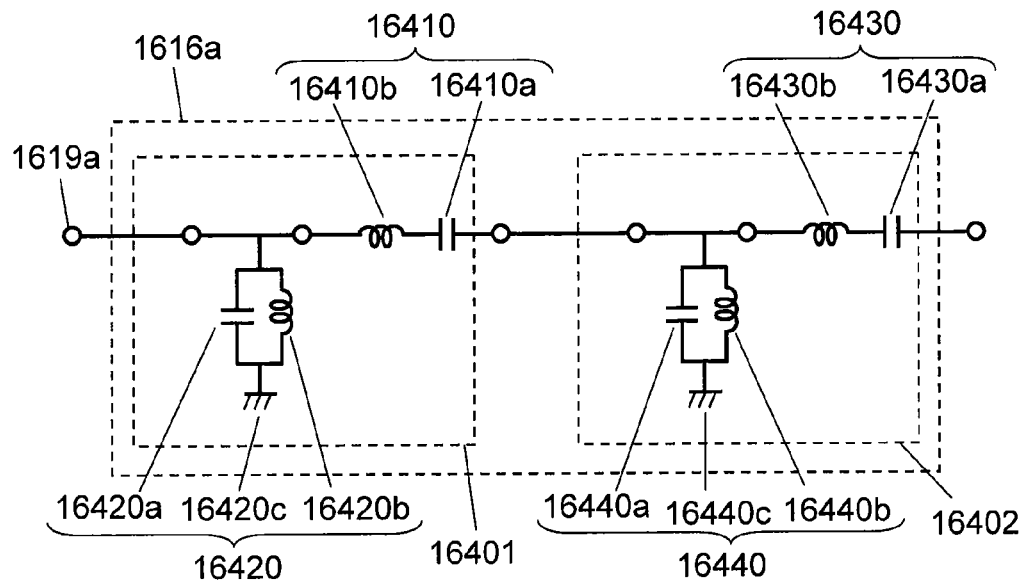
FIG. 51 is an equivalent circuit diagram illustrating a cell of the left-handed filter according to the sixteenth embodiment of the present invention.

FIG. 51 is an equivalent circuit diagram illustrating a cell of the left-handed filter according to the sixteenth embodiment of the present invention. With reference to FIG. 51, first cell assembly 1616a includes cell 16401 whose one end is connected to first connection point 1619a and cell 16402 whose one end is series-connected to the other end of cell 16401. In the sixteenth embodiment, first cell assembly 1616a is formed by the series-connected two cells 16401 and 16402. Alternatively, first cell assembly 1616a may be formed by at least one series-connected cell. When first cell assembly 1616a is formed by one cell while the −1-order resonant mode is used, the other end of first cell assembly 1616a is grounded. When first cell assembly 1616a is formed by at least two cells, the other end of first cell assembly 1616a is opened.

Cell 16401 includes first series body 16410 whose one end is connected to first connection point 1619a and first parallel body 16420 in which one end is connected to first connection point 1619a while the other end is connected to ground 16420c. First series body 16410 includes inductor 16410b whose one end is connected to first connection point 1619a and capacitor 16410a whose one end is connected to the other end of inductor 16410b. The dispositions of capacitor 16410a and inductor 16410b may be reversed.

First parallel body 16420 includes capacitor 16420a in which one end is connected to first connection point 1619a while the other end is connected to ground 16420c and inductor 16420b in which one end is connected to first connection point 1619a while the other end is connected to ground 16420c. Cell 16402 includes second series body 16430 whose one end is connected to the other end of capacitor 16410a and second parallel body 16440 in which one end is connected to the other end of capacitor 16410a while the other end is connected to ground 16440c.

Second series body 16430 includes inductor 16430b whose one end is connected to the other end of capacitor 16410a and capacitor 16430a whose one end is connected to the other end of inductor 16430b. The dispositions of capacitor 16430a and inductor 16430b may be reversed.

Second parallel body 16440 includes capacitor 16440a in which one end is connected to the other end of capacitor 16410a while the other end is connected to ground 16440c and inductor 16440b in which one end is connected to the other end of capacitor 16410a while the other end is connected to ground 16440c.

Figure 52:
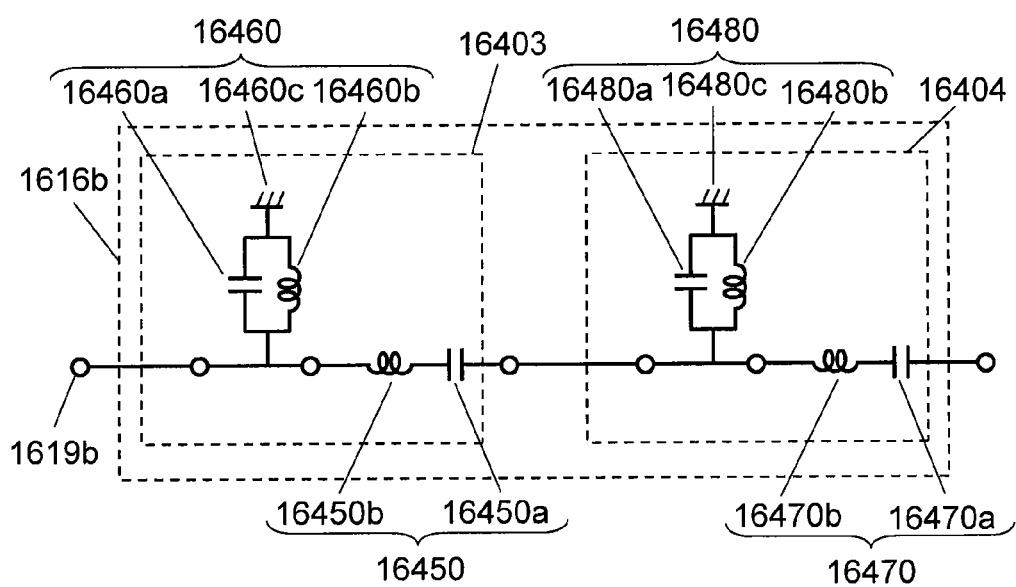
FIG. 52 is another equivalent circuit diagram illustrating the cell of the left-handed filter according to the sixteenth embodiment of the present invention.

FIG. 52 is another equivalent circuit diagram illustrating the cell of the left-handed filter according to the sixteenth embodiment of the present invention. With reference to FIG. 52, second cell assembly 1616b includes cell 16403 whose one end is connected to second connection point 1619b and cell 16404 whose one end is series-connected to the other end of cell 16403. Second cell assembly 1616b is formed by two series-connected cells 16403 and 16404. Alternatively, second cell assembly 1616b may be formed by at least one series-connected cell.

Cell 16403 includes first series body 16450 whose one end is connected to second connection point 1619b and first parallel body 16460 in which one end is connected to second connection point 1619b while the other end is connected to ground 16460c. First series body 16450 includes inductor 16450b whose one end is connected to second connection point 1619b and capacitor 16450a whose one end is connected to the other end of inductor 16450b. The dispositions of capacitor 16450a and inductor 16450b may be reversed.

First parallel body 16460 includes a capacitor 16460a in which one end is connected to second connection point 1619b while the other end is connected to ground 16460c and inductor 16460b in which one end is connected to second connection point 1619b while the other end is connected to ground 16460c.

Cell 16404 includes second series body 16470 whose one end is connected to the other end of capacitor 16450a and second parallel body 16480 in which one end is connected to the other end of capacitor 16450a while the other end is connected to ground 16480c.

Second series body 16470 includes inductor 16470b whose one end is connected to the other end of capacitor 16450a and capacitor 16470a whose one end is connected to the other end of inductor 16470b. The dispositions of capacitor 16470a and inductor 16470b may be reversed.

Second parallel body 16480 includes capacitor 16480a in which one end is connected to the other end of capacitor 16450a while the other end is connected to ground 16480c and inductor 16480b in which one end is connected to the other end of capacitor 16450a while the other end is connected to ground 16480c.

Capacitor group 1617 illustrated in FIG. 50 includes first capacitor 1617a in which one end is connected to first connection point 1619a while the other end is connected to first ground 1618a and second capacitor 1617b in which one end is connected to first connection point 1619b while the other end is connected to second ground 1618b.

Figure 53:
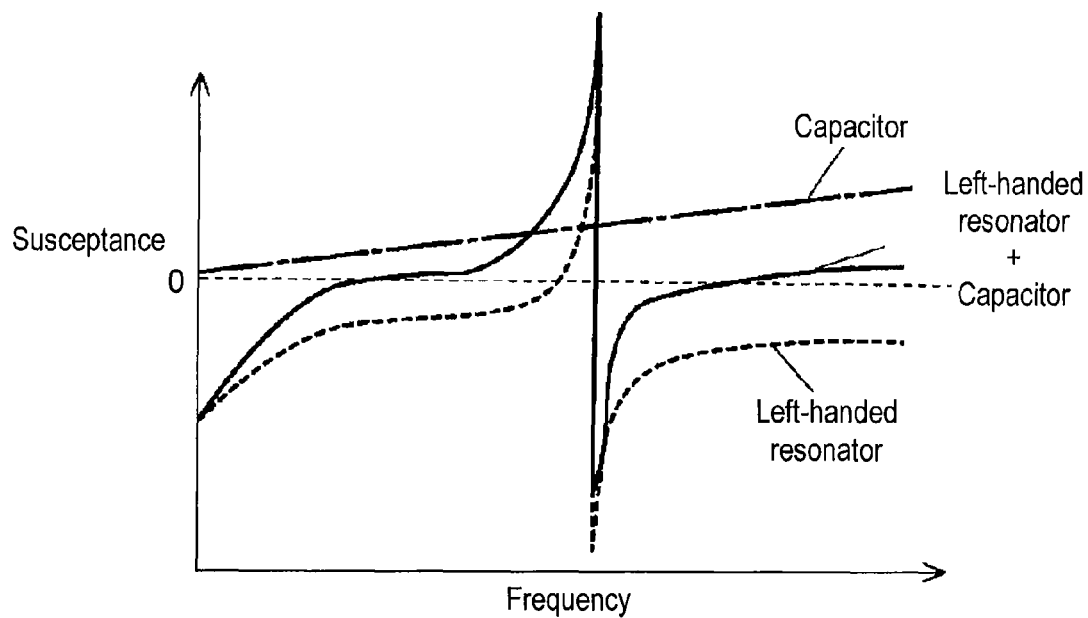
FIG. 53 is a frequency characteristic diagram of susceptance of the left-handed filter according to the sixteenth embodiment of the present invention.

FIG. 53 is a frequency characteristic diagram of susceptance of the left-handed filter according to the sixteenth embodiment of the present invention. As illustrated by a solid line of FIG. 53, the susceptance component in admittances of first cell assembly 1616a and second cell assembly 1616b that are of the left-handed resonator is raised in each frequency band, and the change in frequency becomes smooth in the vicinity where the susceptance component becomes zero. Therefore, the wide band width can be secured in first cell assembly 1616a and second cell assembly 1616b that are of the left-handed resonator. Accordingly, the left-handed filter having the same band width can be formed by the smaller number of resonators than the conventional left-handed filter, the miniaturization of the left-handed filter and the reduction of the number of components can be achieved.

Figure 54:
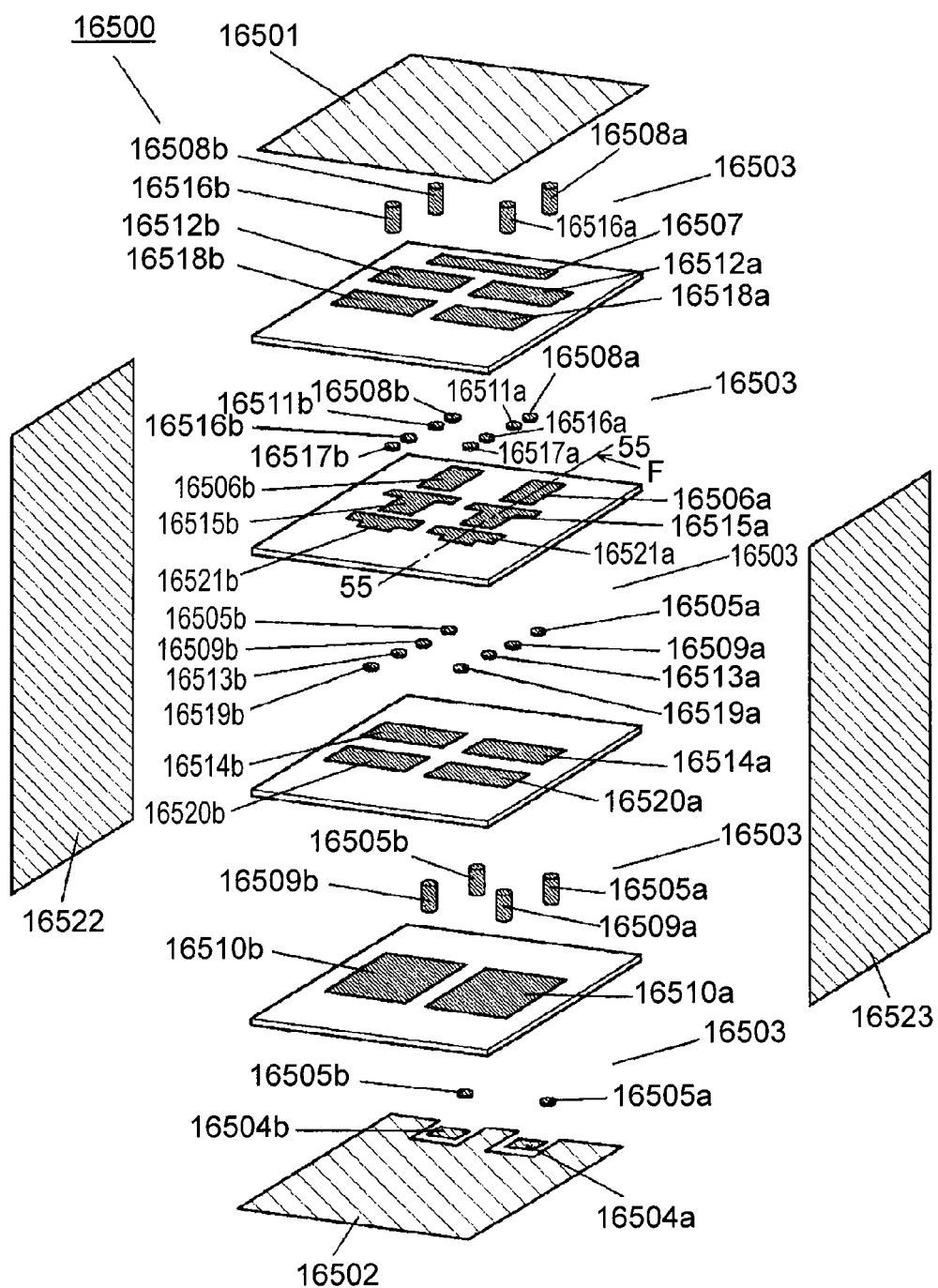
FIG. 54 is an exploded perspective view illustrating a structure of the left-handed filter according to the sixteenth embodiment of the present invention.
Figure 55:
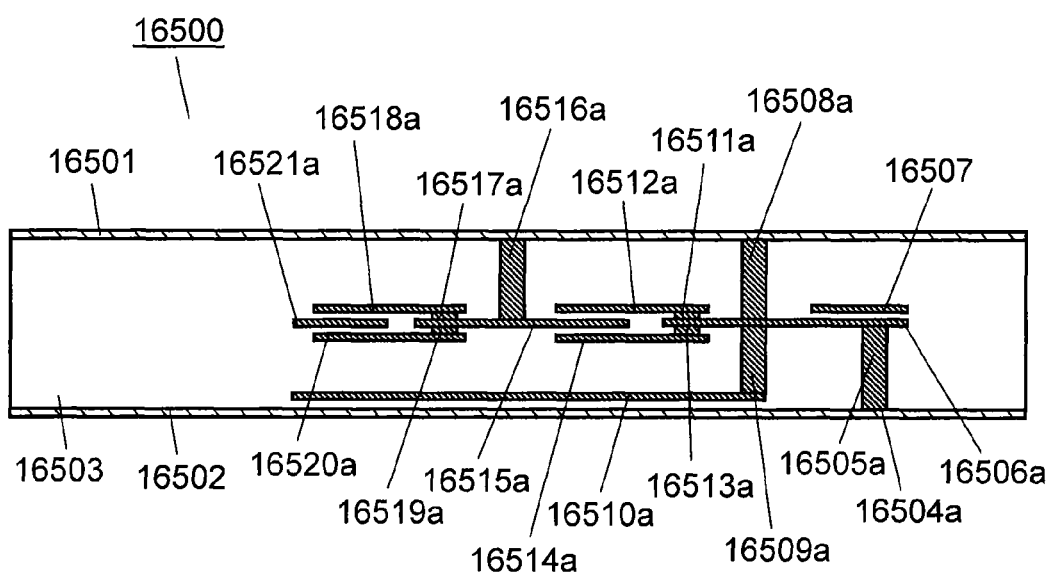
FIG. 55 is a sectional view taken on line 55-55 of FIG. 54 when a section is viewed from a direction of arrow F.

FIG. 54 is an exploded perspective view illustrating a structure of the left-handed filter according to the sixteenth embodiment of the present invention. FIG. 55 is a sectional view taken on line 55-55 of FIG. 54 when a section is viewed from a direction of arrow F. A connection relationship of left-handed filter 16500 will be described with reference to FIGS. 54 and 55. Left-handed filter 16500 has the structure in which the space between grounded conductors 16501 and 16502 that are disposed opposite each other is filled with dielectric material 16503.

Input port 16504a that is insulated from grounded conductor 16502 is provided on the same plane as grounded conductor 16502. Conductive pattern 16506a is connected to input port 16504a through via conductor 16505a. Conductive pattern 16507 is provided opposite conductive pattern 16506a while dielectric material 16503 is interposed therebetween. Conductive pattern 16506a is connected to grounded conductor 16501 through via conductor 16508a. Conductive pattern 16506a is connected to conductive pattern 16510a through via conductor 16509a. Conductive pattern 16506a is connected to conductive pattern 16512a through via conductor 16511a. Conductive pattern 16506a is connected to conductive pattern 16514a through via conductor 16513a.

Conductive pattern 16515a is disposed opposite conductive pattern 16512a while dielectric material 16503 is interposed therebetween. Conductive pattern 16515a is disposed opposite conductive pattern 16514a while dielectric material 16503 is interposed therebetween. Conductive pattern 16515a is connected to grounded conductor 16501 through via conductor 16516a. Conductive pattern 16515a is connected to conductive pattern 16518a through via conductor 16517a. Conductive pattern 16515a is connected to conductive pattern 16520a through via conductor 16519a.

Conductive pattern 16521a is disposed opposite conductive pattern 16518a while dielectric material 16503 is interposed therebetween. Conductive pattern 16521a is disposed opposite conductive pattern 16520a while dielectric material 16503 is interposed therebetween. Preferably grounded conductors 16501 and 16502 are connected by lateral electrodes 16522 and 16523.

Output port 16504b that is insulated from grounded conductor 16502 is provided on the same plane as grounded conductor 16502. Conductive pattern 16506b is connected to output port 16504b through via conductor 16505b. Conductive pattern 16506b and conductive pattern 16507 are disposed opposite each other while dielectric material 16503 is interposed therebetween. Conductive pattern 16506b is connected to grounded conductor 16501 through via conductor 16508b. Conductive pattern 16506b is connected to conductive pattern 16510b through via conductor 16509b. Conductive pattern 16506b is connected to conductive pattern 16512b through via conductor 16511b. Conductive pattern 16506b is connected to conductive pattern 16514b through via conductor 16513b.

Conductive pattern 16515b is disposed opposite conductive pattern 16512b while dielectric material 16503 is interposed therebetween. Conductive pattern 16515b is disposed opposite conductive pattern 16514b while dielectric material 16503 is interposed therebetween. Conductive pattern 16515b is connected to grounded conductor 16501 through via conductor 16516b. Conductive pattern 16515b is connected to conductive pattern 16518b through via conductor 16517b. Conductive pattern 16515b is connected to conductive pattern 16520b through via conductor 16519b.

Conductive pattern 16521b is disposed opposite conductive pattern 16518b while dielectric material 16503 is interposed therebetween. Conductive pattern 16521b is disposed opposite conductive pattern 16520b while dielectric material 16503 is interposed therebetween. Preferably grounded conductors 16501 and 16502 are connected by lateral electrodes 16522 and 16523.

A correspondence relationship between the structure of left-handed filter 16500 illustrated in FIGS. 54 and 55 and the configuration of left-handed filter 1620 illustrated in FIG. 50 will be described below. Which structure in the structures of left-handed filter 16500 illustrated in FIGS. 54 and 55 corresponds to first cell assembly 1616a illustrated in FIG. 51 will be described.

Capacitor 16410a illustrated in FIG. 51 is formed by the structure in which conductive pattern 16512a and conductive pattern 16515a are disposed opposite each other while dielectric material 16503 is interposed therebetween and the structure in which conductive pattern 16514a and conductive pattern 16515a are disposed opposite each other while dielectric material 16503 is interposed therebetween. Inductor 16410b mainly includes a depth-direction component of conductive pattern 16515a. Capacitor 16420a is mainly formed by the structure in which conductive pattern 16512a and grounded conductor 16501 are disposed opposite each other while dielectric material 16503 is interposed therebetween. Inductor 16420b includes via conductor 16508a. Capacitor 16430a is formed by the structure in which conductive pattern 16518a and conductive pattern 16521a are disposed opposite each other while dielectric material 16503 is interposed therebetween and the structure in which conductive pattern 16520a and conductive pattern 16521a are disposed opposite each other while dielectric material 16503 is interposed therebetween. Inductor 16430b mainly includes the depth-direction component of conductive pattern 16515a. Capacitor 16440a is mainly formed by the structure in which conductive pattern 16518a and grounded conductor 16501 are disposed opposite each other while dielectric material 16503 is interposed therebetween. Inductor 16440b includes via conductor 16516a.

Which structure in the structures of left-handed filter 16500 illustrated in FIGS. 54 and 55 corresponds to second cell assembly 1616b illustrated in FIG. 51 will be described below.

Capacitor 16450a illustrated in FIG. 52 is formed by the structure in which conductive pattern 16512b and conductive pattern 16515b are disposed opposite each other while dielectric material 16503 is interposed therebetween and the structure in which conductive pattern 16514b and conductive pattern 16515b are disposed opposite each other while dielectric material 16503 is interposed therebetween. Inductor 16450b mainly includes a depth-direction component of conductive pattern 16515b. Capacitor 16460a is mainly formed by the structure in which conductive pattern 16512b and grounded conductor 16501 are disposed opposite each other while dielectric material 16503 is interposed therebetween. Inductor 16460b includes via conductor 16508b. Capacitor 16470a is formed by the structure in which conductive pattern 16518b and conductive pattern 16521b are disposed opposite each other while dielectric material 16503 is interposed therebetween and the structure in which conductive pattern 16520b and conductive pattern 16521b are disposed opposite each other while dielectric material 16503 is interposed therebetween. Inductor 16470b mainly includes the depth-direction component of conductive pattern 16516b. Capacitor 16480a is mainly formed by the structure in which conductive pattern 16518b and grounded conductor 16501 are disposed opposite each other while dielectric material 16503 is interposed therebetween. Inductor 16480b includes via conductor 16516b.

Which structure in the structures of left-handed filter 1620 illustrated in FIGS. 54 and 55 corresponds to the coupling element group 1615 illustrated in FIG. 50 will be described below.

Input coupling element 1615a illustrated in FIG. 50 includes via conductor 16505a. Output coupling element 1615c includes via conductor 16505b. When input coupling element 1615a and output coupling element 1615c have the value of about 8 pF while the passband is about 2 GHz, the impedances of input coupling element 1615a and output coupling element 1615c become as small as substantial 0Ω. Therefore, input coupling element 1615a and output coupling element 1615c may be removed according to the values of the passband and capacitor. This called tap feed, and the tap feed is used in the sixteenth embodiment. Accordingly, the capacitor constituting input coupling element 1615a is removed, and input coupling element 1615a is formed by via conductor 16505a in which input port 16504a and conductive pattern 16506a are directly connected. The capacitor constituting output coupling element 1615c is removed, and output coupling element 1615c is formed by via conductor 16505b in which output port 16504*b* and conductive pattern 16506*b* are directly connected. Inter-step coupling element 1615*b* is formed by the structure in which conductive pattern 16506*a* and conductive pattern 16507 are disposed opposite each other while dielectric material 16503 is interposed therebetween and the structure in which conductive pattern 16506*b* and conductive pattern 16507 are disposed opposite each other while dielectric material 16503 is interposed therebetween.

Which structure in the structures of left-handed filter 1620 illustrated in FIGS. 54 and 55 corresponds to the capacitor group 1617 illustrated in FIG. 50 will be described below.

Capacitor 1617*a* illustrated in FIG. 50 is formed by the structure in which conductive pattern 16510*a* and grounded conductor 16502 are disposed opposite each other while dielectric material 16503 is interposed therebetween. Capacitor 1617*b* is formed by the structure in which conductive pattern 16510*b* and grounded conductor 16502 are disposed opposite each other while dielectric material 16503 is interposed therebetween. Ground group 1618 includes grounded conductor 16502. Preferably grounded conductors 16501 and 16502 are connected by lateral electrodes 16522 and 16523.

In the configuration above, left-handed filter 1620 in which first cell assembly 1616*a* and second cell assembly 1616*b* that are of the left-handed resonator are connected in parallel can be implemented by the stacked structure. Capacitor 1617*a* having the structure in which conductive pattern 16510*a* and grounded conductor 16502 are disposed opposite each other while dielectric material 16503 is interposed therebetween and a capacitor 1617*b* having the structure in which conductive pattern 16510*b* and grounded conductor 16502 are disposed opposite each other while dielectric material 16503 is interposed therebetween are provided in the left-handed resonator, which allows the slope of resonant frequency to be loosened. Accordingly, the left-handed filter can be designed by the smaller number of left-handed resonators, and the left-handed filter is suitably miniaturized.

In the sixteenth embodiment, input coupling element 1615*a* and output coupling element 1615*c* are directly connected by the via conductor as illustrated in FIGS. 54 and 55. However, input coupling element 1615*a* and output coupling element 1615*c* can directly be connected by the via conductor when the capacitance of each of input coupling element 1615*a* and output coupling element 1615*c* becomes 10 pF or more, that is, when the grounded state can be seen in the passband. Therefore, desirably the capacitor is actually provided when the capacitance of each of input coupling element 1615*a* and output coupling element 1615*c* is lower than 10 pF.

The other end of first cell assembly 1616*a* illustrated in FIG. 50 may be connected to the ground through the inductor serving as the parasitic component. The other end of second cell assembly 1616*b* may also be connected to the ground through the inductor that is of the parasitic component. In such a configuration, the resonator excites only the left-handed odd-numbered-order resonance and the right-handed odd-numbered-order resonance. Therefore, since the resonator does not excite the even-numbered-order (in this cases, 0-order) resonance that is of the unnecessary wave, the attenuation characteristic out of the passband is improved.

The left-handed filter of the present invention has the effect that the band width passed through the left-handed resonator and the filter characteristic of the left-handed filter can be improved, and the left-handed filter is usefully applied to various electronic instruments such as a cellular telephone.

Seventeenth Embodiment

Figure 56:
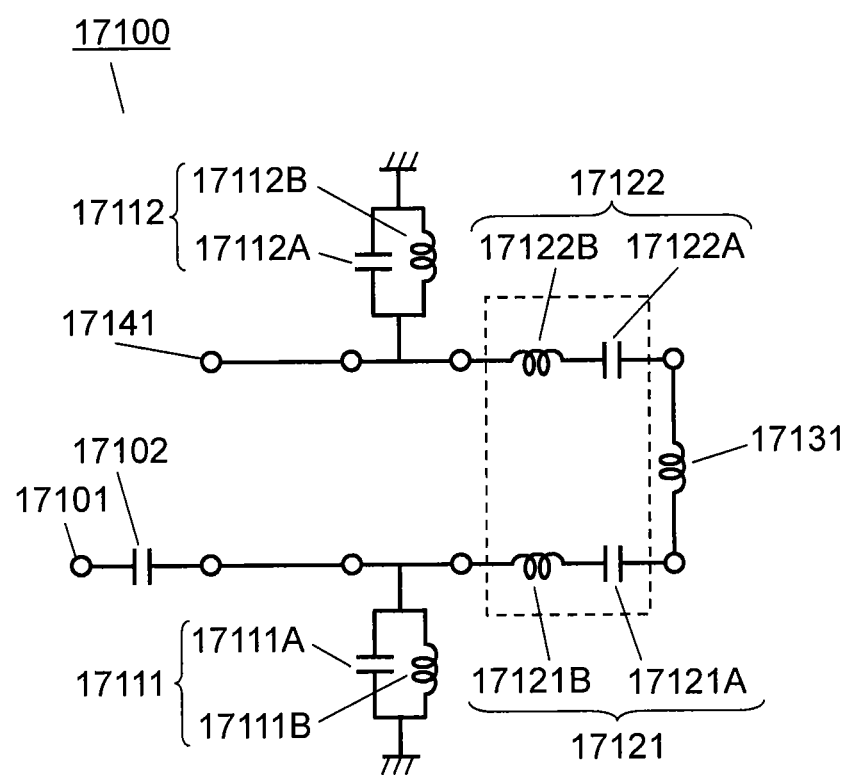
FIG. 56 is an equivalent circuit diagram of a left-handed resonator according to a seventeenth embodiment of the present invention.

FIG. 56 is an equivalent circuit diagram of a left-handed resonator according to a seventeenth embodiment of the present invention. With reference to FIG. 56, left-handed resonator 17100 of the seventeenth embodiment includes first parallel body 17111, first series body 17121 connected to one-port terminal 17101 and first parallel body 17111, inductor 17131 connected to first series body 17121, second series body 17122 connected to inductor 17131, second parallel body 17112 connected to second series body 17122, and open end 17141 connected to second parallel body 17112 and second series body 17122.

A method for connecting the one-port terminal 17101 having input and output function, input/output coupling element 17102 that is electrically connected to one-port terminal 17101, first parallel body 17111 connected to input/output coupling element 17102 can be cited as an example of a method for confirming the characteristic of the resonator.

First parallel body 17111 includes first capacitor 17111A and first inductor 17111B, and first capacitor 17111A and first inductor 17111B are connected in parallel. In each of first capacitor 17111A and first inductor 17111B, one end is connected to one-port terminal 17101 and one end of first series body 17121, and the other end is grounded.

First series body 17121 includes second capacitor 17121A and second inductor 17121B, and second capacitor 17121A and second inductor 17121B are connected in series. In second inductor 17121B, one end is connected to one-port terminal 17101 and first parallel body 17111, and the other end is connected to one end of second capacitor 17121A. The other end of second capacitor 17121A is connected to one end of inductor 17131.

Second parallel body 17112 includes third capacitor 17112A and third inductor 17112B, and third capacitor 17112A and third inductor 17112B are connected in parallel. In each of third capacitor 17112A and third inductor 17112B, one end is connected to open end 17141 and the other end of second series body 17122, and the other end is grounded.

Second series body 17122 includes fourth capacitor 17122A and fourth inductor 17122B, and fourth capacitor 17122A and fourth inductor 17122B are connected in series. In fourth capacitor 17122A, one end is connected to the other end of inductor 17131, and the other end is connected to one end of fourth inductor 17122B. The other end of fourth inductor 17122B is connected to one end of second parallel body 17112 and open end 17141.

The disposition relationship between first series body 17121 and second series body 17122 is adjusted such that capacitive coupling can be generated between first series body 17121 and second series body 17122. That is, the distance between first series body 17121 and second series body 17122 is shortened. The capacitive coupling is generated between first series body 17121 and second series body 17122 when the distance between first series body 17121 and second series body 17122 reaches a predetermined distance or less. At this point, the capacitive coupling is generated at least between second capacitor 17121A included in first series body 17121 and fourth capacitor 17122A included in second capacitor 17121A and second series body 17122. The magnetic field coupling may be generated between second capacitor 17121A and second inductor 17121B, which are included in first series body 17121, and fourth capacitor 17122A and fourth inductor 17122B, which are included in second series body 17122.

Therefore, because first parallel body 17111 and first series body 17121 can be disposed on the plane that is different from the plane on which second parallel body 17112 and second series body 17122 are disposed, the miniaturization of the left-handed resonator can be achieved.

Figure 57:
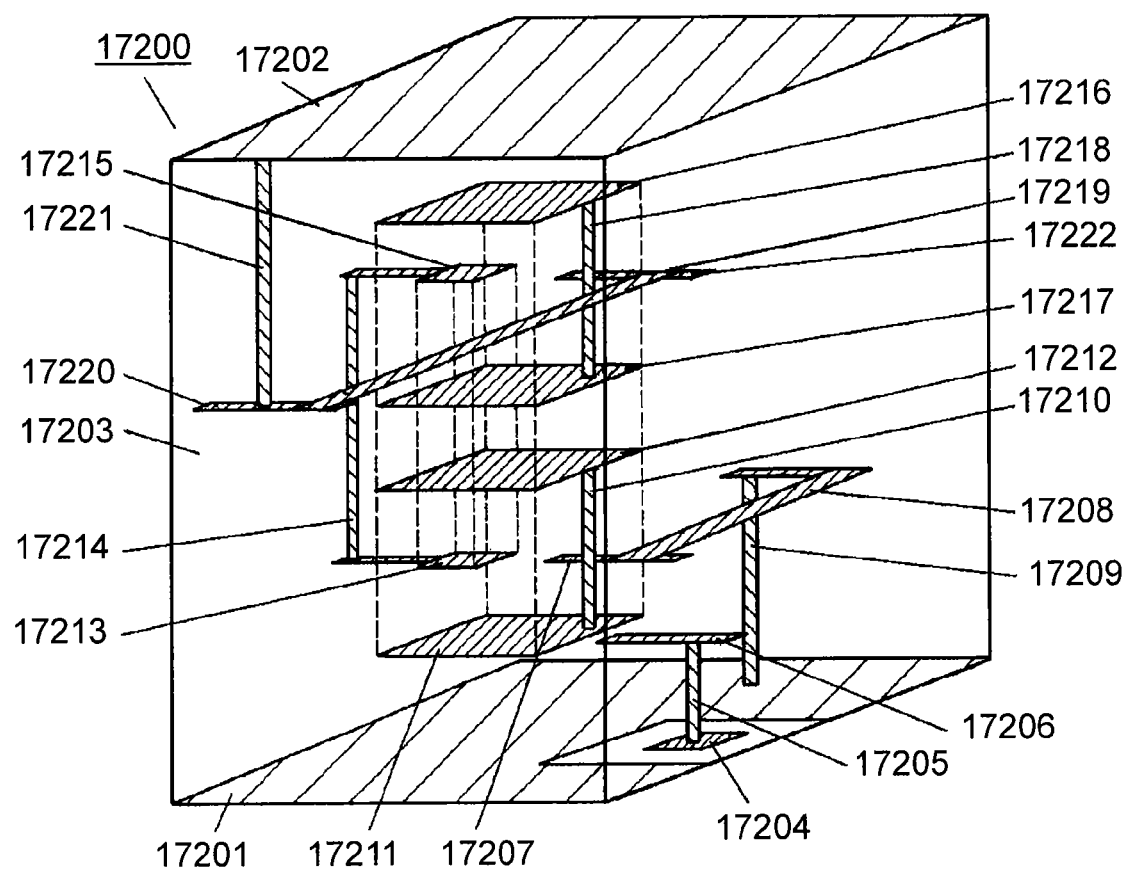
FIG. 57 is an entire perspective view of the left-handed resonator according to the seventeenth embodiment of the present invention.

FIG. 57 is an entire perspective view of the left-handed resonator according to the seventeenth embodiment of the present invention. That is, FIG. 57 is an exploded perspective view illustrating the state in which left-handed resonator 17200 is taken apart in each layer of the conductive pattern and via conductor. In FIG. 57, left-handed resonator 17200 has the structure in which the space between first ground electrode 17201 and second ground electrode 17202 that are disposed opposite each other is filled with stacked dielectric material 17203. First ground electrode 17201 and second ground electrode 17202 are connected by the lateral electrode (not illustrated) and maintained at the equal potential.

Terminal 17204 that is insulated from first ground electrode 17201 is provided on the same plane as first ground electrode 17201. Terminal 17204 is used as the one-port terminal that acts as the input port and the output port. Conductive pattern 17206 is connected to terminal 17204 through via conductor 17205.

Conductive pattern 17208 is connected to conductive pattern 17207 that is disposed opposite conductive pattern 17206. Conductive pattern 17208 is connected to first ground electrode 17201 through via conductor 17209.

Conductive pattern 17207 is connected to conductive pattern 17211 and conductive pattern 17212 through via conductor 17210. Conductive pattern 17207 is disposed opposite conductive pattern 17211 and conductive pattern 17212 between conductive pattern 17211 and conductive pattern 17212.

Conductive pattern 17213 is disposed opposite conductive pattern 17211 and conductive pattern 17212 between conductive pattern 17211 and conductive pattern 17212. Conductive pattern 17213 is connected to conductive pattern 17215 through via conductor 17214.

Conductive pattern 17215 is disposed opposite conductive pattern 17216 and conductive pattern 17217 between conductive pattern 17216 and conductive pattern 17217. Conductive pattern 17216 and conductive pattern 17217 are connected through via conductor 17218. Conductive pattern 17217 is disposed opposite conductive pattern 17212 while insulated from conductive pattern 17212. Conductive pattern 17219 is connected to conductive pattern 17216 and conductive pattern 17217 through via conductor 17218. Conductive pattern 17219 is disposed opposite conductive pattern 17216 and conductive pattern 17217 between conductive pattern 17216 and conductive pattern 17217. Conductive pattern 17220 is connected to conductive pattern 17219. Conductive pattern 17220 is connected to second ground electrode 17202 through via conductor 17221.

One-port terminal 17101 illustrated in FIG. 56 includes terminal 17204. Input/output coupling element 17102 includes conductive pattern 17206 and conductive pattern 17207, which are disposed opposite each other. Open end 17141 includes leading end portion 17222 of conductive pattern 17219.

First capacitor 17111A illustrated in FIG. 56 includes first ground electrode 17201 that is disposed opposite conductive pattern 17207 and conductive pattern 17208 and second ground electrode 17202 that is disposed opposite conductive pattern 17207 and conductive pattern 17208. First inductor 17111B includes length components of conductive pattern 17207, conductive pattern 17208, and via conductor 17209.

Second capacitor 17121A illustrated in FIG. 56 includes conductive pattern 17211 that is disposed opposite conductive pattern 17213 and conductive pattern 17212 that is disposed opposite conductive pattern 17213. Second inductor 17121B includes length components of conductive pattern 17211 and conductive pattern 17212.

Third capacitor 17112A illustrated in FIG. 56 includes first ground electrode 17201 that is disposed opposite conductive pattern 17219 and conductive pattern 17220 and second ground electrode 17202 that is disposed opposite conductive pattern 17219 and conductive pattern 17220. Third inductor 17112B includes length components of conductive pattern 17219, conductive pattern 17220, and via conductor 17221.

Fourth capacitor 17122A illustrated in FIG. 56 includes conductive pattern 17217 that is disposed opposite conductive pattern 17215 and conductive pattern 17216 that is disposed opposite conductive pattern 17215. Fourth inductor 17122B includes length components of conductive pattern 17217 and conductive pattern 17216.

Inductor 17131 illustrated in FIG. 56 includes a length component of via conductor 17214. The distance between conductive pattern 17212 constituting second capacitor 17121A and conductive pattern 17217 constituting fourth capacitor 17122A is adjusted to stack the conductive pattern 17212 and conductive pattern 17217 with dielectric material 17203 interposed therebetween, which allows a capacitive coupling amount between conductive pattern 17212 and conductive pattern 17217 to be controlled.

Figure 58:
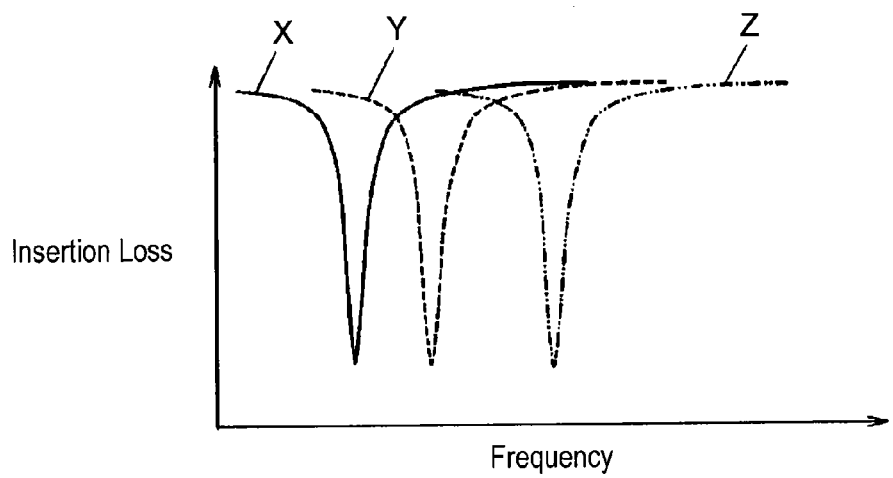
FIG. 58 is a resonance characteristic diagram of the left-handed resonator according to the seventeenth embodiment of the present invention.

FIG. 58 is a resonance characteristic diagram of the left-handed resonator according to the seventeenth embodiment of the present invention. In FIG. 58, as illustrated by curved lines X, Y, and Z indicating the resonance characteristic, as the distance between conductive pattern 17212 and conductive pattern 17217 is increased, the resonance characteristic is shifted from curved line X to curved line Y, and from curved line Y to curved line Z. In other words, the resonance characteristic of the structure of left-handed resonator 17200 illustrated in FIG. 57 is shifted onto the high-frequency band side with increasing distance between conductive pattern 17212 and conductive pattern 17217.

In the structure above, not only the area of left-handed resonator 17200 can simply be reduced to about half of the area of the conventional left-handed resonator, but also a wavelength shortening effect is obtained by the capacitive coupling between conductive pattern 17212 and conductive pattern 17217. Therefore, the area of left-handed resonator 17200 can further be reduced. Accordingly, left-handed resonator 17200 can be miniaturized.

When the balanced-to-unbalanced conversion left-handed filter is formed using left-handed resonator 17200, an occupied area of the left-handed resonator becomes narrower than that of the left-handed resonator used in the conventional balanced-to-unbalanced conversion left-handed filter, so that the left-handed filter can be miniaturized. In an electronic instrument such as a cellular telephone on which the left-handed filter of the seventeenth embodiment is mounted, performance such as a processing speed can be enhanced by the high integration.

Alternatively, the distance among conductive pattern 17212, conductive pattern 17217, and inductor 17131 may be adjusted and stacked to generate the magnetic field coupling among conductive pattern 17212, conductive pattern 17217, and inductor 17131. In such cases, the wavelength shortening effect can be obtained to further miniaturize left-handed resonator 17200.

In the seventeenth embodiment, conductive pattern 17208 is connected from conductive pattern 17207, and via conductor 17209 is grounded to first ground electrode 17201 while via conductor 17209 and conductive pattern 17207 are separated from each other. Alternatively, conductive pattern 17208 is not provided, but via conductor 17210 may be grounded to first ground electrode 17201 by directly connecting via conductor 17210 to conductive pattern 17207. In such cases, a signal loss can be suppressed. Furthermore, conductive pattern 17220 is connected from conductive pattern 17219, and via conductor 17221 is grounded to second ground electrode 17202 while conductive pattern 17219 and via conductor 17221 are separated from each other. Alternatively, conductive pattern 17220 is not provided, but via conductor 17221 may be grounded to second ground electrode 17202 by directly connecting via conductor 17221 to conductive pattern 17219. In such cases, the signal loss can also be suppressed.

In the seventeenth embodiment, one-port input terminal 17101 is used. Alternatively, the input port and the output port may separately be provided. In such cases, in left-handed resonator 17200 illustrated in FIG. 57, the input port and the output port that are insulated from first ground electrode 17201 are provided on the same plane as first ground electrode 17201, and two conductive patterns that are disposed opposite conductive pattern 17207 are connected to the input port and output port through via conductors, respectively.

In the seventeenth embodiment, conductive pattern 17211 that is disposed opposite conductive pattern 17213 and conductive pattern 17212 that is disposed opposite conductive pattern 17213 are used in order to form second capacitor 17121A. Alternatively, only conductive pattern 17212 that is disposed opposite conductive pattern 17213 may be used. Furthermore, conductive pattern 17217 that is disposed opposite conductive pattern 17215 and conductive pattern 17216 that is disposed opposite conductive pattern 17215 are used in order to form fourth capacitor 17122A. Alternatively, only conductive pattern 17217 that is disposed opposite conductive pattern 17215 may be used. Therefore, the miniaturization and the cost reduction can further be achieved.

Figure 59:
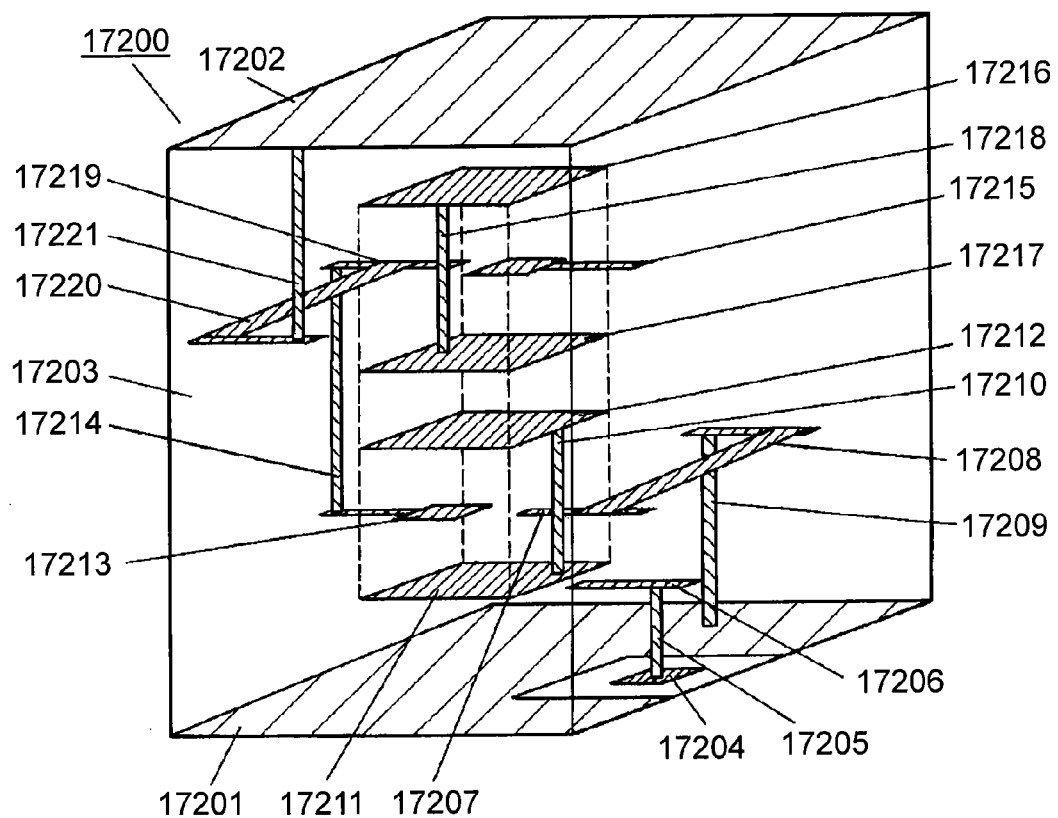
FIG. 59 is an entire perspective view of another left-handed resonator according to the seventeenth embodiment of the present invention.

FIG. 59 is an entire perspective view of another left-handed resonator according to the seventeenth embodiment of the present invention. In FIG. 59, conductive pattern 17213 is connected to conductive pattern 17219 through via conductor 17214. Conductive pattern 17220 connected to conductive pattern 17219 is connected to second ground electrode 17202 through via conductor 17221. Accordingly, conductive pattern 17213 is connected to second ground electrode 17202. Conductive pattern 17215 is insulated from other conductive patterns and other via conductors. Open end 17141 illustrated in FIG. 56 includes conductive pattern 17215.

The left-handed filter of the present invention has the effect that the balance can be established between the miniaturization and acquisition of the impedance of the standard set to the filter, and the left-handed filter is usefully applied to various electronic instruments such as a cellular telephone.

INDUSTRIAL APPLICABILITY

Since the left-handed resonator and the left-handed filter according to the present invention can be further miniaturized, the left-handed resonator and the left-handed filter are usefully applied to various electronic instruments such as a cellular telephone.

REFERENCE MARKS IN THE DRAWINGS

1 Series body
1A and 2A Capacitor
1B and 2B Inductor
2 Parallel body
3 Unit cell
7 Left-handed resonator

The invention claimed is:

1. A left-handed resonator comprising:
a series body in which an inductor and a capacitor are connected in series; and
a parallel body in which an inductor and a capacitor are connected in parallel, wherein
one end of the series body and one end of the parallel body are connected, the other end of the parallel body is grounded, and the other end of the series body is grounded, and
the left-handed resonator resonates in a −1-order mode while exciting a quarter wavelength mode only with the series body and the parallel body.

2. A left-handed filter comprising:
an input port;
a first output port;
a second output port;
an inter-step coupling element that is connected between the input port and the first output port;
a first left-handed resonator that includes a first series body and a first parallel body, an inductor and a capacitor of the first series body being connected in series, an inductor and a capacitor of the first parallel body being connected in parallel to the first series body, one end of the first series body of the first left-handed resonator and one end of the first parallel body of the first left-handed resonator being connected to the input port and one end of the inter-step coupling element, another end of the first parallel body of the first left-handed resonator being grounded, another end of the first series body of the first left-handed resonator being grounded;
a second left-handed resonator that includes a second series body and a second parallel body, an inductor and a capacitor of the second series body being connected in series, an inductor and a capacitor of the second parallel body being connected in parallel to the second series body, one end of the second series body of the second left-handed resonator and one end of the second parallel body of the second left-handed resonator being connected to the first output port and the other end of the inter-step coupling element, another end of the second parallel body of the second left-handed resonator being grounded, another end of the second series body of the second left-handed resonator being grounded; and
a third left-handed resonator that includes a third series body and a third parallel body, an inductor and a capacitor of the third series body being connected in series, an inductor and a capacitor of the third parallel body being connected in parallel to the third series body, one end of the third series body of the third left-handed resonator and one end of the third parallel body of the third left-handed resonator being connected to the second output port, another end of the third parallel body of the third left-handed resonator being grounded, another end of the third series body of the third left-handed resonator being grounded, wherein
magnetic field coupling is generated between the inductor of the first parallel body and the inductor of the third parallel body.

3. The left-handed filter according to claim 2, wherein
the first left-handed resonator resonates in a −1-order mode while exciting a quarter wavelength mode,
the second left-handed resonator resonates in a −1-order mode while exciting a quarter wavelength mode, and
the third left-handed resonator resonates in a −1-order mode while exciting a quarter wavelength mode.

4. A left-handed filter comprising:
an input port;
a first inductor connected with the input port;
an output port;
a second inductor connected with the output port;
a first left-handed resonator connected between the input port and the output port, said first left-handed resonator including:
  a first series body in which an inductor and a capacitor are connected in series, and
  a first parallel body in which an inductor and a capacitor are connected in parallel, wherein one end of the first series body and one end of the first parallel body are connected to the input port via the first inductor, the other end of the first parallel body is grounded, and the other end of the first series body is grounded;
a second left-handed resonator that is connected in parallel with the first left-handed resonator and between the input port and the output port, said second left-handed resonator including:
  a second series body in which an inductor and a capacitor are connected in series, and
  a second parallel body in which an inductor and a capacitor are connected in parallel, wherein one end of the second series body and one end of the second parallel body are connected to the output port via the second inductor, the other end of the second parallel body is grounded, and the other end of the second series body is grounded; and
a coupling element that is connected between the one end of the first series body of the first left-handed resonator and the one end of the second series body of the second left-handed resonator, wherein
magnetic field coupling is generated between the first inductor and the second inductor,
the other end of the first left-handed resonator and the other end of the second left-handed resonator are grounded, and
the first left-handed resonator resonates in a −1-order mode while exciting a quarter wavelength mode only with the first series body and the first parallel body.

5. The left-handed filter according to claim 4, wherein the second left-handed resonator resonates in a −1-order mode while exciting a quarter wavelength mode.

6. The left-handed filter according to claim 5, wherein the second left-handed resonator resonates in a −1-order mode while exciting a quarter wavelength mode only with the second series body and the second parallel body.

7. A left-handed filter comprising:
an input port;
a first inductor connected with the input port;
an output port;
a second inductor connected with the output port;
a first left-handed resonator connected between the input port and the output port, said first left-handed resonator including
  a first series body in which an inductor and a capacitor are connected in series, and
  a first parallel body in which an inductor and a capacitor are connected in parallel, wherein one end of the first series body and one end of the first parallel body are connected to the input port via the first inductor, the other end of the first parallel body is grounded, and the other end of the first series body is grounded;
a second left-handed resonator that is connected in parallel with the first left-handed resonator and between the input port and the output port, said second left-handed resonator including
  a second series body in which an inductor and a capacitor are connected in series, and
  a second parallel body in which an inductor and a capacitor are connected in parallel, wherein one end of the second series body and one end of the second parallel body are connected to the output port via the second inductor, the other end of the second parallel body is grounded, and the other end of the second series body is grounded;
a coupling element that is connected between the one end of the first series body of the first left-handed resonator and the one end of the second series body of the second left-handed resonator, wherein
magnetic field coupling is generated between the first inductor and the second inductor,
the other end of the first left-handed resonator and the other end of the second left-handed resonator are grounded, and
the second left-handed resonator resonates in a −1-order mode while exciting a quarter wavelength mode only with the second series body and the second parallel body.

8. The left-handed filter according to claim 7, wherein the first left-handed resonator resonates in a −1-order mode while exciting a quarter wavelength mode.

9. The left-handed filter according to claim 8, wherein the first left-handed resonator resonates in a −1-order mode while exciting a quarter wavelength mode only with the first series body and the first parallel body.

* * * * *